(12) United States Patent
Okazaki et al.

(10) Patent No.: US 12,199,186 B2
(45) Date of Patent: Jan. 14, 2025

(54) SEMICONDUCTOR DEVICE AND METHOD FOR MANUFACTURING SEMICONDUCTOR DEVICE

(71) Applicant: SEMICONDUCTOR ENERGY LABORATORY CO., LTD., Atsugi (JP)

(72) Inventors: Kenichi Okazaki, Tochigi (JP); Masami Jintyou, Tochigi (JP); Kensuke Yoshizumi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/378,688

(22) Filed: Oct. 11, 2023

(65) Prior Publication Data

US 2024/0136442 A1 Apr. 25, 2024
US 2024/0234578 A9 Jul. 11, 2024

Related U.S. Application Data

(63) Continuation of application No. 16/978,262, filed as application No. PCT/IB2019/051751 on Mar. 5, 2019, now Pat. No. 11,799,032.

(30) Foreign Application Priority Data

Mar. 16, 2018 (JP) .................................. 2018-048800
Mar. 16, 2018 (JP) .................................. 2018-048802

(51) Int. Cl.
*H01L 29/786* (2006.01)
*H01L 21/02* (2006.01)
(Continued)

(52) U.S. Cl.
CPC .... *H01L 29/7869* (2013.01); *H01L 21/02274* (2013.01); *H01L 21/2654* (2013.01); *H01L 21/266* (2013.01)

(58) Field of Classification Search
CPC ........... H01L 29/7869; H01L 21/02274; H01L 21/2654; H01L 21/266
See application file for complete search history.

(56) References Cited

U.S. PATENT DOCUMENTS 8,860,023 B2 10/2014 Tsubuku et al.
9,035,305 B2 5/2015 Tsubuku et al.
(Continued)

FOREIGN PATENT DOCUMENTS

CN 104821338 A 8/2015
DE 102015201707 8/2015
(Continued)

OTHER PUBLICATIONS

International Search Report (Application No. PCT/IB2019/051751) Dated Jun. 18, 2019.
(Continued)

*Primary Examiner* — Monica D Harrison
*Assistant Examiner* — Andre C Stevenson
(74) *Attorney, Agent, or Firm* — Fish & Richardson P.C.

(57) ABSTRACT

A semiconductor device with favorable electrical characteristics is provided. A semiconductor device with stable electrical characteristics is provided.
The semiconductor device includes a semiconductor layer, a first insulating layer, and a first conductive layer. The first insulating layer is provided over the semiconductor layer. The first conductive layer is provided over the first insulating layer. The semiconductor layer includes a first region that overlaps with the first conductive layer and the first insulating layer, a second region that does not overlap with the first conductive layer and overlaps with the first insulating layer, and a third region that overlaps with neither the first conductive layer nor the first insulating layer. The semiconductor layer contains a metal oxide. The second
(Continued)

region and the third region contain a first element. The first element is one or more elements selected from boron, phosphorus, aluminum, and magnesium. The first element exists in a state of being bonded to oxygen.

14 Claims, 22 Drawing Sheets

(51) Int. Cl.
*H01L 21/265* (2006.01)
*H01L 21/266* (2006.01)

(56) References Cited

U.S. PATENT DOCUMENTS

| | | |
|---|---|---|
| 9,184,296 B2 | 11/2015 | Koezuka et al. |
| 9,240,488 B2 | 1/2016 | Yamazaki et al. |
| 9,281,407 B2 | 3/2016 | Tsubuku et al. |
| 9,378,980 B2 | 6/2016 | Yamazaki et al. |
| 9,443,876 B2 | 9/2016 | Yamazaki et al. |
| 9,450,104 B2 | 9/2016 | Koezuka et al. |
| 9,496,408 B2 | 11/2016 | Yamazaki et al. |
| 9,496,413 B2 | 11/2016 | Tsubuku et al. |
| 9,577,110 B2 | 2/2017 | Koezuka et al. |
| 9,722,095 B2 | 8/2017 | Koezuka et al. |
| 9,728,651 B2 | 8/2017 | Yamazaki et al. |
| 9,741,865 B2 | 8/2017 | Yamazaki et al. |
| 9,837,547 B2 | 12/2017 | Koezuka et al. |
| 9,852,926 B2 | 12/2017 | Akimoto et al. |
| 9,859,437 B2 | 1/2018 | Morosawa et al. |
| 9,899,536 B2 | 2/2018 | Yamazaki et al. |
| 9,935,633 B2 | 4/2018 | Tamura |
| 9,954,117 B2 | 4/2018 | Koezuka et al. |
| 10,038,100 B2 | 7/2018 | Yamazaki et al. |
| 10,249,645 B2 | 4/2019 | Yamazaki et al. |
| 10,319,861 B2 | 6/2019 | Koezuka et al. |
| 10,439,074 B2 | 10/2019 | Yamazaki et al. |
| 10,453,964 B2 | 10/2019 | Yamazaki et al. |
| 10,763,371 B2 | 9/2020 | Morosawa et al. |
| 2011/0147738 A1 | 6/2011 | Yamazaki et al. |
| 2013/0292675 A1 | 11/2013 | Tsubuku et al. |
| 2015/0187953 A1* | 7/2015 | Koezuka ............... H01L 29/45 257/43 |
| 2015/0221678 A1 | 8/2015 | Yamazaki et al. |
| 2016/0343866 A1 | 11/2016 | Koezuka et al. |
| 2017/0005659 A1 | 1/2017 | Tamura |
| 2017/0110337 A1 | 4/2017 | Akimoto et al. |
| 2019/0244981 A1 | 8/2019 | Yamazaki et al. |
| 2019/0245091 A1 | 8/2019 | Koezuka et al. |
| 2022/0293795 A1* | 9/2022 | Yamazaki ............ G02F 1/13394 |

FOREIGN PATENT DOCUMENTS

| | | |
|---|---|---|
| DE | 102016211938 | 1/2017 |
| JP | 2011-146694 A | 7/2011 |
| JP | 2011-228622 A | 11/2011 |
| JP | 2014-007399 A | 1/2014 |
| JP | 2014-199896 A | 10/2014 |
| JP | 2015-179818 A | 10/2015 |
| JP | 2015-179822 A | 10/2015 |
| JP | 2017-017693 A | 1/2017 |
| JP | 2017-028252 A | 2/2017 |
| JP | 2017-079330 A | 4/2017 |
| JP | 2018-006729 A | 1/2018 |
| KR | 2015-0092722 A | 8/2015 |
| KR | 2017-0003420 A | 1/2017 |
| TW | 201138114 | 11/2011 |
| TW | 201535690 | 9/2015 |
| TW | 201711205 | 3/2017 |
| WO | WO-2011/074407 | 6/2011 |
| WO | WO-2016/189411 | 12/2016 |

OTHER PUBLICATIONS

Written Opinion (Application No. PCT/IB2019/051751) Dated Jun. 18, 2019.

* cited by examiner

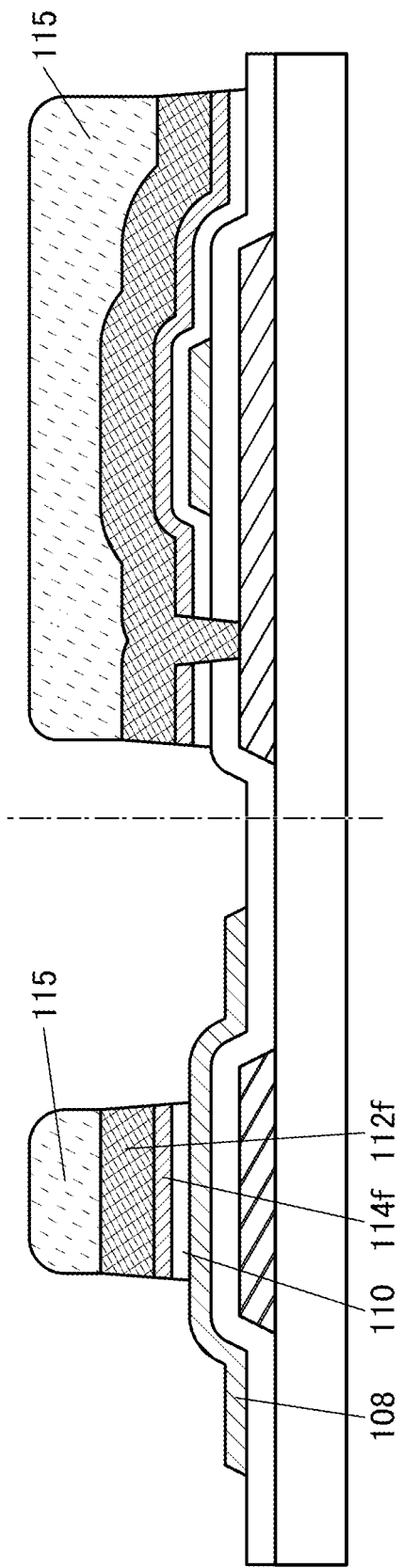
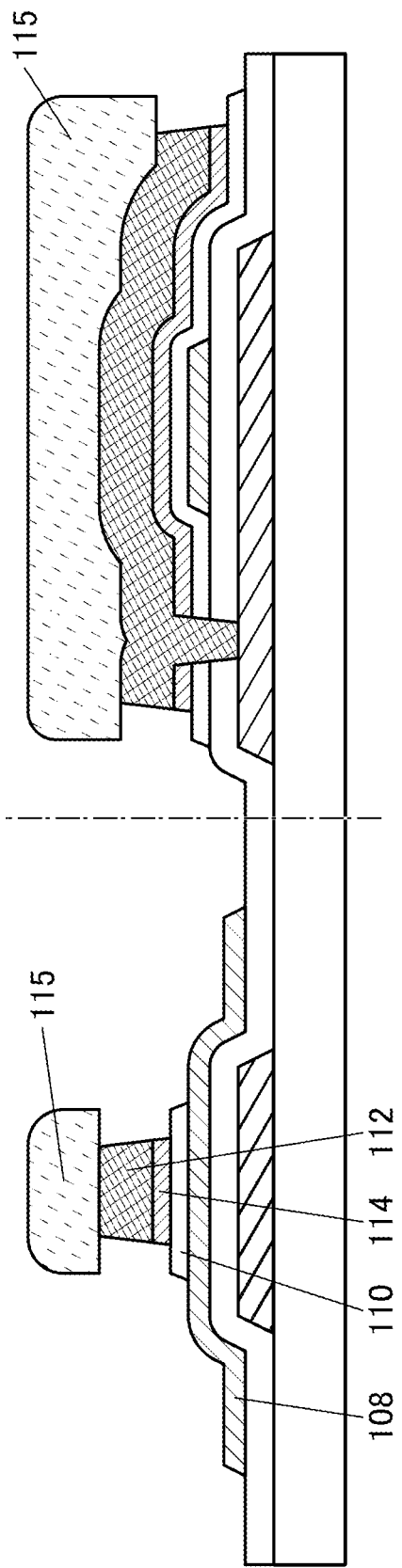
FIG. 4A
FIG. 4B

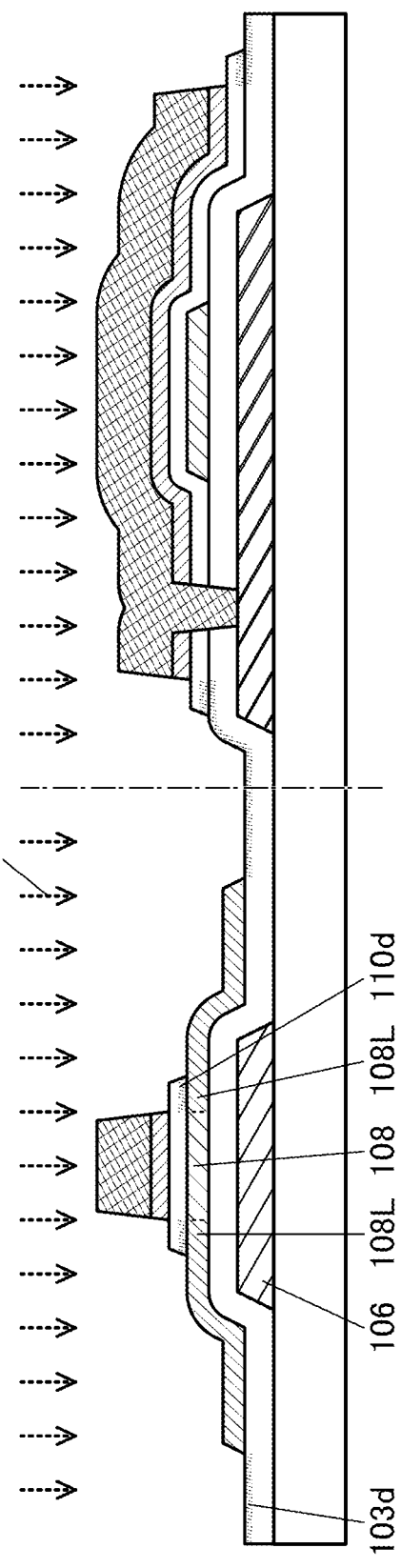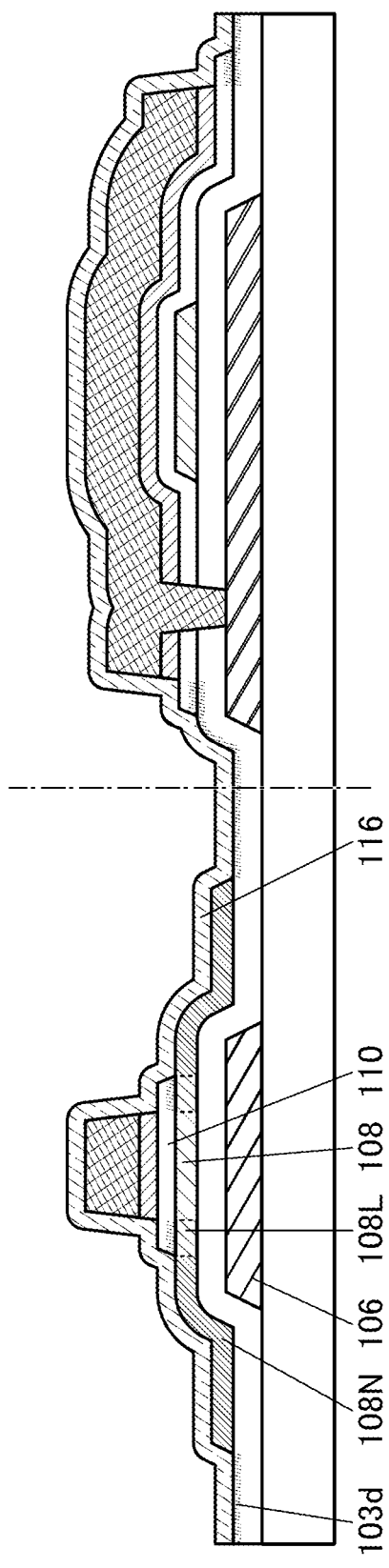

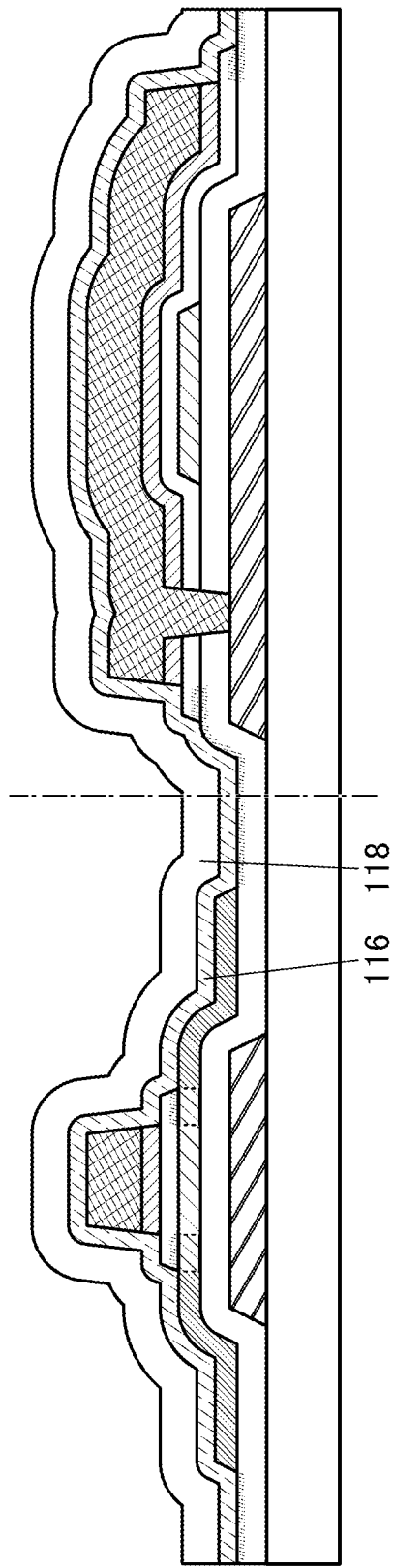
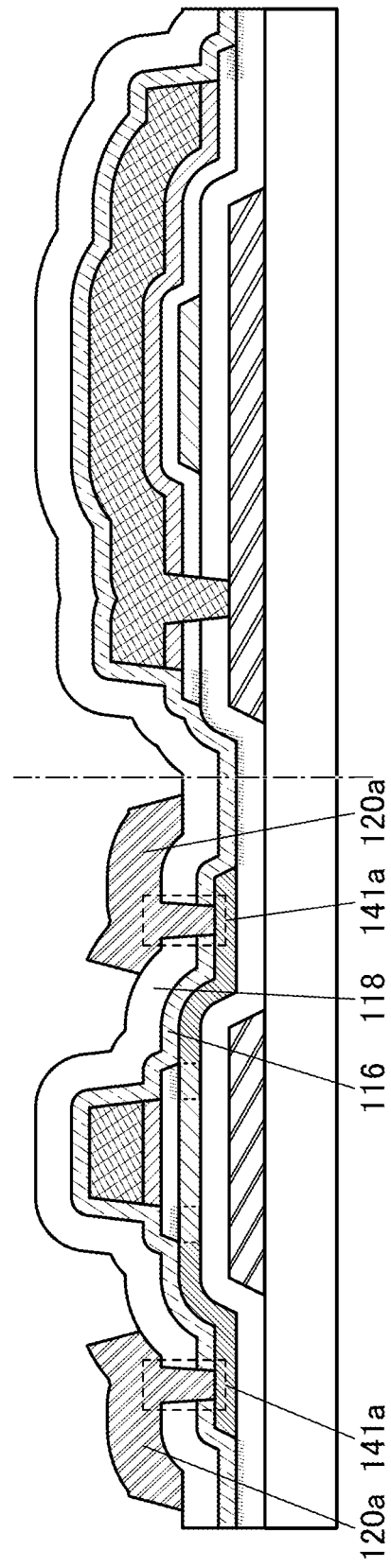
FIG. 6A
FIG. 6B

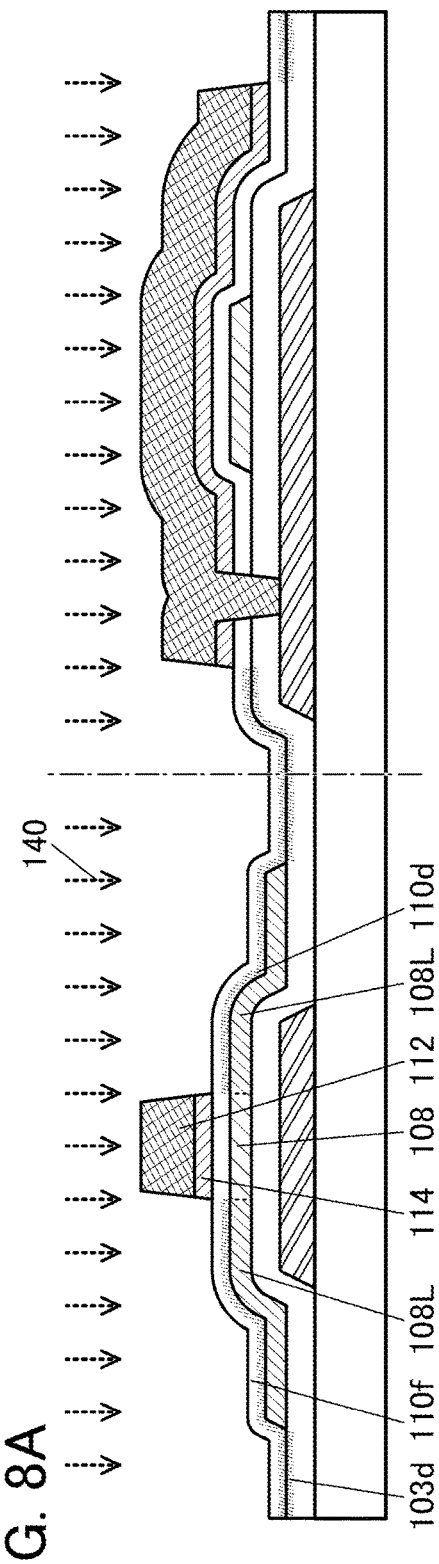
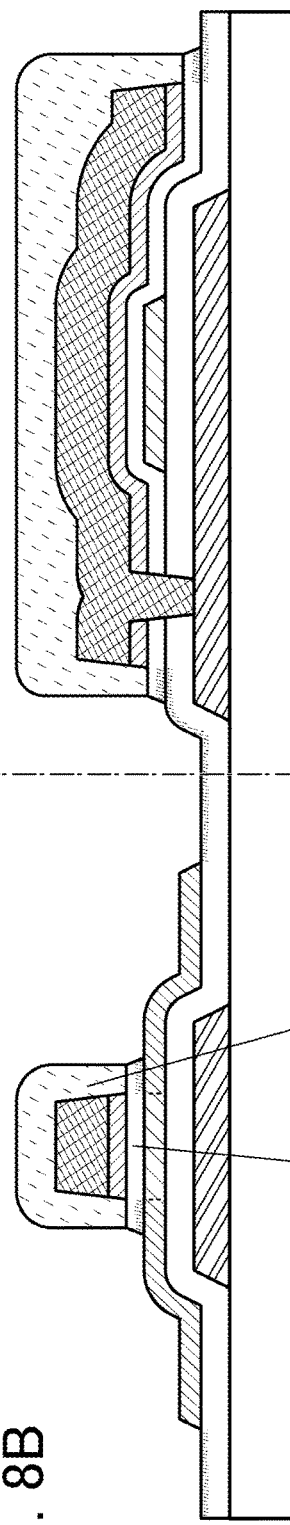
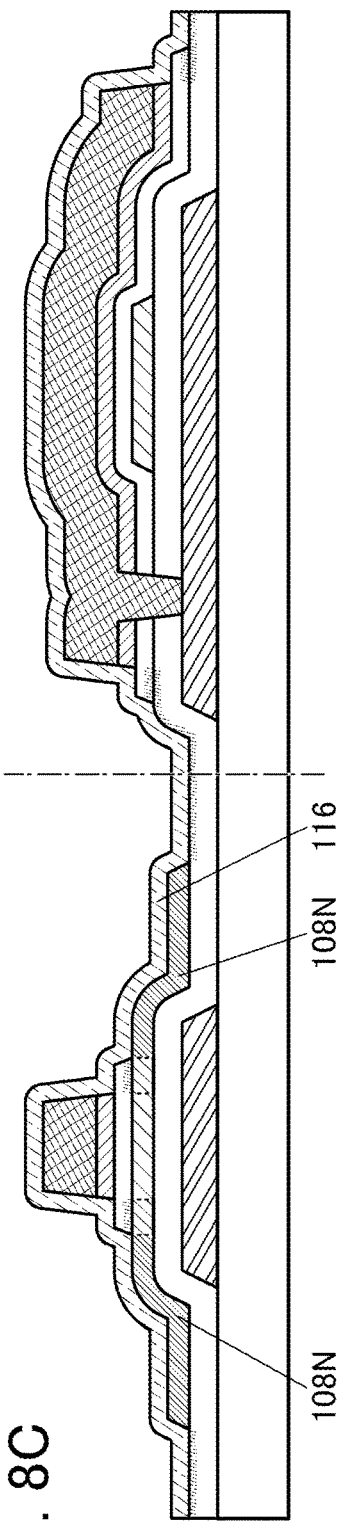

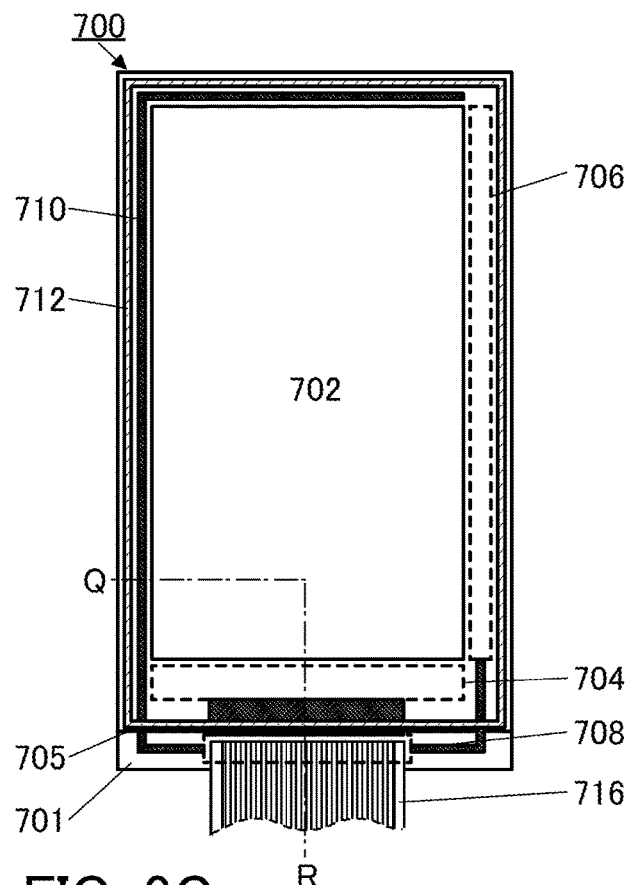
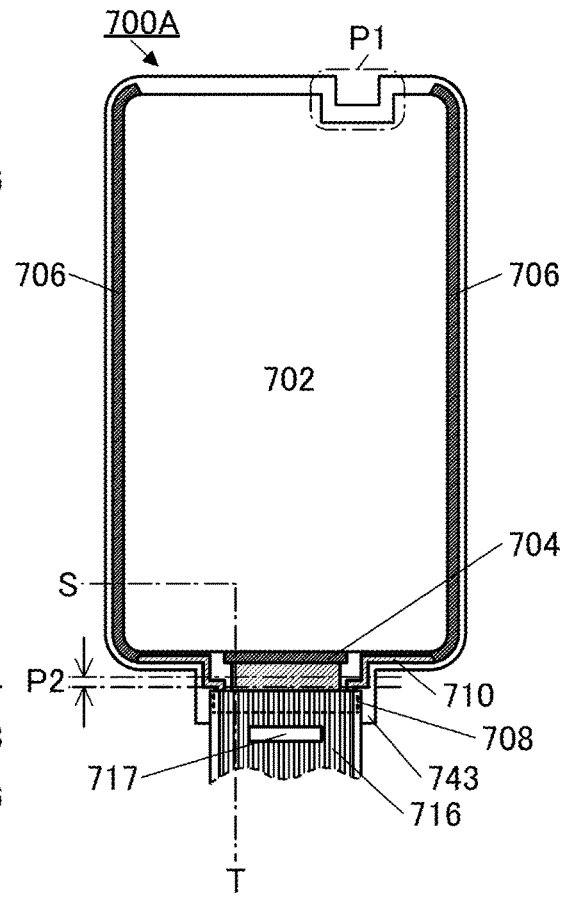
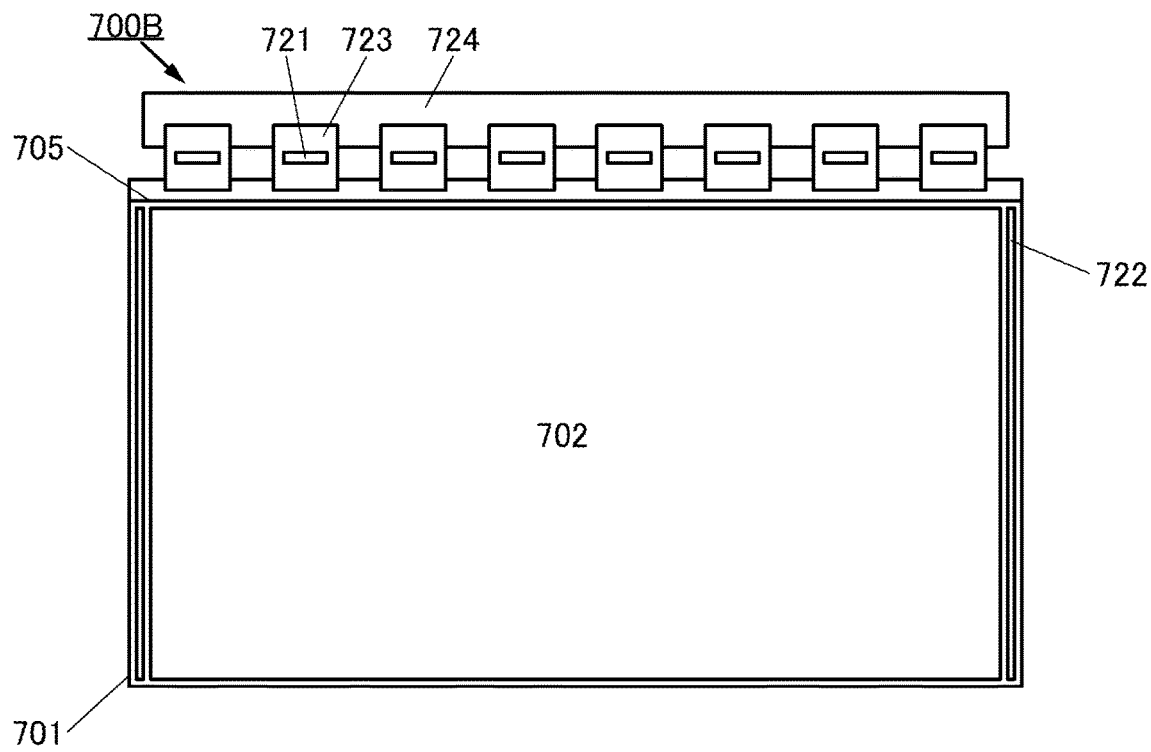

9100

9200

9101

9201

9102

9201

9201

# SEMICONDUCTOR DEVICE AND METHOD FOR MANUFACTURING SEMICONDUCTOR DEVICE

CROSS REFERENCE TO RELATED APPLICATIONS

This application is a continuation of U.S. application Ser. No. 16/978,262, filed Sep. 4, 2020, now U.S. Pat. No. 11,799,032, which is incorporated by reference and is a U.S. National Phase Application under 35 U.S.C. § 371 of International Application PCT/IB2019/051751, filed on Mar. 5, 2019, which is incorporated by reference and claims the benefit of foreign priority applications filed in Japan on Mar. 16, 2018, as Application No. 2018-048800 and Application No. 2018-048802.

TECHNICAL FIELD

One embodiment of the present invention relates to a semiconductor device. One embodiment of the present invention relates to a display device. One embodiment of the present invention relates to a method for manufacturing a semiconductor device or a display device.

Note that one embodiment of the present invention is not limited to the above technical field. Examples of the technical field of one embodiment of the present invention disclosed in this specification and the like can include a semiconductor device, a display device, a light-emitting device, a power storage device, a memory device, an electronic device, a lighting device, an input device, an input/output device, a driving method thereof, and a manufacturing method thereof. A semiconductor device refers to a device that can function by utilizing semiconductor characteristics in general.

BACKGROUND ART

As a semiconductor material applicable to a transistor, an oxide semiconductor using a metal oxide has attracted attention. For example, Patent Document 1 discloses a semiconductor device that makes field-effect mobility (simply referred to as mobility or FE in some cases) to be increased by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be deposited by a sputtering method or the like, and thus can be used for a semiconductor layer of a transistor included in a large display device. In addition, capital investment can be reduced because part of production equipment for transistors using polycrystalline silicon or amorphous silicon can be retrofitted and utilized. Furthermore, a transistor using a metal oxide has high field-effect mobility compared to the case of using amorphous silicon; therefore, a high-performance display device provided with a driver circuit can be achieved.

In addition, Patent Document 2 discloses a thin film transistor in which an oxide semiconductor film including a low-resistance region containing at least one kind in a group consisting of aluminum, boron, gallium, indium, titanium, silicon, germanium, tin, and lead as a dopant is applied to a source region and a drain region.

REFERENCE

Patent Documents

[Patent Document 1] Japanese Published Patent Application No. 2014-7399
[Patent Document 2] Japanese Published Patent Application No. 2011-228622

SUMMARY OF THE INVENTION

Problems to be Solved by the Invention

An object of one embodiment of the present invention is to provide a semiconductor device with favorable electrical characteristics. Another object is to provide a semiconductor device with stable electrical characteristics. Another object is to provide a highly reliable semiconductor device. Another object is to provide a highly reliable display device.

Note that the description of these objects does not preclude the existence of other objects. Note that one embodiment of the present invention does not need to achieve all the objects. Note that objects other than these can be derived from the description of the specification, the drawings, the claims, and the like.

Means for Solving the Problems

One embodiment of the present invention is a semiconductor device including a semiconductor layer, a first insulating layer, and a first conductive layer. The first insulating layer is provided over the semiconductor layer. The first conductive layer is provided over the first insulating layer. The semiconductor layer includes a first region that overlaps with the first conductive layer and the first insulating layer, a second region that does not overlap with the first conductive layer and overlaps with the first insulating layer, and a third region that overlaps with neither the first conductive layer nor the first insulating layer. The semiconductor layer contains a metal oxide. The second region and the third region contain a first element. The first element is one or more elements selected from boron, phosphorus, aluminum, and magnesium. The first element exists in a state of being bonded to oxygen.

Another embodiment of the present invention is a semiconductor device including a semiconductor layer, a first insulating layer, a second insulating layer, and a first conductive layer. The first insulating layer is provided over the semiconductor layer. The first conductive layer is provided over the first insulating layer. The second insulating layer is provided over the semiconductor layer, the first insulating layer, and the first conductive layer. The semiconductor layer includes a first region that overlaps with the first conductive layer and the first insulating layer, a second region that does not overlap with the first conductive layer and overlaps with the first insulating layer, and a third region that is in contact with the second insulating layer. The semiconductor layer contains a metal oxide. The second insulating layer contains more hydrogen than the first insulating layer. The second region and the third region contain a first element. The first element is one or more elements selected from boron, phosphorus, aluminum, and magnesium. The first element exists in a state of being bonded to oxygen.

One embodiment of the present invention is a semiconductor device including a semiconductor layer, a first insulating layer, a second insulating layer, and a first conductive layer. The first insulating layer is provided over the semiconductor layer. The first conductive layer is provided over the first insulating layer. The second insulating layer is provided over the semiconductor layer, the first insulating layer, and the first conductive layer. The semiconductor layer includes a first region that overlaps with the first conductive layer and the first insulating layer, a second region that does not overlap with the first conductive layer and overlaps with the first insulating layer, and a third region that is in contact with the second insulating layer. The semiconductor layer contains a metal oxide. The second insulating layer contains one or more elements selected from aluminum, titanium, tantalum, tungsten, chromium, and ruthenium, and nitrogen. The second region and the third region contain a first element, and the first element is one or more elements selected from boron, phosphorus, aluminum, and magnesium. The first element exists in a state of being bonded to oxygen.

In the above, the first insulating layer preferably includes a fourth region that overlaps with the first conductive layer and the first region, and a fifth region that overlaps with the second region. In that case, the fifth region preferably contains the first element. In that case, the first element in the fifth region preferably exists in a state of being bonded to oxygen.

In the above, the first insulating layer preferably contains an oxide and the second insulating layer preferably contains a nitride.

In the above, the first insulating layer preferably includes a portion projected beyond a side surface of the first conductive layer, and an end portion of the first conductive layer is preferably located inward from an end portion of the first insulating layer in a plan view.

In the above, the second insulating layer is preferably in contact with a top surface and a side surface of the first conductive layer, a top surface and a side surface of the first insulating layer, and a top surface and a side surface of the third region.

In the above, a second conductive layer and a third insulating layer are preferably further included. In that case, it is preferable that the third insulating layer be provided to cover the second conductive layer, the semiconductor layer be provided over the third insulating layer, and the second conductive layer include a portion that overlaps with the semiconductor layer, the first insulating layer, and the first conductive layer with the third insulating layer therebetween.

Another embodiment of the present invention is a manufacturing method of a semiconductor device including a first step in which a semiconductor layer containing a metal oxide is formed, a second step in which a first insulating film containing an oxide and a first conductive film are formed over the semiconductor layer, a third step in which the first conductive film and the first insulating film are etched to form a first conductive layer and a first insulating layer including a portion projected beyond a side surface of the first conductive layer and to form a portion of the semiconductor layer that is not covered with the first insulating layer, a fourth step in which a first element is supplied into the first insulating layer and the semiconductor layer using the first conductive layer as a mask, and a fifth step in which hydrogen is supplied to the portion of the semiconductor layer that is not covered with the first insulating layer. The first element is preferably boron, phosphorus, aluminum, or magnesium.

In the fourth step, the first element is preferably supplied by a plasma ion doping method or an ion implantation method.

In the fifth step, it is preferable that a second insulating layer containing hydrogen be deposited in contact with the portion of the semiconductor layer that is not covered with the first insulating layer by a plasma CVD method and then heat treatment be performed to supply hydrogen to the semiconductor layer.

Another embodiment of the present invention is a manufacturing method of a semiconductor device including a first step in which a semiconductor layer containing a metal oxide is formed, a second step in which a first insulating film containing an oxide and a first conductive film are formed over the semiconductor layer, a third step in which the first conductive film and the first insulating film are etched to form a first conductive layer and a first insulating layer including a portion projected beyond a side surface of the first conductive layer and to form a portion of the semiconductor layer that is not covered with the first insulating layer, a fourth step in which a first element is supplied into the first insulating layer and the semiconductor layer using the first conductive layer as a mask, and a fifth step in which a first layer is formed in contact with the portion of the semiconductor layer that is not covered with the first insulating layer and then heat treatment is performed. The first element is boron, phosphorus, aluminum, or magnesium. The first layer preferably contains one or more elements selected from aluminum, titanium, tantalum, tungsten, chromium, and ruthenium, and nitrogen.

In the fourth step, the first element is preferably supplied by a plasma ion doping method or an ion implantation method.

In the above, the heat treatment is preferably performed at a temperature higher than or equal to 200° C. and lower than or equal to 450° C. in an atmosphere containing nitrogen.

Effect of the Invention

According to one embodiment of the present invention, it is possible to provide a semiconductor device with favorable electrical characteristics. Alternatively, it is possible to provide a semiconductor device with stable electrical characteristics. Alternatively, it is possible to provide a highly reliable semiconductor device. Alternatively, it is possible to provide a highly reliable display device.

Note that the description of the effects does not preclude the existence of other effects. Note that one embodiment of the present invention does not need to have all the effects. Note that effects other than these can be derived from the description of the specification, the drawings, the claims, and the like.

BRIEF DESCRIPTION OF THE DRAWINGS

FIGS. 4A and 4B Diagrams illustrating a method for manufacturing a semiconductor device.

FIGS. 5A and 5B Diagrams illustrating a method for manufacturing a semiconductor device.

FIGS. 6A and 6B Diagrams illustrating a method for manufacturing a semiconductor device.

FIGS. 8A to 8C Diagrams illustrating a method for manufacturing a semiconductor device.

FIGS. 9A to 9C Top views of display devices.

MODE FOR CARRYING OUT THE INVENTION

Figure 1A:
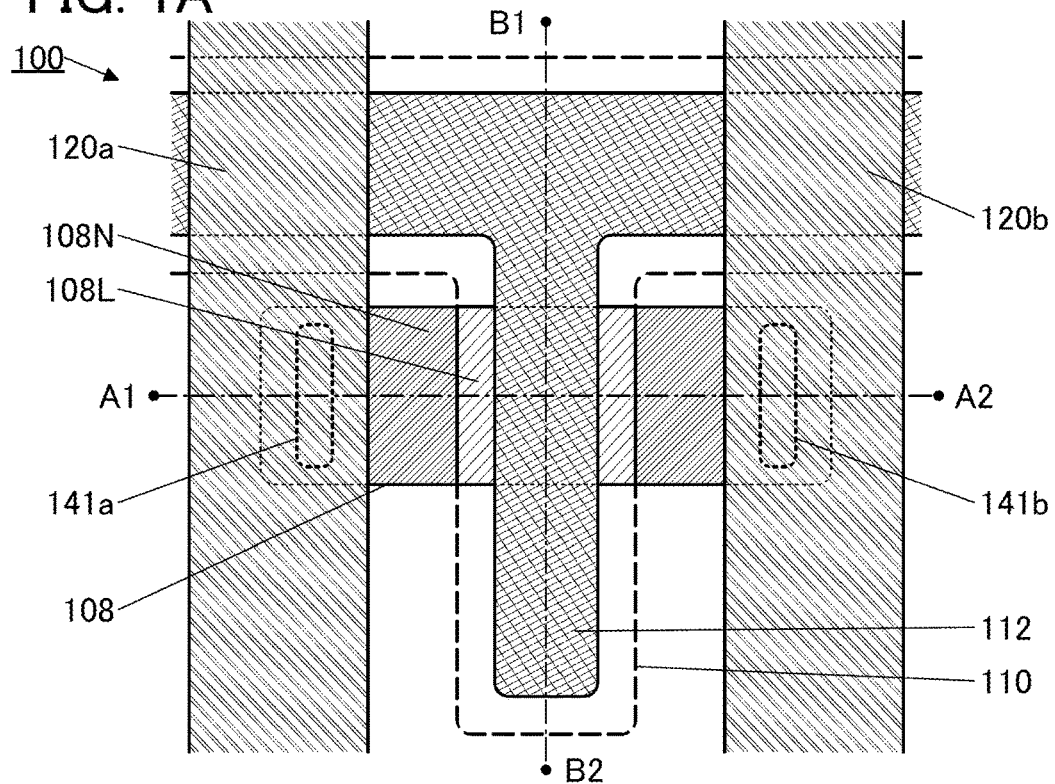
FIGS. 1A to 1C A structure example of a semiconductor device.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

Furthermore, in each drawing described in this specification, the size, the layer thickness, or the region of each component is exaggerated for clarity in some cases.

Furthermore, ordinal numbers such as "first," "second," and "third" used in this specification are used in order to avoid confusion among components, and the terms do not limit the components numerically.

In addition, in this specification, terms for describing arrangement, such as "over" and "under," are used for convenience to describe the positional relationship between components with reference to drawings. Furthermore, the positional relationship between components is changed as appropriate in accordance with a direction in which the components are described. Thus, terms for the description are not limited to terms used in the specification, and description can be made appropriately depending on the situation.

Furthermore, in this specification and the like, functions of a source and a drain of a transistor are sometimes interchanged with each other when a transistor of opposite polarity is employed or the direction of current is changed in circuit operation, for example. Therefore, the terms "source" and "drain" can be used interchangeably.

Note that in this specification and the like, a channel length direction of a transistor refers to one of the directions parallel to a straight line that connects a source region and a drain region in the shortest distance. In other words, a channel length direction corresponds to one of the directions of current flowing through a semiconductor layer when a transistor is in an on state. In addition, a channel width direction refers to a direction orthogonal to the channel length direction. Note that each of the channel length direction and the channel width direction is not fixed to one direction in some cases depending on the structure and the shape of a transistor.

Furthermore, in this specification and the like, "electrically connected" includes the case where connection is made through an "object having any electric action." Here, there is no particular limitation on the "object having any electric action" as long as electric signals can be transmitted and received between the connected components. Examples of the "object having any electric action" include a switching element such as a transistor, a resistor, an inductor, a capacitor, and other elements with a variety of functions as well as an electrode and a wiring.

Furthermore, in this specification and the like, the term "film" and the term "layer" can be interchanged with each other. For example, in some cases, the term "conductive layer" and the term "insulating layer" can be interchanged with the term "conductive film" and the term "insulating film," respectively.

Furthermore, unless otherwise specified, off-state current in this specification and the like refers to drain current of a transistor in an off state (also referred to as a non-conducting state or a cutoff state). Unless otherwise specified, an off state refers to, in an n-channel transistor, a state where voltage $V_{gs}$ between its gate and source is lower than the threshold voltage $V_{th}$ (in a p-channel transistor, higher than $V_{th}$).

In this specification and the like, a display panel that is one embodiment of a display device has a function of displaying (outputting) an image or the like on (to) a display surface. Thus, the display panel is one embodiment of an output device.

Furthermore, in this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel that is one embodiment of a display device has a function of displaying an image or the like on a display surface and a function of a touch sensor capable of sensing the contact, press, approach, or the like of a sensing target such as a finger or a stylus with or to the display surface. Therefore, the touch panel is one embodiment of an input/output device.

A touch panel can also be referred to as, for example, a display panel (or a display device) with a touch sensor or a display panel (or a display device) having a touch sensor function. A touch panel can include a display panel and a touch sensor panel. Alternatively, a touch panel can have a function of a touch sensor inside a display panel or on a surface thereof.

Furthermore, in this specification and the like, a substrate of a touch panel to which a connector or an IC is attached is referred to as a touch panel module, a display module, or simply a touch panel or the like in some cases.

Embodiment 1

In this embodiment, a semiconductor device and a display device of one embodiment of the present invention and manufacturing methods thereof will be described.

One embodiment of the present invention is a transistor including, over a formation surface, a semiconductor layer in which a channel is formed, a gate insulating layer (also referred to as a first insulating layer) over the semiconductor layer, and a conductive layer (also referred to as a first conductive layer) functioning as a gate electrode over the gate insulating layer. The semiconductor layer preferably contains a metal oxide exhibiting semiconductor characteristics (hereinafter also referred to as an oxide semiconductor).

The gate insulating layer is preferably provided to cover part of the top surface of the semiconductor layer. The gate electrode is preferably provided such that an end portion thereof is located inward from an end portion of the gate insulating layer. In other words, the gate insulating layer preferably includes a portion projected beyond the end portion of the gate electrode, at least over the semiconductor layer.

The semiconductor layer includes a first region that overlaps with the gate electrode and the gate insulating layer, a second region that overlaps with the gate insulating layer and does not overlap with the gate electrode, and a third region that overlaps with neither the gate electrode nor the gate insulating layer. The first region is a region functioning as a channel formation region. The third region is a region having lower resistance than the first region and a region functioning as a source region or a drain region. The second region is a region having lower resistance than the first region, and preferably having higher resistance than the third region.

The second region can function as a buffer region for preventing carrier supply sources contained in the third region from diffusing into the first region, which is the channel formation region. When the second region is provided, the cater concentration of the first region, which is the channel formation region, can be made extremely low. The second region may function as an LDD (Lightly Doped Drain) region.

Here, the second region and the third region preferably contain an element (also referred to as a first element) that may be bonded to oxygen in the metal oxide to cause an oxygen vacancy in the metal oxide. Boron, phosphorus, aluminum, magnesium, silicon, or the like can be suitably used as such an element, for example. It is further preferable that the element exist in a state of being bonded to oxygen in the semiconductor layer.

The elements in the second region and the third region are bonded to oxygen in the metal oxide, whereby oxygen vacancies are generated in the metal oxide. When the oxygen vacancies are bonded to hydrogen contained in the film, cater supply sources are formed; thus, the second region and the third region are each in a state of having lower resistance than the first region. Furthermore, the third region preferably has higher concentration of the element than the second region. Accordingly, the third region can be in a state of having lower resistance than the second region.

In addition, it is preferable that the first element be contained also in the gate insulating layer in a portion in contact with the second region, i.e., a portion that does not overlap with the gate electrode. Furthermore, it is preferable that the first element not be added to the gate insulating layer in a portion in contact with the channel formation region, i.e., a portion that overlaps with the gate electrode.

When heat treatment is performed in a state where the gate insulating layer containing an oxide is provided in contact with the top surface of the semiconductor layer, oxygen released from the gate insulating layer can be supplied to the semiconductor layer. Thus, oxygen vacancies in the semiconductor layer can be filled, and a highly reliable transistor can be obtained.

Meanwhile, when oxygen is supplied to the second region, carrier density decreases and electrical resistance increases in some cases. However, in one embodiment of the present invention, the first element is added to the portion of the gate insulating layer that is in contact with the second region. When the first element is added to an oxide film from which oxygen can be released by heating, the amount of released oxygen can be reduced. As a result, supply of oxygen from the gate insulating layer to the second region can be inhibited, and the second region can maintain the low-electrical-resistance state.

Employing such a structure makes it possible to achieve a semiconductor device with excellent electrical characteristics and high reliability, which includes a channel formation region with sufficiently reduced oxygen vacancies and extremely low carrier density, a source region and a drain region that have extremely low electrical resistance, and an LDD region therebetween.

Such a transistor can be manufactured by, for example, heat treatment after treatment for supplying the first element to the gate insulating layer and the semiconductor layer using the gate electrode as a mask.

At this time, the first element is further preferably supplied by a plasma ion doping method or an ion implantation method. These methods can easily adjust the depth at which ions are added and thus make it easy to add ions aiming at a region including the gate insulating layer and the semiconductor layer.

When the first element is added, ion supply conditions are preferably set such that the concentration of the first element becomes the highest in a region of the semiconductor layer on the gate insulating layer side or in the vicinity of an interface between the semiconductor layer and the gate insulating layer. In that case, the first element at appropriate concentration can be added to both the semiconductor layer and the gate insulating layer by one step. Moreover, by formation of a region having high concentration of the first element in a portion of the gate insulating layer near the second region, diffusibility of oxygen in this portion is effectively reduced, and oxygen in the gate insulating layer can be further effectively inhibited from diffusing into the second region side. Furthermore, since the gate insulating layer is not provided over the third region, the first element is added to the third region at high concentration to further reduce resistance; thus, contact resistance between the low-resistance region and a source electrode or a drain electrode can be further reduced.

In addition, in the case where an element that is likely to be bonded to oxygen is used as the first element as described above, the first element exists in a state of being bonded to oxygen in the semiconductor layer. In other words, the first element takes oxygen in the semiconductor layer away to cause an oxygen vacancy in the semiconductor layer, the oxygen vacancy is bonded to hydrogen in the film, and thus, a carrier is generated. Furthermore, the first element in the semiconductor layer exists stably in an oxidized state; thus, the first element is not desorbed by heat or the like applied during the manufacturing process, which makes it possible to achieve a low-resistance region stably. For example, even when a temperature higher than or equal to 400° C., higher than or equal to 600° C., or higher than or equal to 800° C. is applied during the manufacturing process, a stable low-resistance region can be maintained.

In addition, an insulating film containing an oxide is preferably used as the gate insulating layer. Furthermore, oxygen that is released by heating (also referred to as excess oxygen) is preferably contained in the gate insulating layer. In that case, the first element in the gate insulating layer exists in a state of being bonded to excess oxygen in the gate insulating layer. When the first element is bonded to excess oxygen to be stabilized, oxygen is hardly released from a region to which the first element is added even when heating is performed, or oxygen does not easily diffuse. Accordingly, oxygen is supplied to the channel formation region (first region) while preventing an increase in resistance due to supply of oxygen from the gate insulating layer to the second region, so that oxygen vacancies can be reduced. As a result, a transistor that has favorable electrical characteristics and high reliability can be obtained.

As the first element, an element that is stabilized by being bonded to oxygen in the semiconductor layer and in the gate insulating layer is preferably used. For example, an element an oxide of which can exist as a solid in a normal state is preferably used. A particularly preferable element can be selected from a typical non-metal element other than a rare gas and hydrogen, a typical metal element, and a transition metal element. It is particularly preferable to use boron, phosphorus, aluminum, magnesium, silicon, or the like.

By the way, a technique in which a dopant is supplied to a silicon thin film or bulk to make the silicon n-type or p-type is known. This technique is a method for adjusting carrier density by substitution of a dopant serving as a donor or an acceptor for a site of a silicon atom. For example, phosphorus or arsenic in silicon functions as a donor and thus can impart n-type conductivity, and boron or aluminum in silicon functions as an acceptor and thus can impart p-type conductivity. In this manner, the polarity of conductivity of silicon can be controlled depending on a dopant type.

Meanwhile, in one embodiment of the present invention, the first element extracts oxygen in the metal oxide so that an oxygen vacancy is generated in the film; when the oxygen vacancy and hydrogen in the film are bonded to each other, a carrier is generated. Thus, the first element itself is not required to behave as a donor or an acceptor in the metal oxide. Even an element that functions as an acceptor in silicon, such as boron or aluminum, for example, can impart n-type conductivity to the metal oxide like phosphorus or the like. Hence, a function required for the first element is completely different from a function required for a dopant in silicon.

The third region preferably contains much hydrogen than the first region and the second region. In that case, the third region can be in a state of having further lower resistance than the second region. Even when the third region contains much hydrogen, the second region can effectively inhibit diffusion of hydrogen into the first region. Accordingly, the channel formation region has extremely low carrier density and the source region and the drain region are brought into an extremely low-resistance state; thus, a transistor with excellent electrical characteristics can be obtained.

As a method for supplying hydrogen into the third region, for example, heat treatment which is performed in a state of providing a film containing hydrogen (also referred to as a second insulating layer) over and in contact with the third region is preferable. In that case, a structure is formed in which the first insulating layer is provided in contact with the top surface of the second region, and the second region and the second insulating layer are not in contact with each other; thus, the hydrogen concentration of the second region can be lower than that of the third region.

Alternatively, hydrogen may be supplied to the semiconductor layer by a method such as an ion doping method, an ion implantation method, or heat treatment in an atmosphere containing hydrogen, using the gate electrode as a mask. Even in that case, the concentration of hydrogen supplied to the second region can be lower than that of the third region because the first insulating layer is provided over the second region.

That is, the second region is a region having lower concentration of the first element than the third region, a region containing a smaller amount of oxygen vacancies than the third region, and a region having lower hydrogen concentration than the third region; accordingly, the second region can be regarded as a high-resistance region having lower carrier concentration than the third region.

Alternatively, the third region is preferably a region whose resistance is reduced by performing heat treatment in a state of forming a first layer that covers the third region.

For the first layer, a film containing at least one of metal elements such as aluminum, titanium, tantalum, tungsten, chromium, and ruthenium can be used. It is particularly preferable to contain at least one of aluminum, titanium, tantalum, and tungsten. Alternatively, a nitride containing at least one of these metal elements or an oxide containing at least one of these metal elements can be suitably used.

For example, a nitride film such as an aluminum nitride film, an aluminum titanium nitride film, or a titanium nitride film, or an oxide film such as an aluminum titanium oxide film can be suitably used. Alternatively, a metal film such as a tungsten film or a titanium film may be used.

In the case of using an aluminum titanium nitride film, for example, a film satisfying a composition formula of $AlTiN_x$ (x is a real number greater than 0 and less than or equal to 3) or a composition formula of $AlTi_xN_y$ (x is a real number greater than 0 and less than or equal to 2, y is a real number greater than 0 and less than or equal to 4) is further preferably used.

The temperature of the heat treatment is preferably as high as possible because a reduction in the resistance of the third region is accelerated. The temperature of the heat treatment is determined in consideration of the heat resistance of the gate electrode, for example. The temperature can be set higher than or equal to 150° C. and lower than or equal to 500° C., preferably higher than or equal to 200° C. and lower than or equal to 450° C., further preferably higher than or equal to 250° C. and lower than or equal to 450° C., and still further preferably higher than or equal to 300° C. and lower than or equal to 400° C., for example. When the temperature of the heat treatment is approximately 350° C., for example, semiconductor devices can be manufactured at a high yield with production facilities using large-size glass substrates.

The heat treatment is performed in a state where the first layer is provided in contact with the third region, whereby oxygen in the third region is absorbed into the first layer, and thus, many oxygen vacancies can be generated in the third region. Accordingly, the third region having extremely low resistance can be formed. Meanwhile, since the first insulating layer is provided over the second region and thus the second region is not directly in contact with the first layer, oxygen is not directly absorbed by the first layer. As a result, the third region having extremely lower resistance than the second region can be formed.

The third region formed in such a manner has a feature in that its resistance is not likely to be increased by subsequent process. There is no possibility that the conductivity of the third region is impaired by heat treatment in an atmosphere containing oxygen or by deposition process in an atmosphere containing oxygen, for example; thus, a transistor with favorable electrical characteristics and high reliability can be obtained.

When the first layer that has undergone the heat treatment has conductivity, the first layer is preferably removed after the heat treatment. By contrast, when the first layer has insulating properties, the first layer can be left to function as a protective insulating film (second insulating layer).

It is particularly preferable to make the above-described aluminum nitride film or aluminum titanium nitride film remain because the film has excellent insulating properties.

More specific examples will be described below with reference to drawings.

Structure Example 1

Figure 1B:
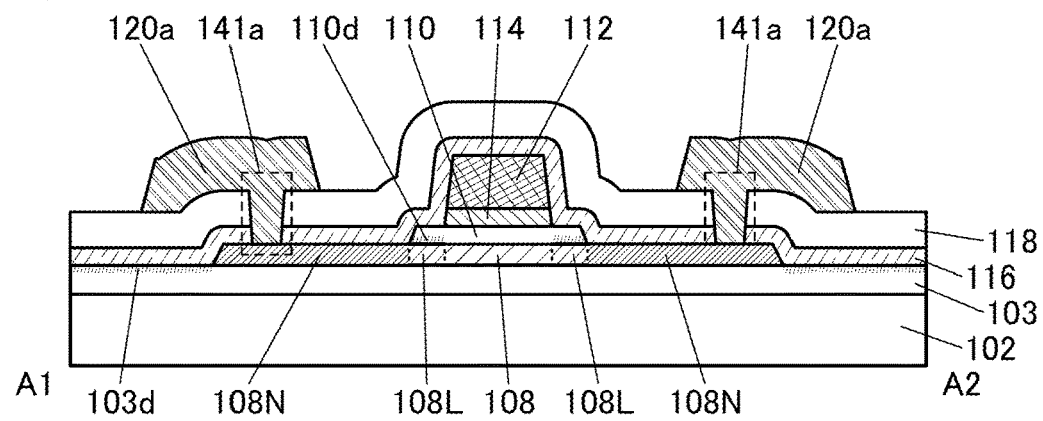
Figure 1C:
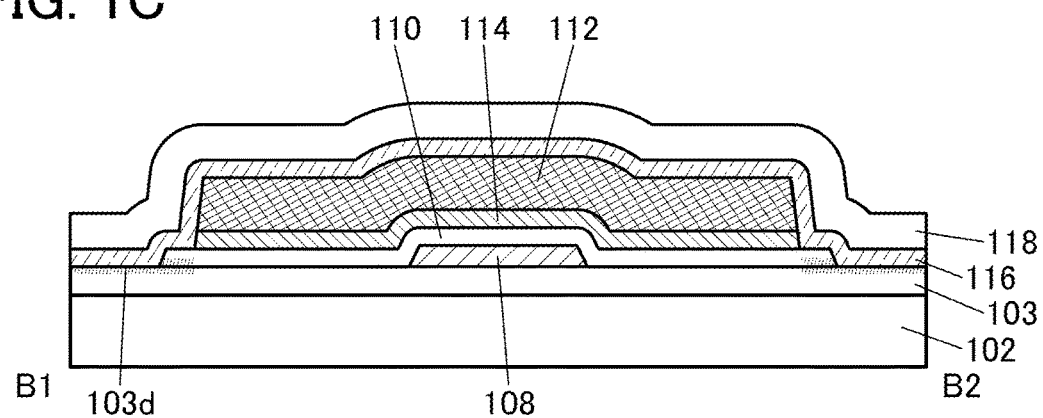

FIG. 1(A) is a top view of a transistor 100, FIG. 1(B) corresponds to a cross-sectional view of a cut plane taken along a dashed-dotted line A1-A2 in FIG. 1(A), and FIG. 1(C) corresponds to a cross-sectional view of a cut plane taken along a dashed-dotted line B1-B2 in FIG. 1(A). Note that in FIG. 1(A), some components of the transistor 100 (a protective insulating layer and the like) are not illustrated. In addition, the direction of the dashed-dotted line A1-A2 corresponds to a channel length direction, and the direction of the dashed-dotted line B1-B2 corresponds to a channel width direction. Furthermore, some components are not illustrated in top views of transistors in the following drawings, as in FIG. 1(A).

The transistor 100 is provided over a substrate 102 and includes an insulating layer 103, a semiconductor layer 108, an insulating layer 110, a metal oxide layer 114, a conductive layer 112, an insulating layer 116, an insulating layer 118, and the like. The island-shaped semiconductor layer 108 is provided over the insulating layer 103. The insulating layer 110 is provided to cover part of the top surface of the insulating layer 103 and part of the top surface of the semiconductor layer 108. The metal oxide layer 114 and the conductive layer 112 are provided to be stacked in this order over the insulating layer 110 and each include a portion overlapping with the semiconductor layer 108. The metal oxide layer 114 and the conductive layer 112 are provided to be located inward from an end portion of the insulating layer 110 in a plan view. The insulating layer 116 is provided to cover the top surface and a side surface of the conductive layer 112, a side surface of the metal oxide layer 114, the top surface and a side surface of the insulating layer 110, the top surface and a side surface of the semiconductor layer 108, and the top surface of the insulating layer 103. The insulating layer 118 is provided to cover the insulating layer 116.

Part of the conductive layer 112 functions as a gate electrode. Part of the insulating layer 110 functions as a gate insulating layer. The transistor 100 is what is called a top-gate transistor, in which the gate electrode is provided over the semiconductor layer 108.

In addition, as illustrated in FIGS. 1(A) and 1(B), the transistor 100 may include a conductive layer 120a and a conductive layer 120b over the insulating layer 118. The conductive layer 120a and the conductive layer 120b function as a source electrode and a drain electrode. The conductive layer 120a and the conductive layer 120b are electrically connected to regions 108N to be described later through an opening portion 141a and an opening portion 141b, respectively, which are provided in the insulating layer 118 and the insulating layer 116.

The semiconductor layer 108 preferably contains a metal oxide.

The semiconductor layer 108 preferably contains indium, M (M is one kind or a plurality of kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. It is particularly preferable that M be one kind or a plurality of kinds selected from aluminum, gallium, yttrium, and tin.

It is particularly preferable to use an oxide containing indium, gallium, and zinc for the semiconductor layer 108.

The semiconductor layer 108 may have a stacked-layer structure in which layers with different compositions, layers with different crystallinities, or layers with different impurity concentrations are stacked.

The conductive layer 112 and the metal oxide layer 114 are processed to have substantially the same top surface shapes.

Note that in this specification and the like, the expression "having substantially the same top surface shapes" means that at least outlines of stacked layers partly overlap with each other. For example, the case of processing an upper layer and a lower layer with the use of the same mask pattern or mask patterns that are partly the same is included. However, in some cases, the outlines do not exactly overlap with each other and the outline of the upper layer is located on an inner side of the outline of the lower layer or the outline of the upper layer is located on an outer side of the outline of the lower layer; such a case is also represented by the expression "having substantially the same top surface shapes."

The metal oxide layer 114 positioned between the insulating layer 110 and the conductive layer 112 functions as a barrier film that prevents diffusion of oxygen contained in the insulating layer 110 into a conductive layer 112 side. Furthermore, the metal oxide layer 114 also functions as a barrier film that prevents diffusion of hydrogen and water contained in the conductive layer 112 into an insulating layer 110 side. For the metal oxide layer 114, a material that is less likely to transmit oxygen and hydrogen than at least the insulating layer 110 can be used, for example.

Even in the case where a metal material that is likely to absorb oxygen, such as aluminum or copper, is used for the conductive layer 112, the metal oxide layer 114 can prevent diffusion of oxygen from the insulating layer 110 into the conductive layer 112. Furthermore, even in the case where the conductive layer 112 contains hydrogen, diffusion of hydrogen from the conductive layer 112 to the semiconductor layer 108 through the insulating layer 110 can be prevented. Consequently, carrier density of the semiconductor layer 108 in a channel formation region can be extremely low.

For the metal oxide layer 114, an insulating material or a conductive material can be used. When the metal oxide layer 114 has insulating properties, the metal oxide layer 114 functions as part of the gate insulating layer. By contrast, when the metal oxide layer 114 has conductivity, the metal oxide layer 114 functions as part of the gate electrode.

An insulating material having a higher permittivity than silicon oxide is preferably used for the metal oxide layer 114. It is particularly preferable to use an aluminum oxide film, a hafnium oxide film, a hafnium aluminate film, or the like because drive voltage can be reduced.

For the metal oxide layer 114, a conductive oxide such as indium oxide, indium tin oxide (ITO), or indium tin oxide containing silicon (ITSO) can also be used, for example. A conductive oxide containing indium is particularly preferable because of its high conductivity.

For the metal oxide layer 114, an oxide material containing one or more of the same elements as those of the semiconductor layer 108 is preferably used. It is particularly preferable to use an oxide semiconductor material that can be used for the semiconductor layer 108. Here, a metal oxide film formed using the same sputtering target as that for the semiconductor layer 108 is preferably applied to the metal oxide layer 114 because an apparatus can be shared.

Alternatively, when a metal oxide material containing indium and gallium is used for both the semiconductor layer 108 and the metal oxide layer 114, a material whose composition (content ratio) of gallium is higher than that in the semiconductor layer 108 is preferably used because an oxygen blocking property can be further increased. In that case, the use of a material whose composition of indium is higher than that in the metal oxide layer 114 for the semiconductor layer 108 enables an increase in the field-effect mobility of the transistor 100.

The metal oxide layer 114 is preferably formed using a sputtering apparatus. In the case where an oxide film is formed using a sputtering apparatus, forming the oxide film in an atmosphere containing an oxygen gas can suitably supply oxygen into the insulating layer 110 or the semiconductor layer 108, for example.

The semiconductor layer 108 includes the channel formation region, which overlaps with the conductive layer 112 with the insulating layer 110 therebetween. The semiconductor layer 108 also includes a pair of regions 108L between which the channel formation region is sandwiched and a pair of regions 108N on outer sides of the regions 108L. The regions 108L are each a region of the semiconductor layer 108 that overlaps with the insulating layer 110 and does not overlap with the conductive layer 112. The regions 108N are each a region of the semiconductor layer 108 that overlaps with neither the conductive layer 112 nor the insulating layer 110, and a region in contact with the insulating layer 116.

Each of the region 108L and the region 108N can also be regarded as a region having lower resistance than the channel formation region, a region having higher carrier concentration than the channel formation region, a region having a higher oxygen defect density than the channel formation region, a region having higher impurity concentration than the channel formation region, or an n-type region. The region 108N can also be regarded as a region having lower resistance than the region 108L, a region having higher carrier concentration than the region 108L, a region having a higher oxygen defect density than the region 108L, a region having higher impurity concentration than the region 108L, or an n-type region.

The region 108L and the region 108N are each a region containing an impurity element (first element). Examples of the impurity element include hydrogen, boron, carbon, nitrogen, fluorine, phosphorus, sulfur, arsenic, aluminum, magnesium, and a rare gas. Note that typical examples of a rare gas include helium, neon, argon, krypton, and xenon. In particular, boron, phosphorus, magnesium, or aluminum is preferably contained. Alternatively, two or more of these elements may be contained.

The region 108N may include a region having higher concentration of the above impurity than the region 108L. The region 108N may have an impurity concentration peak at a deeper level than that of the region 108L.

For each of the insulating layer 103 and the insulating layer 110 that are in contact with the channel formation region of the semiconductor layer 108, an oxide film is preferably used. For example, an oxide film such as a silicon oxide film, a silicon oxynitride film, or an aluminum oxide film can be used. Accordingly, oxygen released from the insulating layer 103 and the insulating layer 110 can be supplied to the channel formation region of the semiconductor layer 108 by heat treatment or the like in the manufacturing process of the transistor 100 to reduce oxygen vacancies in the semiconductor layer 108.

Part of the end portion of the insulating layer 110 is positioned over the semiconductor layer 108. The insulating layer 110 includes a region overlapping with the conductive layer 112 and functioning as the gate insulating layer and a portion not overlapping with the conductive layer 112 (i.e., a portion overlapping with the region 108L).

The insulating layer 110 includes a region 110d that contains the above-described impurity element in a region not overlapping with the conductive layer 112. The region 110d is positioned at least in the vicinity of an interface with the region 108L. Furthermore, it is preferable that the region 110d not be provided in a portion that is in contact with the channel formation region of the semiconductor layer 108, as illustrated in FIGS. 1(B) and 1(C).

The insulating layer 103 includes, in a region not overlapping with the conductive layer 112, a region 103d that contains the above-described impurity element in the vicinity of an interface with the insulating layer 110 and in the vicinity of an interface with the insulating layer 116. Although not illustrated, the region 103d may be provided also in the vicinity of an interface with the region 108N or the region 108L. In that case, a portion overlapping with the region 108N or the region 108L has lower impurity concentration than a portion in contact with the insulating layer 110 or the insulating layer 116.

Here, the region 108L preferably has a concentration gradient such that the impurity concentration is higher in a portion closer to the insulating layer 110. In that case, the total amount of the impurity element in the region 108L can be smaller than that in the case where the concentration is uniform throughout the entire region 108L; thus, the amount of the impurity that might be diffused into the channel formation region owing to the influence of heat applied during the manufacturing process or the like can be kept small.

The region 108N may have a similar concentration gradient. In that case, an upper portion of the region 108N has lower resistance, and thus contact resistance with the conductive layer 120a (or the conductive layer 120b) can be more effectively reduced.

In addition, the region 110d preferably has a concentration gradient such that the impurity concentration is higher in a portion closer to the semiconductor layer 108. In the insulating layer 110 to which an oxide film from which oxygen can be released by heating is applied, release of oxygen in the region 110d to which the impurity element is added can be inhibited as compared with that in the other regions. Thus, the region 110d that is positioned in the vicinity of an interface with the region 108L in the insulating layer 110 can function as a blocking layer against oxygen and can effectively reduce oxygen supplied to the region 108L.

As described later, treatment for adding the impurity element to the region 108L, the region 108N, and the region 110d can be performed using the conductive layer 112 as a mask. Accordingly, the region 108L, the region 108N, and the region 110d can be formed in a self-aligned manner. Since the insulating layer 110 is provided over the region 108L at this time, the region 108N and the region 108L may have different impurity concentration gradient profiles in the depth direction.

To show high-impurity-concentration portions exaggeratedly, FIGS. 1(B) and 1(C) and the like illustrate parts of the insulating layer 110 and the insulating layer 103 with a hatch pattern as the region 110d and the region 103d; however, the impurity element may be actually contained in the entire insulating layer 110 and insulating layer 103 in a thickness direction.

The region 108N, the region 108L, and the region 110d each preferably include a region whose impurity concentration is higher than or equal to $1 \times 10^{19}$ atoms/cm$^3$ and lower than or equal to $1 \times 10^{23}$ atoms/cm$^3$, preferably higher than or equal to $5 \times 10^{19}$ atoms/cm$^3$ and lower than or equal to $5 \times 10^{22}$ atoms/cm$^3$, and further preferably higher than or equal to $1 \times 10^{20}$ atoms/cm$^3$ and lower than or equal to $1 \times 10^{22}$ atoms/cm$^3$. In addition, the region 108L preferably includes a portion having higher impurity concentration than the region 110d of the insulating layer 110 because the electrical resistance of the region 108L can be further effectively reduced. Furthermore, the region 108N preferably includes a portion having higher impurity concentration than the region 108L.

The concentrations of the impurities contained in the region 108L, the region 108N, and the region 110d can be analyzed by an analysis method such as secondary ion mass spectrometry (SIMS) or X-ray photoelectron spectroscopy (XPS), for example. In the case of using XPS analysis, it is possible to find out concentration distribution in the depth direction by the combination of XPS analysis and ion sputtering from a front surface side or a rear surface side.

In addition, the impurity element preferably exists in an oxidized state in the region 108L and the region 108N. For example, it is preferable to use an element that is easily oxidized, such as boron, phosphorus, magnesium, aluminum, or silicon, as the impurity element. Such an element that is easily oxidized can exist stably in a state of being bonded to oxygen in the semiconductor layer 108 to be oxidized and thus can be inhibited from being released even when a high temperature (e.g., higher than or equal to 400° C., higher than or equal to 600° C., or higher than or equal to 800° C.) is applied in a later step. Furthermore, when the impurity element takes oxygen in the semiconductor layer 108 away, many oxygen vacancies are generated in the region 108L and the region 108N. The oxygen vacancies are bonded to hydrogen in the film to serve as carrier supply sources; thus, the region 108L and the region 108N are in an extremely low-resistance state.

Note that an increase in resistance might be caused if much oxygen is supplied to the region 108L and the region 108N from the outside or a film near the region 108L and the region 108N at the time of performing high-temperature treatment in a later step. Thus, in the case where high-temperature treatment is performed, the treatment is preferably performed with the semiconductor layer 108 covered with the insulating layer 116 that has a high barrier property against oxygen.

In addition, the impurity element preferably exists in an oxidized state also in the region 110d. Since such an element that is easily oxidized can exist stably in a state of being bonded to oxygen in the insulating layer 110 to be oxidized, the element can be inhibited from being released even when a high temperature is applied in a later step. Furthermore, particularly in the case where oxygen (also referred to as excess oxygen) that might be released by heating is contained in the insulating layer 110, excess oxygen and the impurity element are bonded to each other and stabilized, so that oxygen can be inhibited from being supplied from the region 110d to the region 108L. Moreover, oxygen is less likely to be diffused into the region 110d containing the impurity element in the oxidized state, so that oxygen can also be prevented from being supplied from a portion above the region 110d to the region 108L through the region 110d.

For example, in the case where boron is used as the impurity element, boron contained in the region 108L, the region 108N, and the region 110d can exist in a state of being bonded to oxygen. This can be confirmed when a spectrum peak attributed to a $B_2O_3$ bond is observed in XPS analysis. Furthermore, in XPS analysis, the intensity of a spectrum peak attributed to a state where a boron element exists alone is so low that the spectrum peak is not observed or is buried in background noise at the measurement lower limit.

The insulating layer 116 is provided in contact with the region 108N of the semiconductor layer 108.

The insulating layer 116 functions as a hydrogen supply source to the region 108N. The insulating layer 116 is preferably a film from which hydrogen is released by heating, for example. Such an insulating layer 116 is provided in contact with the region 108N and heat treatment is performed after the formation of the insulating layer 116, whereby hydrogen can be supplied to the region 108N, leading to a reduction in resistance.

The insulating layer 116 is preferably a film formed using a gas containing a hydrogen element as a formation gas used in the formation. Accordingly, hydrogen can be effectively supplied to the region 108N also in the formation of the insulating layer 116.

For the insulating layer 116, an insulating film of silicon nitride, silicon nitride oxide, silicon oxynitride, aluminum nitride, aluminum nitride oxide, or the like can be used, for example.

The region 108N is in a state of containing many oxygen vacancies because the impurity elements are added thereto as described above. Thus, hydrogen contained in the semiconductor layer 108 and hydrogen supplied from the insulating layer 116 can further increase the carrier density.

Meanwhile, since the region 108L is not in contact with the insulating layer 116 owing to the insulating layer 110 therebetween, the amount of supplied hydrogen is smaller than that of the region 108N. Furthermore, the region 108L has lower impurity concentration than the region 108N and thus can be in a state of having higher resistance than the region 108N.

Alternatively, an insulating film containing a nitride can be used as the insulating layer 116 in contact with the region 108N. When the insulating layer 116 containing a nitride is provided in contact with the region 108N, an effect of further increasing the conductivity of the region 108N is attained. Moreover, heat treatment is preferably performed in a state where the insulating layer 116 is in contact with the region 108N because a reduction in resistance is accelerated.

As a nitride that can be used for the insulating layer 116, for example, a nitride of a semiconductor material, such as silicon nitride or gallium nitride, or a metal nitride such as aluminum nitride is particularly preferably used. Silicon nitride, for example, has a blocking property against hydrogen and oxygen; thus, both diffusion of hydrogen from the outside into the semiconductor layer and release of oxygen from the semiconductor layer to the outside can be prevented, which leads to a highly reliable transistor.

In the case of using a metal nitride, it is preferable to use a nitride of aluminum, titanium, tantalum, tungsten, chromium, or ruthenium. It is particularly preferable that aluminum or titanium be contained. For example, an aluminum nitride film formed by a reactive sputtering method using aluminum as a sputtering target and a nitrogen-containing gas as a deposition gas can be a film having both an extremely high insulating property and an extremely high blocking property against hydrogen and oxygen when the flow rate of a nitrogen gas with respect to the total flow rate of the deposition gas is appropriately controlled. Thus, when such an insulating film containing a metal nitride is provided in contact with the semiconductor layer, the resistance of the semiconductor layer can be reduced, diffusion of oxygen from the semiconductor layer to the outside, and diffusion of hydrogen into the semiconductor layer can be favorably prevented.

In the case where aluminum nitride is used as the metal nitride, the thickness of the insulating layer containing aluminum nitride is preferably 5 nm or more. A film with such a small thickness can have both a high blocking property against hydrogen and oxygen and a function of reducing the resistance of the semiconductor layer. Note that there is no upper limit of the thickness of the insulating layer; however, the thickness is preferably less than or equal to 500 nm, further preferably less than or equal to 200 nm, and still further preferably less than or equal to 50 nm in consideration of productivity.

In the case of using an aluminum nitride film as the insulating layer 116, it is preferable to use a film that satisfies the composition formula $AlN_x$ (x is a real number greater than 0 and less than or equal to 2, and preferably, x is a real number greater than 0.5 and less than or equal to 1.5). In that case, a film having an excellent insulating property and high thermal conductivity can be obtained, and thus dissipation of heat generated in driving the transistor 100 can be increased.

Alternatively, an aluminum titanium nitride film, a titanium nitride film, or the like can be used as the insulating layer 116.

Such an insulating layer 116 is provided in contact with the region 108N, whereby the insulating layer 116 absorbs oxygen in the region 108N and oxygen vacancies can be formed in the region 108N. In the case where a film containing a metal oxide is used as the insulating layer 116 in that case, a layer containing an oxide of a metal element (e.g., aluminum) contained in the insulating layer 116 is formed between the insulating layer 116 and the region 108N, in some cases.

Here, in the case where a metal oxide film containing indium is used as the semiconductor layer 108, a region where indium oxide is precipitated or a region having a high indium concentration is sometimes formed in the region 108N in the vicinity of the interface with the insulating layer 116. Such a region can sometimes be observed by an analysis method such as X-ray photoelectron spectroscopy (XPS), for example.

The region 108N can be a region containing more oxygen vacancies than the region 108L as described above, and thus can be a region having lower resistance than the region 108L. Moreover, when an insulating film containing a metal oxide is used as the insulating layer 116, a high-conductivity region where indium oxide is deposited is formed in the region 108N in the vicinity of the interface with the insulating layer 116, leading to a lower-resistance region.

The insulating layer 118 functions as a protective layer for protecting the transistor 100. An inorganic insulating material such as an oxide or a nitride can be used for the insulating layer 118, for example. More specifically, for example, an inorganic insulating material such as silicon nitride, silicon nitride oxide, silicon oxynitride, aluminum oxide, aluminum oxynitride, aluminum nitride, hafnium oxide, or hafnium aluminate can be used. Furthermore, the insulating layer 118 can be used as a planarization layer. In that case, an organic resin material can be used for the insulating layer 118.

Note that although the case where a stacked-layer structure of the insulating layer 116 and the insulating layer 118 is employed as the protective layer is described here, the insulating layer 118 is unnecessary if not needed. The insulating layer 118 may have a stacked-layer structure of two or more layers.

Here, the semiconductor layer 108 and oxygen vacancies that might be formed in the semiconductor layer 108 will be described.

Oxygen vacancies formed in the channel formation region of the semiconductor layer 108 adversely affect the transistor characteristics and therefore cause a problem. For example, when an oxygen vacancy is formed in the semiconductor layer 108, the oxygen vacancy might be bonded to hydrogen to serve as a carrier supply source. The carrier supply source generated in the channel formation region causes a change in the electrical characteristics, typified by a shift in the threshold voltage, of the transistor 100. Therefore, it is preferable that the amount of oxygen vacancies in the channel formation region be as small as possible.

In view of this, one embodiment of the present invention has a structure in which insulating films in the vicinity of the channel formation region of the semiconductor layer 108, specifically, the insulating layer 110 positioned above the channel formation region and the insulating layer 103 positioned below the channel formation region each include an oxide film. When oxygen is moved from the insulating layer 103 and the insulating layer 110 to the channel formation region by heat during the manufacturing process or the like, the amount of oxygen vacancies in the channel formation region can be reduced.

In addition, the semiconductor layer 108 preferably includes a region where the atomic ratio of In to M is greater than 1. A higher percentage of In content results in higher field-effect mobility of the transistor.

Here, in the case of a metal oxide containing In, Ga, and Zn, bonding strength between In and oxygen is weaker than bonding strength between Ga and oxygen; thus, with a higher percentage of In content, oxygen vacancies are likely to be generated in the metal oxide film. There is a similar tendency even when a metal element shown above as M is used instead of Ga. The existence of a large amount of oxygen vacancies in the metal oxide film leads to a reduction in electrical characteristics and a reduction in reliability of the transistor.

However, in one embodiment of the present invention, an extremely large amount of oxygen can be supplied into the channel formation region of the semiconductor layer 108 containing a metal oxide; thus, a metal oxide material with a high percentage of In content can be used. Accordingly, it is possible to achieve a transistor with extremely high field-effect mobility, stable electrical characteristics, and high reliability.

For example, a metal oxide in which the atomic ratio of In to M is 1.5 or higher, 2 or higher, 3 or higher, 3.5 or higher, or 4 or higher can be suitably used.

It is particularly preferable that the atomic ratio of In, M, and Zn in the semiconductor layer 108 be In:M:Zn=4:2:3 or in the neighborhood thereof. Alternatively, the atomic ratio of In, M, and Zn is preferably In:M:Zn=5:1:6 or in the neighborhood thereof. Furthermore, as the composition of the semiconductor layer 108, the atomic proportions of In, M, and Zn in the semiconductor layer 108 may be approximately equal to each other. That is, a material in which the atomic ratio of In, M, and Zn is In:M:Zn=1:1:1 or in the neighborhood thereof may be included.

For example, with the use of the transistor with high field-effect mobility in a gate driver that generates a gate signal, a display device with small frame width (also referred to as a narrow frame) can be provided. Furthermore, with the use of the transistor with high field-effect mobility in a source driver (particularly a demultiplexer connected to an output terminal of a shift register included in the source driver), a display device to which fewer wirings are connected can be provided.

Note that even when the semiconductor layer 108 includes the region where the atomic ratio of In to M is higher than 1, the field-effect mobility might be low if the semiconductor layer 108 has high crystallinity. The crystallinity of the semiconductor layer 108 can be analyzed by using X-ray diffraction (XRD) or a transmission electron microscope (TEM), for example.

Here, by reducing the impurity concentration and reducing the density of defect states (reducing oxygen vacancies) in the channel formation region of the semiconductor layer 108, the carrier density in the film can be reduced. A transistor in which such a metal oxide film is used for a channel formation region of a semiconductor layer rarely has electrical characteristics with a negative threshold voltage (also referred to as normally-on). Furthermore, a transistor using such a metal oxide film can have characteristics of an extremely low off-state current.

The use of a metal oxide film with high crystallinity for the semiconductor layer 108 enables damage inhibition during the processing of the semiconductor layer 108 and the formation of the insulating layer 110; thus, a highly reliable transistor can be obtained. Meanwhile, the use of a metal oxide film with relatively low crystallinity for the semiconductor layer 108 improves electric conductivity; thus, a transistor with high field-effect mobility can be obtained.

A metal oxide film having a CAAC (c-axis aligned crystal) structure described later, a metal oxide film having an nc (nano crystal) structure, or a metal oxide film in which a CAAC structure and an nc structure are mixed is preferably used as the semiconductor layer 108.

In addition, the semiconductor layer 108 may have a stacked-layer structure of two or more layers.

For example, the semiconductor layer 108 in which two or more metal oxide films with different compositions are stacked can be used. For instance, in the case of using an In-M-Zn oxide, it is preferable to use a stack of two or more films each formed using a sputtering target with an atomic ratio of In:M:Zn=5:1:6, In:M:Zn=4:2:3, In:M:Zn=1:1:1, In:M:Zn=2:2:1, In:M:Zn=1:3:4, or In:M:Zn=1:3:2 or in the neighborhood thereof.

Alternatively, the semiconductor layer 108 in which two or more metal oxide films with different crystallinities are stacked can be used. In that case, the metal oxide films are preferably successively formed without exposure to the air using the same oxide target under different deposition conditions.

In that case, a stacked-layer structure of a metal oxide film having an nc structure and a metal oxide film having a CAAC structure can be used for the semiconductor layer 108. Alternatively, a stacked-layer structure of a metal oxide film having an nc structure and a metal oxide film having an nc structure may be used. Note that for a function or a material composition of a metal oxide that can be suitably used for a semiconductor layer 108a and a semiconductor layer 108b, reference can be made to the description of a CAC (Cloud-Aligned Composite) described later.

The oxygen flow rate ratio at the time of depositing an earlier-formed first metal oxide film is set lower than that at the time of depositing a subsequently formed second metal oxide film, for example. Alternatively, a condition without oxygen flowing is employed at the time of depositing the first metal oxide film. In such a manner, oxygen can be effectively supplied at the time of depositing the second metal oxide film. In addition, the first metal oxide film can have lower crystallinity and higher electrical conductivity than the second metal oxide film. Meanwhile, when the second metal oxide film provided in an upper portion has higher crystallinity than the first metal oxide film, damage caused at the time of processing the semiconductor layer 108 or depositing the insulating layer 110 can be inhibited.

More specifically, the oxygen flow rate ratio at the time of depositing the first metal oxide film is higher than or equal to 0% and lower than 50%, preferably higher than or equal to 0% and lower than or equal to 30%, further preferably higher than or equal to 0% and lower than or equal to 20%, typically 10%. In addition, the oxygen flow rate ratio at the time of depositing the second metal oxide film is higher than or equal to 50% and lower than or equal to 100%, preferably higher than or equal to 60% and lower than or equal to 100%, further preferably higher than or equal to 80% and lower than or equal to 100%, still further preferably higher than or equal to 90% and lower than or equal to 100%, typically 100%. Furthermore, although the conditions at the time of the deposition, such as pressure, temperature, and power may, vary between the first metal oxide film and the second metal oxide film, it is preferable to employ the same conditions except for the oxygen flow rate ratio because the time required for deposition steps can be shortened.

With such a structure, the transistor 100 with excellent electrical characteristics and high reliability can be achieved.

Structure Example 2

A structure example of a transistor whose structure is partly different from that of Structure Example 1 will be described below. Note that description of the same portions as those in Structure Example 1 is omitted below in some cases. Furthermore, in drawings that are referred to later, the same hatching pattern is applied to portions having functions similar to those in Structure Example 1, and the portions are not denoted by reference numerals in some cases.

Figure 2A:
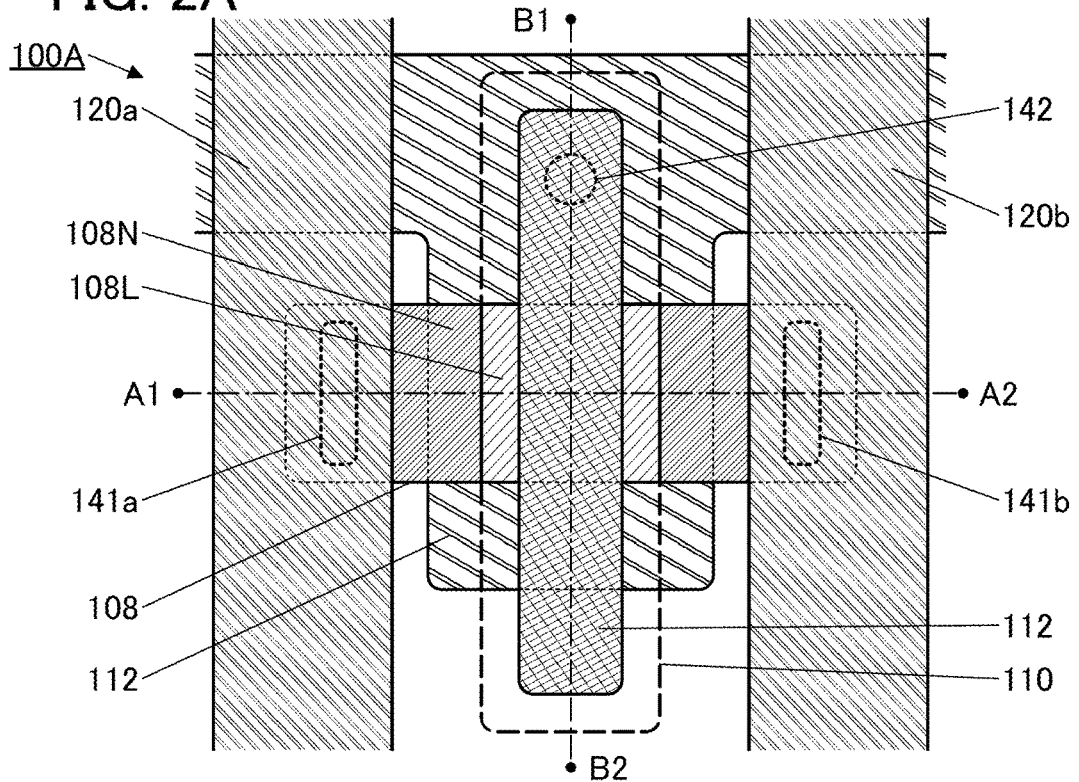
FIGS. 2A to 2C A structure example of a semiconductor device.
Figure 2B:
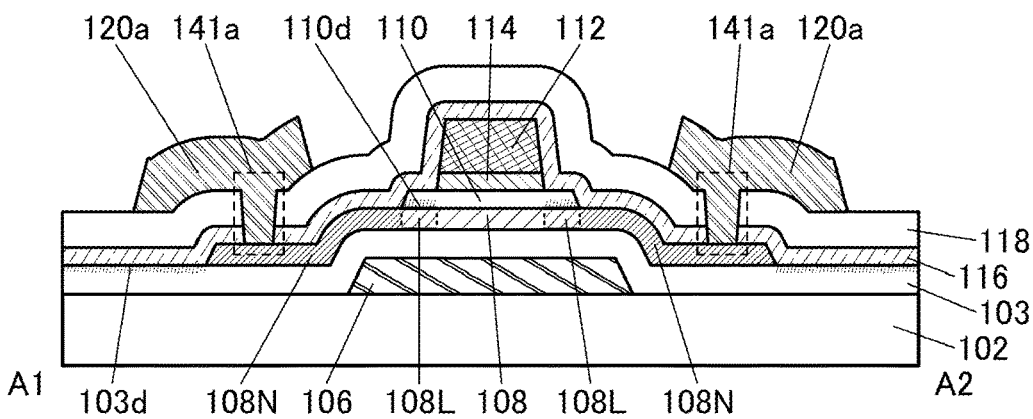
Figure 2C:
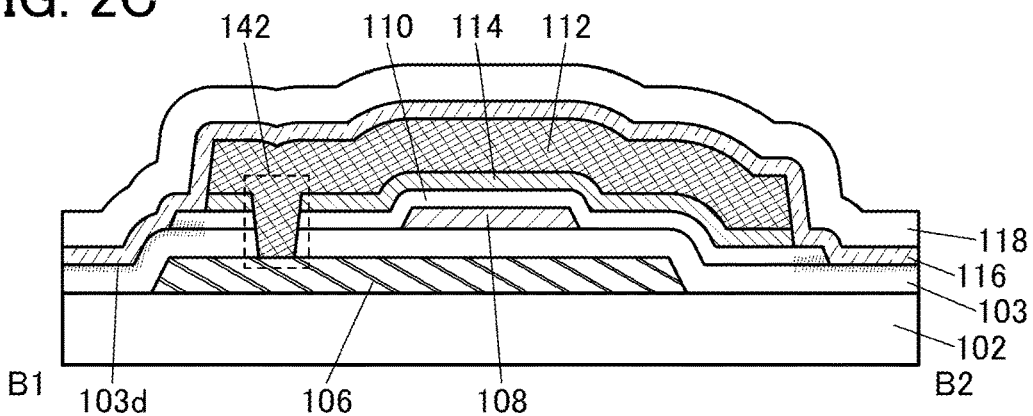

FIG. 2(A) is a top view of a transistor 100A. FIG. 2(B) is a cross-sectional view of the transistor 100A in a channel length direction. FIG. 2(C) is a cross-sectional view of the transistor 100A in a channel width direction.

The transistor 100A is different from Structure Example 1 mainly in including a conductive layer 106 between the substrate 102 and the insulating layer 103. The conductive layer 106 includes a region overlapping with the channel formation region and the region 108L of the semiconductor layer 108 and the conductive layer 112.

In the transistor 100A, the conductive layer 106 has a function of a first gate electrode (also referred to as a bottom gate electrode), and the conductive layer 112 has a function of a second gate electrode (also referred to as a top gate electrode). In addition, part of the insulating layer 103 functions as a first gate insulating layer, and part of the insulating layer 110 functions as a second gate insulating layer.

A portion of the semiconductor layer 108 that overlaps with at least one of the conductive layer 112 and the conductive layer 106 functions as a channel formation region. Note that for easy explanation, a portion of the semiconductor layer 108 that overlaps with the conductive layer 112 will be sometimes referred to as a channel formation region in the following description; however, a channel can also be actually formed in a portion not overlapping with the conductive layer 112 and overlapping with the conductive layer 106 (a portion including the region 108L and the region 108N).

In addition, as illustrated in FIGS. 2(A) and 2(C), the conductive layer 106 may be electrically connected to the conductive layer 112 through an opening portion 142 provided in the metal oxide layer 114, the insulating layer 110, and the insulating layer 103. In that case, the same potential can be supplied to the conductive layer 106 and the conductive layer 112.

For the conductive layer 106, a material similar to that for the conductive layer 112, the conductive layer 120a, or the conductive layer 120b can be used. In particular, a material containing copper is preferably used for the conductive layer 106 because wiring resistance can be reduced. When a material containing a high-melting-point metal, such as tungsten or molybdenum, is used for the conductive layer 106, treatment in a later step can be performed at high temperatures.

In addition, as illustrated in FIGS. 2(A) and 2(C), the conductive layer 112 and the conductive layer 106 preferably extend beyond an end portion of the semiconductor layer 108 in the channel width direction. In that case, as illustrated in FIG. 2(C), a structure is employed in which the semiconductor layer 108 in the channel width direction is entirely covered with the conductive layer 112 and the conductive layer 106 with the insulating layer 110 and the insulating layer 103 therebetween.

With such a structure, the semiconductor layer 108 can be electrically surrounded by electric fields generated by a pair of gate electrodes. At this time, it is particularly preferable that the same potential be applied to the conductive layer 106 and the conductive layer 112. In that case, electric fields for inducing a channel can be effectively applied to the semiconductor layer 108, so that the on-state current of the transistor 100A can be increased. Thus, the transistor 100A can also be miniaturized.

Note that a structure in which the conductive layer 112 and the conductive layer 106 are not connected to each other may be employed. In that case, a constant potential may be applied to one of the pair of gate electrodes, and a signal for driving the transistor 100A may be applied to the other of the pair of gate electrodes. In this case, the potential applied to one of the electrodes can control the threshold voltage at the time of driving the transistor 100A with the other electrode.

The above is the description of Structure Example 2.

Manufacturing Method Example

A manufacturing method of the semiconductor device of one embodiment of the present invention will be described below with reference to drawings. Here, description will be made giving, as an example, the transistor 100A illustrated in the above structure example.

Note that thin films that constitute the semiconductor device (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method. In addition, as an example of the thermal CVD method, a metal organic chemical vapor deposition (MOCVD: Metal Organic CVD) method can be given.

Alternatively, the thin films (the insulating films, the semiconductor films, the conductive films, and the like) that constitute the semiconductor device can be formed by a method such as spin coating, dipping, spray coating, ink-jetting, dispensing, screen printing, offset printing, a doctor knife method, slit coating, roll coating, curtain coating, or knife coating.

In addition, when the thin films that constitute the semiconductor device are processed, a photolithography method or the like can be used for the processing. Alternatively, the thin films may be processed by a nanoimprinting method, a sandblasting method, a lift-off method, or the like. Alternatively, island-shaped thin films may be directly formed by a deposition method using a blocking mask such as a metal mask.

There are the following two typical ways of a photolithography method. One is a method in which a resist mask is formed over a thin film that is to be processed, the thin film is processed by etching or the like, and the resist mask is removed. The other is a method in which, after a photosensitive thin film is deposited, exposure and development are performed to process the thin film into a desired shape.

As light for exposure in a photolithography method, for example, an i-line (with a wavelength of 365 nm), a g-line (with a wavelength of 436 nm), an h-line (with a wavelength of 405 nm), or light in which the i-line, the g-line, and the h-line are mixed can be used. Alternatively, ultraviolet light, KrF laser light, ArF laser light, or the like can be used. In addition, exposure may be performed by liquid immersion exposure technique. Furthermore, as the light for the exposure, extreme ultra-violet (EUV: Extreme Ultra-violet) light or X-rays may be used. Moreover, instead of the light for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is unnecessary.

For etching of the thin films, a dry etching method, a wet etching method, a sandblasting method, or the like can be used.

In each of drawings of FIG. 3 to FIG. 6, cross sections of the transistor 100A in the channel length direction and in the channel width direction in each step in the manufacturing process are illustrated together.

<Formation of Conductive Layer 106>

A conductive film is deposited over the substrate 102 and processed by etching to form the conductive layer 106 functioning as the first gate electrode.

<Formation of Insulating Layer 103>

Figure 3A:
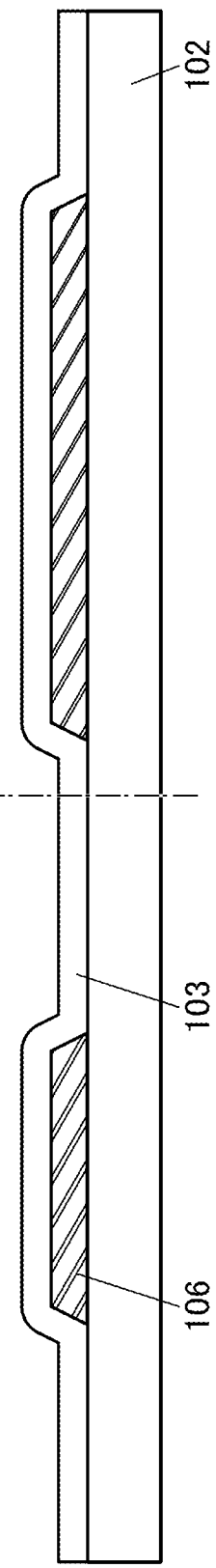
FIGS. 3A to 3C Diagrams illustrating a method for manufacturing a semiconductor device.

Then, the insulating layer 103 is formed to cover the substrate 102 and the conductive layer 106 (FIG. 3(A)). The insulating layer 103 can be formed by a PECVD method, an ALD method, a sputtering method, or the like.

After the insulating layer 103 is formed, treatment for supplying oxygen to the insulating layer 103 may be performed. For example, plasma treatment, heat treatment, or the like in an oxygen atmosphere can be performed. Alternatively, oxygen may be supplied to the insulating layer 103 by a plasma ion doping method, an ion implantation method, or the like.

<Formation of Semiconductor Layer 108>

Figure 3B:
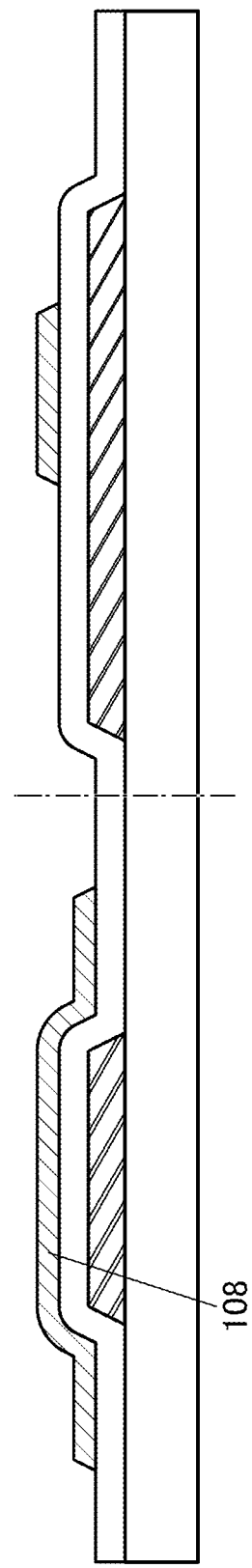

Next, a metal oxide film is deposited over the insulating layer 103 and processed to form the island-shaped semiconductor layer 108 (FIG. 3(B)).

The metal oxide film is preferably formed by a sputtering method using a metal oxide target.

In addition, an oxygen gas and an inert gas (such as a helium gas, an argon gas, or a xenon gas) may be mixed in depositing the metal oxide film. Note that when the proportion of the oxygen gas in the whole deposition gas (hereinafter also referred to as an oxygen flow rate ratio) at the time of depositing the metal oxide film is higher, the crystallinity of the metal oxide film can be higher and a transistor with high reliability can be achieved. By contrast, when the oxygen flow rate ratio is lower, the crystallinity of the metal oxide film is lower and a transistor with a high on-state current can be obtained.

In the case of using a stacked-layer structure for the semiconductor layer 108, it is preferable that successive deposition be performed in the same deposition chamber using the same sputtering target because the interface can be a favorable one. Although the deposition conditions, such as pressure, temperature, and power at the time of the deposition may be different between the metal oxide films, it is particularly preferable to employ the same conditions except for the oxygen flow rate ratio because the time required for deposition steps can be shortened. In the case where metal oxide films having different compositions are stacked, it is preferable to perform successive deposition without exposure to the air.

The deposition conditions of the metal oxide film are preferably set such that a metal oxide film having a CAAC structure, a metal oxide film having an nc structure, or a metal oxide film in which a CAAC structure and an nc structure are mixed is obtained. Note that the deposition conditions for the metal oxide film formed to have a CAAC structure and the deposition conditions for the metal oxide film formed to have an nc structure each vary depending on the composition of a sputtering target to be used; thus, pressure, power, and the like, in addition to a substrate temperature and an oxygen flow rate ratio, are set as appropriate depending on the composition.

In addition, as the deposition conditions of the metal oxide film, the substrate temperature is set higher than or equal to room temperature and lower than or equal to 450° C., and the substrate temperature is preferably set higher than or equal to room temperature and lower than or equal to 300° C., further preferably higher than or equal to room temperature and lower than or equal to 200° C., and still further preferably higher than or equal to room temperature and lower than or equal to 140° C. The substrate temperature is preferably set higher than or equal to room temperature and lower than 140° C. in the case where a large-sized glass substrate or a resin substrate is used as the substrate 102, for example, because high productivity is achieved. Furthermore, when the metal oxide film is deposited with the substrate temperature set at room temperature or without intentional heating, the crystallinity can be made low.

In addition, it is preferable to perform treatment for desorbing water, hydrogen, an organic substance, or the like adsorbed onto a surface of the insulating layer 103 or treatment for supplying oxygen into the insulating layer 103 before deposition of the metal oxide film. For example, heat treatment can be performed at a temperature higher than or equal to 70° C. and lower than or equal to 200° C. in a reduced-pressure atmosphere. Alternatively, plasma treatment may be performed in an oxygen-containing atmosphere. In addition, when plasma treatment is performed in an atmosphere containing a nitric oxide gas, an organic substance on the surface of the insulating layer 103 can be suitably removed. After such treatment, the metal oxide film is preferably deposited successively without exposure of the surface of the insulating layer 103 to the air.

For processing of the metal oxide film, either one or both a wet etching method and a dry etching method is used. At this time, part of the insulating layer 103 that does not overlap with the semiconductor layer 108 is etched and thinned in some cases.

In addition, after the metal oxide film is deposited or processed into the semiconductor layer 108, heat treatment may be performed to remove hydrogen or water in the metal oxide film or the semiconductor layer 108. The temperature of the heat treatment can be typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an atmosphere containing a rare gas or nitrogen. Alternatively, heating may be performed in the atmosphere, and then heating may be performed in an oxygen-containing atmosphere. Note that it is preferable that the atmosphere of the heat treatment not contain hydrogen, water, or the like. An electric furnace, an RTA apparatus, or the like can be used for the heat treatment. The use of an RTA apparatus can shorten the heat treatment time.

<Formation of Insulating Film 110f and Metal Oxide Film 114f>

Next, an insulating film 110f and a metal oxide film 114f are formed so as to cover the insulating layer 103 and the semiconductor layer 108.

The insulating film 110f is a film that is to be the insulating layer 110 later. As the insulating film 110f, for example, an oxide film such as a silicon oxide film or a silicon oxynitride film is preferably formed using a plasma-enhanced chemical vapor deposition apparatus (a PECVD apparatus or simply referred to as a plasma CVD apparatus). Alternatively, a PECVD method using a microwave may be employed.

The metal oxide film 114f is a film that is to be the metal oxide layer 114 later. The metal oxide film 114f is preferably formed by a sputtering method in an oxygen-containing atmosphere, for example. In that case, oxygen can be supplied to the insulating film 110f at the time of deposition of the metal oxide film 114f.

In the case where the metal oxide film 114f is formed by a sputtering method using an oxide target containing a metal oxide similar to that in the case of the semiconductor layer 108, the above method can be referred to.

The metal oxide film 114f may be formed by a reactive sputtering method with a metal target using oxygen as a deposition gas. When aluminum is used for the metal target, an aluminum oxide film can be deposited.

At the time of depositing the metal oxide film 114f, the amount of oxygen supplied into the insulating film 110f can be increased with a higher proportion of the oxygen flow rate to the total flow rate of the deposition gas introduced into a deposition chamber of a deposition apparatus (a higher oxygen flow rate ratio) or with higher oxygen partial pressure in the deposition chamber. The oxygen flow rate ratio or the oxygen partial pressure is, for example, higher than or equal to 50% and lower than or equal to 100%, preferably higher than or equal to 65% and lower than or equal to 100%, further preferably higher than or equal to 80% and lower than or equal to 100%, and still further preferably higher than or equal to 90% and lower than or equal to 100%. It is particularly preferable that the oxygen flow rate ratio be 100% and the oxygen partial pressure be as close to 100% as possible.

When the metal oxide film 114$f$ is formed by a sputtering method in an oxygen-containing atmosphere in this manner, oxygen can be supplied to the insulating film 110$f$ and release of oxygen from the insulating film 110$f$ can be prevented during the deposition of the metal oxide film 114$f$. As a result, an extremely large amount of oxygen can be enclosed in the insulating film 110$f$. Moreover, a large amount of oxygen can be supplied to the channel formation region of the semiconductor layer 108 by heat treatment performed later, leading to a reduction in oxygen vacancies in the channel formation region; thus, a highly reliable transistor can be achieved.

In addition, oxygen may be supplied from the insulating film 110$f$ to the semiconductor layer 108 by heat treatment performed after the formation of the metal oxide film 114$f$. The heat treatment can be performed at a temperature higher than or equal to 200° C. and lower than or equal to 400° C. in an atmosphere containing one or more of nitrogen, oxygen, and a rare gas.

Then, the metal oxide film 114$f$, the insulating film 110$f$, and the insulating layer 103 are partly etched to form an opening reaching the conductive layer 106. Accordingly, the conductive layer 112 to be formed later can be electrically connected to the conductive layer 106 through the opening.

<Formation of Conductive Film 112$f$>

Figure 3C:
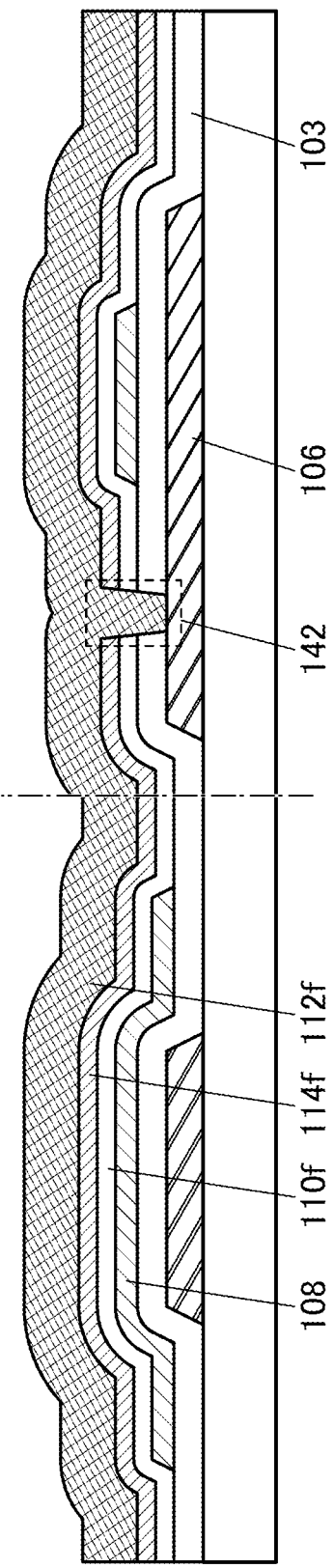

Next, a conductive film 112$f$ to be the conductive layer 112 is deposited over the metal oxide film 114$f$ (FIG. 3(C)). The conductive film 112$f$ is preferably deposited by a sputtering method using a sputtering target of a metal or an alloy.

<Formation of Insulating Layer 110, Metal Oxide Layer 114, and Conductive Layer 112>

Then, a resist mask 115 is formed over the conductive film 112$f$. After that, the conductive film 112$f$, the metal oxide film 114$f$, and the insulating film 110$f$ in a region not covered with the resist mask 115 are etched by an anisotropic etching method (FIG. 4(A)).

The etching of the conductive film 112$f$, the metal oxide film 114$f$, and the insulating film 110$f$ may be performed at the same time under the same etching conditions, or may be performed at least twice using different etching conditions or methods. For example, when the conductive film 112$f$ and the metal oxide film 114$f$ are etched first and then the insulating film 110$f$ is etched under different etching conditions, etching damage to the semiconductor layer 108 can be reduced.

Here, the resist mask 115 is preferably formed over a region to be the insulating layer 110.

Next, side surfaces of the conductive film 112$f$ and the metal oxide film 114$f$ are etched using an isotropic etching method so that end faces recede (also referred to as side etching). Consequently, the conductive layer 112 and the metal oxide layer 114 whose end portions are located inward from the end portion of the insulating layer 110 in a plan view can be formed (FIG. 4(B)).

Here, it is preferable to select conditions or a method with which the semiconductor layer 108 and the insulating layer 103 are etched as little as possible for the etching of the conductive film 112$f$ and the metal oxide film 114$f$. Although the side etching of the conductive film 112$f$ and the metal oxide film 114$f$ may be performed in a state where the resist mask 115 is removed, it is preferable to make the resist mask 115 remain because only the side surface of the conductive layer 112 can be etched without reducing the thickness.

Note that although a method is described here in which side etching is performed on the metal oxide film 114$f$ as well as the conductive film 112$f$, only the conductive film 112$f$ may be side-etched. In that case, the metal oxide layer 114 includes a region not overlapping with the conductive layer 112, like the insulating layer 110.

After the conductive layer 112 and the metal oxide layer 114 are formed, the resist mask 115 is removed.

<Treatment for Supplying Impurity Element (Formation of Region 108L)>

Next, treatment for supplying (also referred to as "adding" or "implanting") an impurity element 140 to the insulating layer 110 and the semiconductor layer 108 is performed using the conductive layer 112 as a mask to form the region 108L, the region 110$d$, and the region 103$d$ (FIG. 5(A)). At this time, in the semiconductor layer 108 and the insulating layer 110, the regions overlapping with the conductive layer 112 are not supplied with the impurity element 140 owing to the conductive layer 112 serving as the mask.

A plasma ion doping method or an ion implantation method can be suitably used for the supply of the impurity element 140. In these methods, a concentration profile in a depth direction can be controlled with high accuracy by the acceleration voltage and dosage of ions, or the like. The use of a plasma ion doping method can increase productivity. In addition, the use of an ion implantation method with mass separation can increase the purity of an impurity element to be supplied.

In the treatment for supplying the impurity element 140, treatment conditions are preferably controlled such that the concentration is the highest at an interface between the semiconductor layer 108 and the insulating layer 110, a portion in the semiconductor layer 108 near the interface, or a portion in the insulating layer 110 near the interface. Accordingly, the impurity element 140 at an optimal concentration can be supplied to both the semiconductor layer 108 and the insulating layer 110 in one treatment.

Examples of the impurity element 140 include hydrogen, boron, carbon, nitrogen, fluorine, phosphorus, sulfur, arsenic, aluminum, magnesium, silicon, and a rare gas. Note that typical examples of a rare gas include helium, neon, argon, krypton, and xenon. It is particularly preferable to use boron, phosphorus, aluminum, magnesium, or silicon.

As a source gas of the impurity element 140, a gas containing the impurity element can be used. In the case where boron is supplied, typically, a $B_2H_6$ gas, a $BF_3$ gas, or the like can be used. In addition, in the case where phosphorus is supplied, typically, a $PH_3$ gas can be used. Alternatively, a mixed gas in which these source gases are diluted with a rare gas may be used.

Alternatively, $CH_4$, $N_2$, $NH_3$, $AlH_3$, $AlCl_3$, $SiH_4$, $Si_2H_6$, $F_2$, HF, $H_2$, $(C_5H_5)_2Mg$, a rare gas, or the like can be used as the source gas. In addition, an ion source is not limited to a gas, and a solid or a liquid that is vaporized by heating may be used.

Addition of the impurity element 140 can be controlled by setting the conditions such as the acceleration voltage and the dosage in consideration of the compositions, densities, thicknesses, and the like of the insulating layer 110 and the semiconductor layer 108.

For example, in the case where boron is added by an ion implantation method or a plasma ion doping method, the acceleration voltage can be, for example, within the range from 5 kV to 100 kV, preferably from 7 kV to 70 k, and further preferably from 10 kV to 50 kV. In addition, the dosage can be, for example, within the range from $1\times10^{13}$ ions/cm$^2$ to $1\times10^{17}$ ions/cm$^2$, preferably from $1\times10^{14}$ ions/cm$^2$ to $5\times10^{16}$ ions/cm$^2$, and further preferably from $1\times10^{15}$ ions/cm$^2$ to $3\times10^{16}$ ions/cm$^2$.

In addition, in the case where phosphorus is added by an ion implantation method or a plasma ion doping method, the acceleration voltage can be, for example, within the range from 10 kV to 100 kV, preferably from 30 kV to 90 kV, and further preferably from 40 kV to 80 kV. Furthermore, the dosage can be, for example, within the range from $1\times10^{13}$ ions/cm$^2$ to $1\times10^{17}$ ions/cm$^2$, preferably from $1\times10^{14}$ ions/cm$^2$ to $5\times10^{16}$ ions/cm$^2$, and further preferably from $1\times10^{15}$ ions/cm$^2$ to $3\times10^{16}$ ions/cm$^2$.

Note that a method for supplying the impurity element 140 is not limited thereto; plasma treatment, treatment using thermal diffusion by heating, or the like may be used, for example. In plasma treatment, plasma is generated in a gas atmosphere containing an impurity element to be added and plasma treatment is performed, so that the impurity element can be added. A dry etching apparatus, an ashing apparatus, a plasma CVD apparatus, a high-density plasma CVD apparatus, or the like can be used as an apparatus for generating the plasma.

Here, the impurity element 140 is added to a region not covered with the insulating layer 110 (a region which is to be the region 108N later) at the same time when the impurity element 140 is added to the region 108L through the insulating layer 110. The concentration of the impurity element 140 might be higher in this region than in the region 108L. Furthermore, the concentration gradient profile of the impurity element 140 in the depth direction might be different from that of the region 108L.

<Formation of Insulating Layer 116 and Region 108N>

Subsequently, treatment for supplying hydrogen into an exposed region of the semiconductor layer 108 is performed. Here, the insulating layer 116 containing hydrogen is deposited in contact with the exposed region of the semiconductor layer 108 to supply hydrogen (FIG. 5(B)).

The insulating layer 116 is preferably formed by a plasma CVD method using a deposition gas containing hydrogen. For example, a silicon nitride film is deposited using a deposition gas containing a silane gas and an ammonia gas. The use of an ammonia gas in addition to a silane gas enables the film to contain a large amount of hydrogen. Furthermore, hydrogen can be supplied to the exposed portion of the semiconductor layer 108 also at the time of deposition.

It is preferable to perform heat treatment after the deposition of the insulating layer 116 so that part of hydrogen released from the insulating layer 116 is supplied to part of the semiconductor layer 108. It is preferable that the heat treatment be performed at a temperature higher than or equal to 150° C. and lower than or equal to 450° C., preferably higher than or equal to 200° C. and lower than or equal to 400° C., in an atmosphere containing one or more of nitrogen, oxygen, and a rare gas.

Hydrogen is supplied in such a manner, whereby the region 108N having extremely low resistance can be formed in the semiconductor layer 108. The region 108N can also be referred to as a region having higher carrier concentration, a region having a larger amount of oxygen vacancies, a region having higher hydrogen concentration, or a region having higher impurity concentration than the region 108L.

Alternatively, the insulating layer 116 and the region 108N may be formed by the following method.

First, the insulating layer 116 is formed in contact with the exposed region of the semiconductor layer 108.

For the insulating layer 116, a film containing at least one of metal elements such as aluminum, titanium, tantalum, tungsten, chromium, and ruthenium is deposited. It is particularly preferable to contain at least one of aluminum, titanium, tantalum, and tungsten. In particular, a nitride containing at least one of these metal elements or an oxide containing at least one of these metal elements can be suitably used. A nitride film such as an aluminum titanium nitride film, a titanium nitride film, or an aluminum nitride film, or an oxide film such as an aluminum titanium oxide film can be suitably used for the insulating layer 116.

Here, the insulating layer 116 is preferably formed by a sputtering method using a nitrogen gas or an oxygen gas as a deposition gas. Thus, the film quality can be easily controlled by controlling the flow rate of the deposition gas.

Subsequently, heat treatment is performed. By the heat treatment, the resistance of a region of the semiconductor layer 108 that are in contact with the insulating layer 116 is reduced, and the region 108N having low resistance is formed in the semiconductor layer 108.

The heat treatment is preferably performed in an inert gas atmosphere such as nitrogen or a rare gas. The temperature of the heat treatment is preferably as high as possible and can be set in consideration of the heat resistance of the substrate 102, the conductive layer 106, the conductive layer 112, and the like. The temperature can be set higher than or equal to 120° C. and lower than or equal to 500° C., preferably higher than or equal to 150° C. and lower than or equal to 450° C., further preferably higher than or equal to 200° C. and lower than or equal to 400° C., and still further preferably higher than or equal to 250° C. and lower than or equal to 400° C., for example. When the temperature of the heat treatment is approximately 350° C., for example, the semiconductor device can be manufactured at a high yield with production facilities using a large-size glass substrate.

Note that since the insulating layer 116 is not removed here, the heat treatment can be performed at any step after the formation of the insulating layer 116. The heat treatment may double as another heat treatment or a heating step.

By the heat treatment, oxygen in the semiconductor layer 108 is extracted to the insulating layer 116; thus, an oxygen vacancy is generated. When the oxygen vacancy is bonded to hydrogen in the semiconductor layer 108, the carrier concentration is increased, and the resistance of the region 108N in contact with the insulating layer 116 is reduced.

Alternatively, the metal element contained in the insulating layer 116 may diffused into the semiconductor layer 108 by the heat treatment, whereby the semiconductor layer 108 is partly alloyed and reduced in resistance in some cases.

Alternatively, nitrogen and hydrogen contained in the insulating layer 116 or nitrogen or the like contained in the atmosphere for the heat treatment may be diffused into the semiconductor layer 108 by the heat treatment, whereby the resistance of the region 108N in contact with the insulating layer 116 is reduced in some cases.

The region 108N of the semiconductor layer 108, whose resistance has been reduced because of the above complex action, becomes a highly stable low-resistance region. The region 108N formed in such a manner is characterized in that the resistance is not easily increased even if treatment for supplying oxygen is performed in a later step, for example.

Note that although an example is described here in which the insulating layer 116 having an insulating property is used as a layer used for forming the region 108N, the region 108N may be formed by forming a film having conductivity in contact with a region to be the region 108N. In that case, it is preferable that the film having conductivity be insulated by oxidization or nitridation after the formation of the region 108N to obtain the insulating layer 116. Alternatively, the film may be removed after the formation of the region 108N so that a structure in which the insulating layer 116 is not provided is obtained.

In the above manner, the region 108N can be formed.

When the above-described heat treatment is performed, the region 108L and the region 108N can be in a low-resistance state more stably. For example, by the heat treatment at the above temperature, the impurity element 140 is diffused moderately and the concentration is homogenized locally, so that the region 108L, the region 108N, and the region 110d each having an ideal concentration gradient of the impurity element can be formed. Note that when the temperature of the heat treatment is too high (e.g., higher than or equal to 500° C.), the impurity element 140 is also diffused from the region 108L into the channel formation region, so that the electrical characteristics or reliability of the transistor might be degraded.

In addition, when the impurity element 140 is supplied to the region 108L and the region 108N, defects generated in the semiconductor layer 108 and the insulating layer 110 can be repaired by the heat treatment in some cases.

Furthermore, oxygen can be supplied from the insulating layer 110 to the channel formation region of the semiconductor layer 108 by the heat treatment. In that case, the region 110d supplied with the impurity element 140 is formed in a protruding portion of the insulating layer 110 in the vicinity of an interface between the insulating layer 110 and the region 108L; thus, oxygen released from the insulating layer 110 is inhibited from being diffused into the region 108L. As a result, the resistance of the region 108L can be effectively prevented from being increased. Moreover, in this case, the region 110d is not formed in a region of the insulating layer 110 that overlaps with the channel formation region of the semiconductor layer 108; thus, oxygen released from the insulating layer 110 can be selectively supplied to the channel formation region.

<Formation of Insulating Layer 118>

Next, the insulating layer 118 is formed over the insulating layer 116 (FIG. 6(A)).

In the case where the insulating layer 118 is formed by a plasma CVD method at a too high deposition temperature, impurities contained in the region 108N, the region 108L, and the like might be diffused into a peripheral portion including the channel formation region of the semiconductor layer 108, depending on the impurities. As a result, the resistance of the channel formation region might be reduced or the electrical resistance of the region 108N or the region 108L might be increased. The deposition temperature of the insulating layer 116 or the insulating layer 118 is preferably higher than or equal to 150° C. and lower than or equal to 400° C., further preferably higher than or equal to 180° C. and lower than or equal to 360° C., and still further preferably higher than or equal to 200° C. and lower than or equal to 250° C., for example. Deposition of the insulating layer 118 at low temperatures enables the transistor to have favorable electrical characteristics even when the transistor has a short channel length.

Furthermore, heat treatment may be performed after the formation of the insulating layer 118.

<Formation of Opening Portion 141a and Opening Portion 141b>

Next, a mask is formed by lithography in a desired position on the insulating layer 118, and then the insulating layer 118 and the insulating layer 116 are partly etched to form an opening portion 141a and an opening portion 141b reaching the regions 108N.

<Formation of Conductive Layer 120a and Conductive Layer 120b>

Next, a conductive film is deposited over the insulating layer 118 to cover the opening portion 141a and the opening portion 141b, and the conductive film is processed into a desired shape, so that the conductive layer 120a and the conductive layer 120b are formed (FIG. 6(B)).

Through the above process, the transistor 100A can be manufactured.

Modification Example of Manufacturing Method Example

A manufacturing method example that is partly different from the above manufacturing method example will be described below. Note that description of the portions overlapping with the above is omitted and different portions will be described.

Modification Example 1

First, the conductive layer 106, the insulating layer 103, and the semiconductor layer 108 are formed in a manner similar to the above. Next, the insulating film 110f, the metal oxide film 114f, and the conductive film 112f are formed, and the resist mask 115 is formed over the conductive film 112f.

Figure 7A:
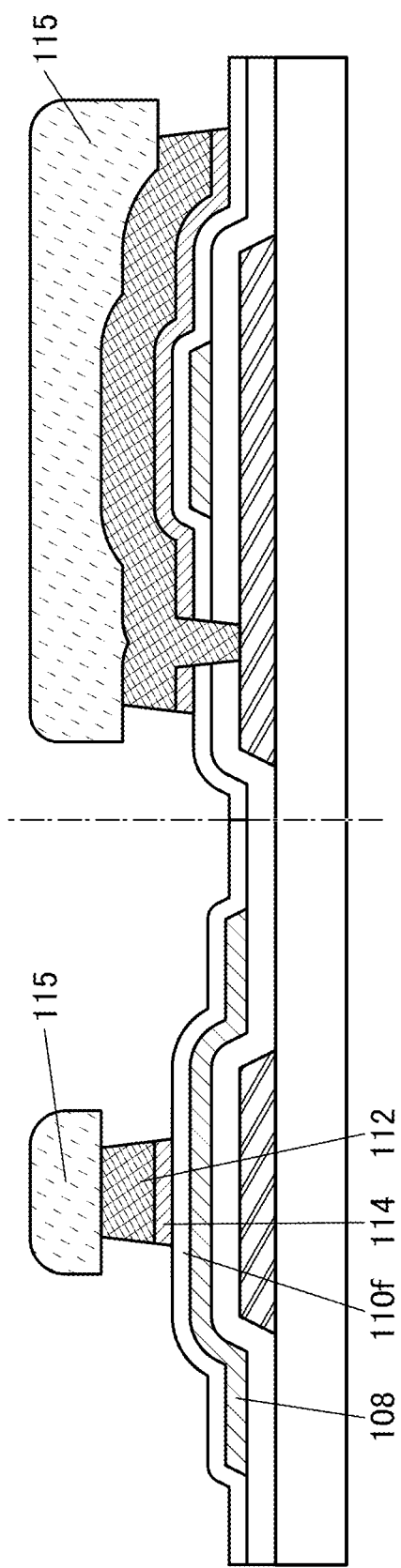
FIGS. 7A and 7B Diagrams illustrating a method for manufacturing a semiconductor device.

Then, the metal oxide film 114f and the conductive film 112f are etched to form the metal oxide layer 114 and the conductive layer 112 (FIG. 7(A)).

At this time, the metal oxide layer 114 and the conductive layer 112 are processed such that the end portions are located inward from the outline of the resist mask 115. To form the metal oxide layer 114 and the conductive layer 112, for example, the metal oxide film 114f and the conductive film 112f are etched by anisotropic etching first and then side etching is performed by isotropic etching.

Figure 7B:
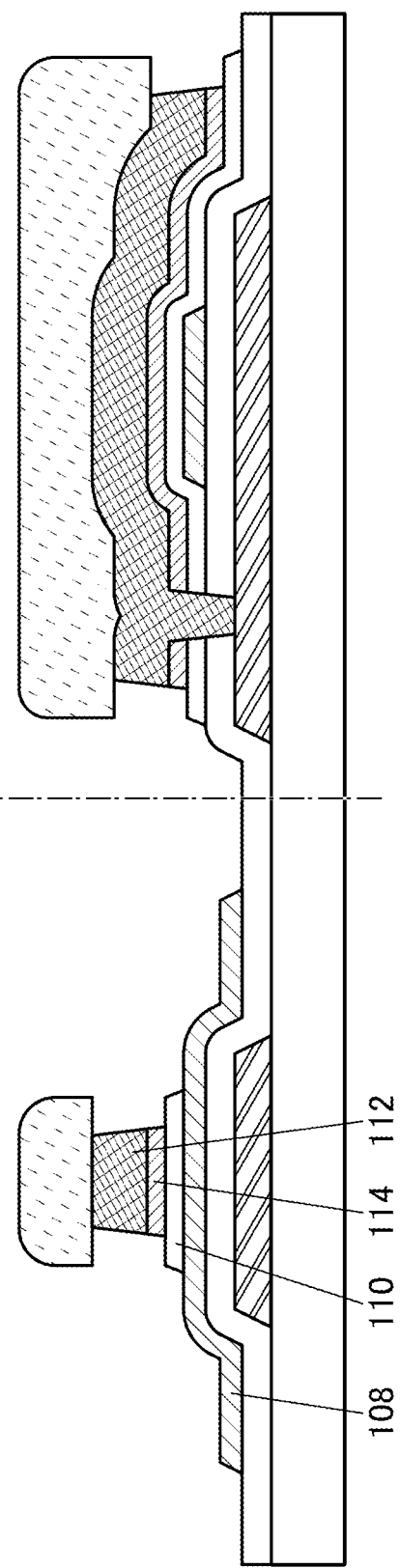

Next, the insulating film 110f is etched by anisotropic etching using the resist mask 115 to form the insulating layer 110 (FIG. 7(B)). Accordingly, the insulating layer 110 including a portion projected beyond the conductive layer 112 can be formed. After that, the resist mask 115 is removed.

Since the semiconductor layer 108 is not exposed at the time of the etching of the metal oxide film 114f and the conductive film 112f in such a method, dispersal and attachment of their components on the surface of the semiconductor layer 108 can be prevented. As a result, a highly reliable transistor can be obtained.

Note that the above description can be referred to for the subsequent steps.

Modification Example 2

First, the conductive layer 106, the insulating layer 103, and the semiconductor layer 108 are formed in a manner similar to the above. Next, the insulating film 110f, the metal oxide film 114f, and the conductive film 112f are formed. After that, a resist mask is formed over the conductive film 112f and the conductive film 112f and the metal oxide film 114f are etched, so that the metal oxide layer 114 and the conductive layer 112 are formed. The resist mask that is used at this time may have the same pattern as the resist mask 115; a pattern that covers a region to be the conductive layer 112 is preferably used. Note that in the case of using the same pattern as that of the resist mask 115, the metal oxide film 114f and the conductive film 112f are side-etched as in Modification example 1. After that, the resist mask is removed.

Next, the impurity element 140 is added to the insulating film 110f and the semiconductor layer 108 using the conductive layer 112 as a mask (FIG. 8(A)). Accordingly, the region 108L to which the impurity element is added can be formed in a portion of the semiconductor layer 108 which does not overlap with the conductive layer 112. At the same time, the region 110d to which the impurity element is added is formed in the insulating film 110f, and the region 103d to which the impurity element is added is formed in the insulating layer 103.

Then, the resist mask 115 is formed to cover the top surfaces and side surfaces of the conductive layer 112 and the metal oxide layer 114. The resist mask 115 has a pattern that covers a region to be the insulating layer 110. After that, the insulating film 110f is etched to form the insulating layer 110 including a portion projected beyond the conductive layer 112, and at the same time, part of the semiconductor layer 108 (a portion to be the region 108N) is exposed (FIG. 8(B)).

Note that hydrogen may be added to the exposed part of the semiconductor layer 108 at this stage. For example, hydrogen may be added by a method such as an ion doping method or an ion implantation method using the resist mask 115 as a mask. Alternatively, heat treatment may be performed in an atmosphere containing hydrogen. In the case of performing heat treatment, the quality of the resist mask 115 might be changed; thus, the heat treatment is preferably performed after the resist mask 115 is removed. Heat treatment performed in an atmosphere containing hydrogen in a state where the conductive layer 112 is exposed can expectedly produce a secondary effect of reducing and removing an oxide on the surface of the conductive layer 112.

Subsequently, the insulating layer 116 is formed in contact with the exposed portion of the semiconductor layer 108 and heat treatment is performed in a manner similar to the above, whereby the region 108N is formed (FIG. 8(C)).

Since a region to be the region 108L and a region to be the region 108N in the semiconductor layer 108 are both in a state of being covered with the insulating film 110f at the time of the addition of the impurity element 140 in such a method, the impurity concentration profiles in the depth direction can be substantially the same, leading to the improvement in controllability. Furthermore, since the conductive layer 112 and the metal oxide layer 114 are covered with the resist mask 115 and not exposed at the time of the etching of the insulating film 110f, some components of the conductive layer 112 and the metal oxide layer 114 can be prevented from being attached to the surface of the semiconductor layer 108.

Note that the above description can be referred to for the subsequent steps.

The above is the description of the modification example of the manufacturing method example.

[Components of Semiconductor Device]

Next, components of the semiconductor device in this embodiment will be described in detail.

<Substrate>

Although there is no particular limitation on a material and the like of the substrate 102, it is necessary that the substrate have heat resistance high enough to withstand at least heat treatment performed later. For example, a single crystal semiconductor substrate or a polycrystalline semiconductor substrate including silicon or silicon carbide as a material, a compound semiconductor substrate of silicon germanium or the like, an SOI substrate, a glass substrate, a ceramic substrate, a quartz substrate, a sapphire substrate, or the like may be used as the substrate 102. Alternatively, these substrates provided with semiconductor elements may be used as the substrate 102.

Alternatively, a flexible substrate may be used as the substrate 102, and the transistor 100 or the like may be formed directly on the flexible substrate. Alternatively, a separation layer may be provided between the substrate 102 and the transistor 100 or the like. The separation layer can be used in separating a semiconductor device from the substrate 102 after partly or wholly completing the semiconductor device over the separation layer, and in transferring the separated semiconductor device to another substrate. In such a case, the transistor 100 or the like can be transferred onto a substrate having low heat resistance or a flexible substrate as well.

<Insulating Layer 103>

The insulating layer 103 can be formed by a sputtering method, a CVD method, an evaporation method, a pulsed laser deposition (PLD) method, or the like as appropriate. In addition, for example, the insulating layer 103 can be formed to have a single layer or stacked layer of an oxide insulating film or a nitride insulating film. Note that to improve the properties of the interface with the semiconductor layer 108, at least a region in the insulating layer 103 that is in contact with the semiconductor layer 108 is preferably formed using an oxide insulating film. Furthermore, a film from which oxygen is released by heating is preferably used for the insulating layer 103.

For example, the insulating layer 103 can be provided to have a single layer or stacked layers using silicon oxide, silicon oxynitride, silicon nitride oxide, silicon nitride, aluminum oxide, hafnium oxide, gallium oxide, a Ga—Zn oxide, or the like.

In addition, in the case where a film other than an oxide film, such as a silicon nitride film, is used for a side of the insulating layer 103 that is in contact with the semiconductor layer 108, pretreatment such as oxygen plasma treatment is preferably performed on a surface in contact with the semiconductor layer 108 to oxidize the surface or the vicinity of the surface.

<Conductive Film>

The conductive layer 112 and the conductive layer 106 that function as the gate electrodes, the conductive layer 120a that functions as one of the source electrode and the drain electrode, and the conductive layer 120b that functions as the other can each be formed using a metal element selected from chromium, copper, aluminum, gold, silver, zinc, molybdenum, tantalum, titanium, tungsten, manganese, nickel, iron, and cobalt; an alloy containing the metal element as its component; an alloy including a combination of the metal elements; or the like.

An oxide conductor or a metal oxide film such as an In—Sn oxide, an In—W oxide, an In—W—Zn oxide, an In—Ti oxide, an In—Ti—Sn oxide, an In—Zn oxide, an In—Sn—Si oxide, or an In—Ga—Zn oxide can also be applied to each of the conductive layer 112, the conductive layer 106, the conductive layer 120a, and the conductive layer 120b.

Here, an oxide conductor (OC) is described. For example, when oxygen vacancies are formed in a metal oxide having semiconductor characteristics and hydrogen is added to the oxygen vacancies, a donor level is formed in the vicinity of the conduction band. As a result, the conductivity of the metal oxide is increased, so that the metal oxide becomes a conductor. The metal oxide having become a conductor can be referred to as an oxide conductor.

In addition, the conductive layer 112 or the like may have a stacked-layer structure of a conductive film containing the oxide conductor (the metal oxide) and a conductive film containing a metal or an alloy. The use of a conductive film containing a metal or an alloy can reduce wiring resistance. In that case, a conductive film containing an oxide conductor is preferably applied to a conductive film on a side in contact with an insulating layer functioning as a gate insulating film.

Furthermore, among the above metal elements, it is particularly preferable that any one or more metal elements selected from titanium, tungsten, tantalum, and molybdenum be included in the conductive layer 112, the conductive layer 106, the conductive layer 120*a*, and the conductive layer 120*b*. It is particularly preferable to use a tantalum nitride film. The tantalum nitride film has conductivity, has a high barrier property against copper, oxygen, or hydrogen, and releases little hydrogen from itself; thus, the tantalum nitride film can be suitably used as a conductive film that is in contact with the semiconductor layer 108 or a conductive film that is in the vicinity of the semiconductor layer 108.

<Insulating Layer 110>

The insulating layer 110 functioning as a gate insulating film of the transistor 100 or the like can be formed by a PECVD method, a sputtering method, or the like. For the insulating layer 110, an insulating layer including one or more of a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film can be used. Note that the insulating layer 110 may have a stacked-layer structure of two layers or a stacked-layer structure of three or more layers.

In addition, the insulating layer 110 that is in contact with the semiconductor layer 108 is preferably an oxide insulating film and further preferably includes a region containing oxygen in excess of that in the stoichiometric composition. In other words, the insulating layer 110 is an insulating film capable of releasing oxygen. It is also possible to supply oxygen into the insulating layer 110 by forming the insulating layer 110 in an oxygen atmosphere, performing heat treatment, plasma treatment, or the like on the deposited insulating layer 110 in an oxygen atmosphere, or depositing an oxide film over the insulating layer 110 in an oxygen atmosphere, for example.

For the insulating layer 110, a material having a higher relative permittivity than silicon oxide or silicon oxynitride, such as hafnium oxide, can also be used. In that case, the insulating layer 110 can be thick and leakage current due to tunnel current can be inhibited. In particular, hafnium oxide having crystallinity is preferable because it has a higher relative permittivity than amorphous hafnium oxide.

<Semiconductor Layer>

In the case where the semiconductor layer 108 is an In-M-Zn oxide, a sputtering target used for depositing the In-M-Zn oxide preferably has the atomic ratio of In to M is higher than or equal to 1. Examples of the atomic ratio of metal elements in such a sputtering target includes In:M: Zn=1:1:1, In:M:Zn=1:1:1.2, In:M:Zn=2:1:3, In:M:Zn=3:1: 2, In:M:Zn=4:2:3, In:M:Zn=4:2:4.1, In:M:Zn=5:1:6, In:M: Zn=5:1:7, In:M:Zn=5:1:8, In:M:Zn=6:1:6, and In:M:Zn=5: 2:5.

In addition, a target containing a polycrystalline oxide is preferably used as the sputtering target, which facilitates formation of the semiconductor layer 108 having crystallinity. Note that the atomic ratio in the semiconductor layer 108 to be deposited varies within the range of ±40% from the atomic ratio of the metal elements contained in the sputtering target. For example, in the case where the composition of a sputtering target used for the semiconductor layer 108 is In:Ga:Zn=4:2:4.1 [atomic ratio], the composition of the semiconductor layer 108 to be deposited is in the neighborhood of In:Ga:Zn=4:2:3 [atomic ratio] in some cases.

Note that when the atomic ratio is described as In:Ga: Zn=4:2:3 or as being in the neighborhood thereof, the case is included where Ga is greater than or equal to 1 and less than or equal to 3 and Zn is greater than or equal to 2 and less than or equal to 4 with In being 4. In addition, when the atomic ratio is described as In:Ga:Zn=5:1:6 or as being in the neighborhood thereof, the case is included where Ga is greater than 0.1 and less than or equal to 2 and Zn is greater than or equal to 5 and less than or equal to 7 with In being 5. Furthermore, when the atomic ratio is described as In:Ga:Zn=1:1:1 or as being in the neighborhood thereof, the case is included where Ga is greater than 0.1 and less than or equal to 2 and Zn is greater than 0.1 and less than or equal to 2 with In being 1.

In addition, the energy gap of the semiconductor layer 108 is greater than or equal to 2 eV, preferably greater than or equal to 2.5 eV. With the use of such a metal oxide having a wider energy gap than silicon, the off-state current of the transistor can be reduced.

Furthermore, the semiconductor layer 108 preferably has a non-single-crystal structure. Examples of the non-single-crystal structure include a CAAC structure to be described later, a polycrystalline structure, a microcrystalline structure, and an amorphous structure. Among the non-single-crystal structures, the amorphous structure has the highest density of defect states, whereas the CAAC structure has the lowest density of defect states.

A CAAC (c-axis aligned crystal) will be described below. A CAAC refers to an example of a crystal structure.

The CAAC structure is a crystal structure of a thin film or the like that has a plurality of nanocrystals (crystal regions having a maximum diameter of less than 10 nm), characterized in that the nanocrystals each have c-axis alignment in a particular direction, the nanocrystals each have neither a-axis alignment nor b-axis alignment, and the nanocrystals have continuous crystal connection in the a-axis and b-axis directions without forming a grain boundary. In particular, a thin film having the CAAC structure is characterized in that the c-axes of nanocrystals are likely to be aligned in a film thickness direction, a normal direction of a surface where the thin film is formed, or a normal direction of a surface of the thin film.

A CAAC-OS (Oxide Semiconductor) is an oxide semiconductor with high crystallinity. Meanwhile, in the CAAC-OS, it can be said that a reduction in electron mobility due to the crystal grain boundary is less likely to occur because a clear crystal grain boundary cannot be observed. Furthermore, the mixing of impurities, formation of defects, or the like might decrease the crystallinity of the oxide semiconductor; thus, it can also be said that the CAAC-OS is an oxide semiconductor having small amounts of impurities and defects (oxygen vacancies or the like). Thus, an oxide semiconductor including a CAAC-OS is physically stable.

Therefore, the oxide semiconductor including a CAAC-OS is resistant to heat and has high reliability.

Here, in crystallography, in a unit cell formed with three axes (crystal axes) of the a-axis, the b-axis, and the c-axis, a specific axis is generally taken as the c-axis. In particular, in the case of a crystal having a layered structure, two axes parallel to the plane direction of a layer are regarded as the a-axis and the b-axis and an axis intersecting with the layer is regarded as the c-axis in general. Typical examples of such a crystal having a layered structure include graphite, which is classified as a hexagonal system. In a unit cell of graphite, the a-axis and the b-axis are parallel to a cleavage plane and the c-axis is orthogonal to the cleavage plane. For example, an $InGaZnO_4$ crystal having a $YbFe_2O_4$ type crystal structure, which is a layered structure, can be classified as a hexagonal system, and in a unit cell thereof, the a-axis and the b-axis are parallel to the plane direction of a layer and the c-axis is orthogonal to the layer (i.e., the a-axis and the b-axis).

In an image observed with a TEM, crystal parts cannot be found clearly in an oxide semiconductor film having a microcrystalline structure (a microcrystalline oxide semiconductor film) in some cases. Inmost cases, the size of a crystal part included in the microcrystalline oxide semiconductor film is greater than or equal to 1 nm and less than or equal to 100 nm, or greater than or equal to 1 nm and less than or equal to 10 nm. In particular, an oxide semiconductor film including a nanocrystal (nc) that is a microcrystal with a size greater than or equal to 1 nm and less than or equal to 10 nm, or greater than or equal to 1 nm and less than or equal to 3 nm is referred to as an nc-OS (nanocrystalline Oxide Semiconductor) film. In an image observed with a TEM, for example, a grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different crystal parts in the nc-OS film. Thus, the orientation in the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak that shows a crystal plane does not appear. Furthermore, a diffraction pattern like a halo pattern is observed when the nc-OS film is subjected to electron diffraction (also referred to as selected-area electron diffraction) using an electron beam with a probe diameter (e.g., 50 nm or larger) that is larger than a crystal part. Meanwhile, in some cases, a circular (ring-like) region with high luminance is observed when electron diffraction (also referred to as nanobeam electron diffraction) using an electron beam with a probe diameter (e.g., 1 nm or larger and 30 nm or smaller) close to or smaller than the size of a crystal part is performed on the nc-OS film, and a plurality of spots are observed in the region.

The nc-OS film has a lower density of defect states than an amorphous oxide semiconductor film. Note that there is no regularity of crystal orientation between different crystal parts in the nc-OS film. Thus, the nc-OS film has a higher density of defect states than the CAAC-OS film. Accordingly, the nc-OS film has a higher carrier density and higher electron mobility than the CAAC-OS film in some cases. Therefore, a transistor including the nc-OS film may have high field-effect mobility.

The nc-OS film can be formed at a lower oxygen flow rate ratio in film formation than the CAAC-OS film. The nc-OS film can also be formed at a lower substrate temperature in film formation than the CAAC-OS film. For example, the nc-OS film can be formed at a relatively low substrate temperature (e.g., a temperature of 130° C. or lower) or without heating of the substrate and thus is suitable for the case of using a large glass substrate, a resin substrate, or the like, and productivity can be increased.

An example of a crystal structure of a metal oxide is described. Note that a metal oxide formed by a sputtering method using an In—Ga—Zn oxide target (In:Ga:Zn=4:2:4.1 [atomic ratio]) is described below as an example. A metal oxide that is formed by a sputtering method using the above target at a substrate temperature higher than or equal to 100° C. and lower than or equal to 130° C. is likely to have either the nc (nano crystal) structure or the CAAC structure, or a structure in which both structures are mixed. By contrast, a metal oxide formed by a sputtering method at a substrate temperature set at room temperature (R.T.) is likely to have the nc structure. Note that room temperature (R.T.) here also includes a temperature in the case where a substrate is not heated intentionally.

[Composition of Metal Oxide]

The composition of a CAC (Cloud-Aligned Composite)-OS that can be used in a transistor disclosed in one embodiment of the present invention will be described below.

Note that in this specification and the like, "CAAC (c-axis aligned crystal)" or "CAC (Cloud-Aligned Composite)" might be stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. The conductive regions are observed to be coupled in a cloud-like manner with their boundaries blurred, in some cases.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. In the case of such a structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility, can be obtained.

In other words, the CAC-OS or the CAC-metal oxide can also be referred to as a matrix composite or a metal matrix composite.

The above is the description of the components.

At least part of this embodiment can be implemented in combination with the other embodiments described in this specification as appropriate.

Embodiment 2

In this embodiment, an example of a display device that includes any of the transistors described in the above embodiment will be described.

Structure Example

FIG. 9(A) is a top view of a display device 700. The display device 700 includes a first substrate 701 and a second substrate 705 that are attached to each other with a sealant 712. In a region sealed with the first substrate 701, the second substrate 705, and the sealant 712, a pixel portion 702, a source driver circuit portion 704, and a gate driver circuit portion 706 are provided over the first substrate 701. In the pixel portion 702, a plurality of display elements are provided.

An FPC terminal portion 708 to which an FPC 716 (FPC: Flexible printed circuit) is connected is provided in a portion of the first substrate 701 that does not overlap with the second substrate 705. The pixel portion 702, the source driver circuit portion 704, and the gate driver circuit portion 706 are each supplied with a variety of signals and the like from the FPC 716 through the FPC terminal portion 708 and a signal line 710.

A plurality of gate driver circuit portions 706 may be provided. The gate driver circuit portion 706 and the source driver circuit portion 704 may be formed separately on semiconductor substrates or the like to obtain packaged IC chips. The IC chips can each be mounted on the first substrate 701 or the FPC 716.

Any of the transistors that are the semiconductor devices of embodiments of the present invention can be used as transistors included in the pixel portion 702, the source driver circuit portion 704, and the gate driver circuit portion 706.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. As the light-emitting element, a self-luminous light-emitting element such as an LED (Light Emitting Diode), an OLED (Organic LED), a QLED (Quantum-dot LED), or a semiconductor laser can be used. It is also possible to use a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like, for instance.

A display device 700A illustrated in FIG. 9(B) is an example of a display device which includes a flexible resin layer 743 instead of the first substrate 701 and can be used as a flexible display.

In the display device 700A, the pixel portion 702 has not a rectangular shape but a shape with rounded corners. The display device 700A includes a notch portion in which part of the pixel portion 702 and part of the resin layer 743 are cut as illustrated in a region P1 in FIG. 9(B). A pair of gate driver circuit portions 706 is provided on the opposite sides with the pixel portion 702 therebetween. The gate driver circuit portions 706 are provided along a curved outline at the corners of the pixel portion 702.

The resin layer 743 has a shape with a sticking-out portion where the FPC terminal portion 708 is provided. Furthermore, part of the resin layer 743 that includes the FPC terminal portion 708 can be bent backward in a region P2 in FIG. 9(B). When part of the resin layer 743 is bent backward, the display device 700A can be mounted on an electronic device while the FPC 716 overlaps with the back side of the pixel portion 702; thus, the electronic device can be downsized.

An IC 717 is mounted on the FPC 716 connected to the display device 700A. The IC 717 functions as a source driver circuit, for example. In this case, the source driver circuit portion 704 in the display device 700A can include at least one of a protection circuit, a buffer circuit, a demultiplexer circuit, and the like.

A display device 700B illustrated in FIG. 9(C) is a display device that can be suitably used for an electronic device with a large screen. For example, the display device 700B can be suitably used for a television device, a monitor device, a personal computer (including a notebook type and a desktop type), a tablet terminal, digital signage, or the like.

The display device 700B includes a plurality of source driver ICs 721 and a pair of gate driver circuit portions 722.

The plurality of source driver ICs 721 are attached to respective FPCs 723. In each of the plurality of FPCs 723, one of terminals is connected to the first substrate 701, and the other terminal is connected to a printed circuit board 724. By bending the FPCs 723, the printed circuit board 724 can be placed on the back side of the pixel portion 702 so that the display device 700B can be mounted on an electronic device; thus, the electronic device can be downsized.

By contrast, the gate driver circuit portions 722 are provided over the first substrate 701. Thus, an electronic device with a narrow bezel can be provided.

With such a structure, a large-size and high-resolution display device can be provided. For example, a display device with a diagonal screen size of 30 inches or more, 40 inches or more, 50 inches or more, or 60 inches or more can be obtained. Furthermore, a display device with extremely high resolution such as 4K2K or 8K4K can be provided.

[Cross-Sectional Structure Example]

Figure 10:
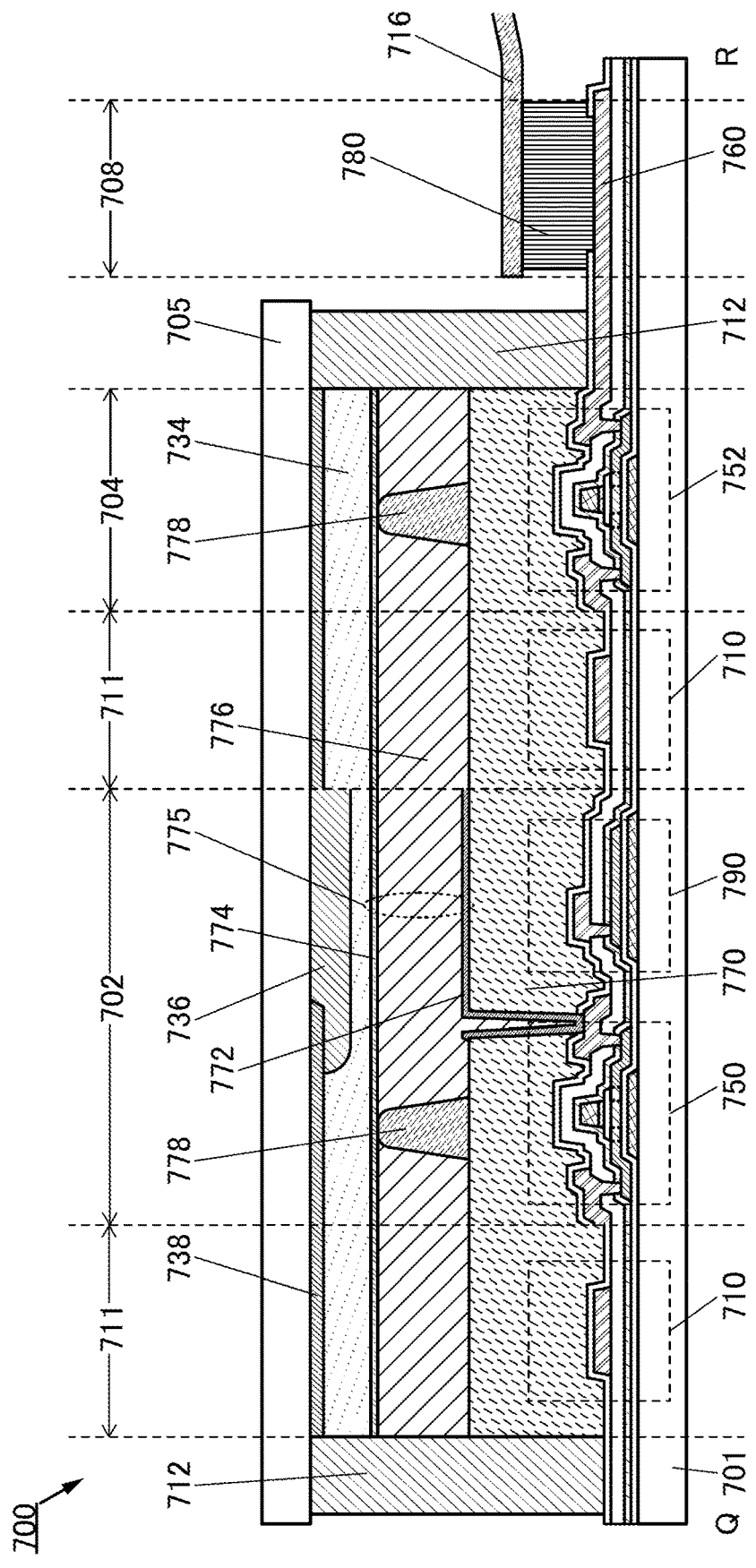
FIG. 10 A cross-sectional view of a display device.
Figure 11:
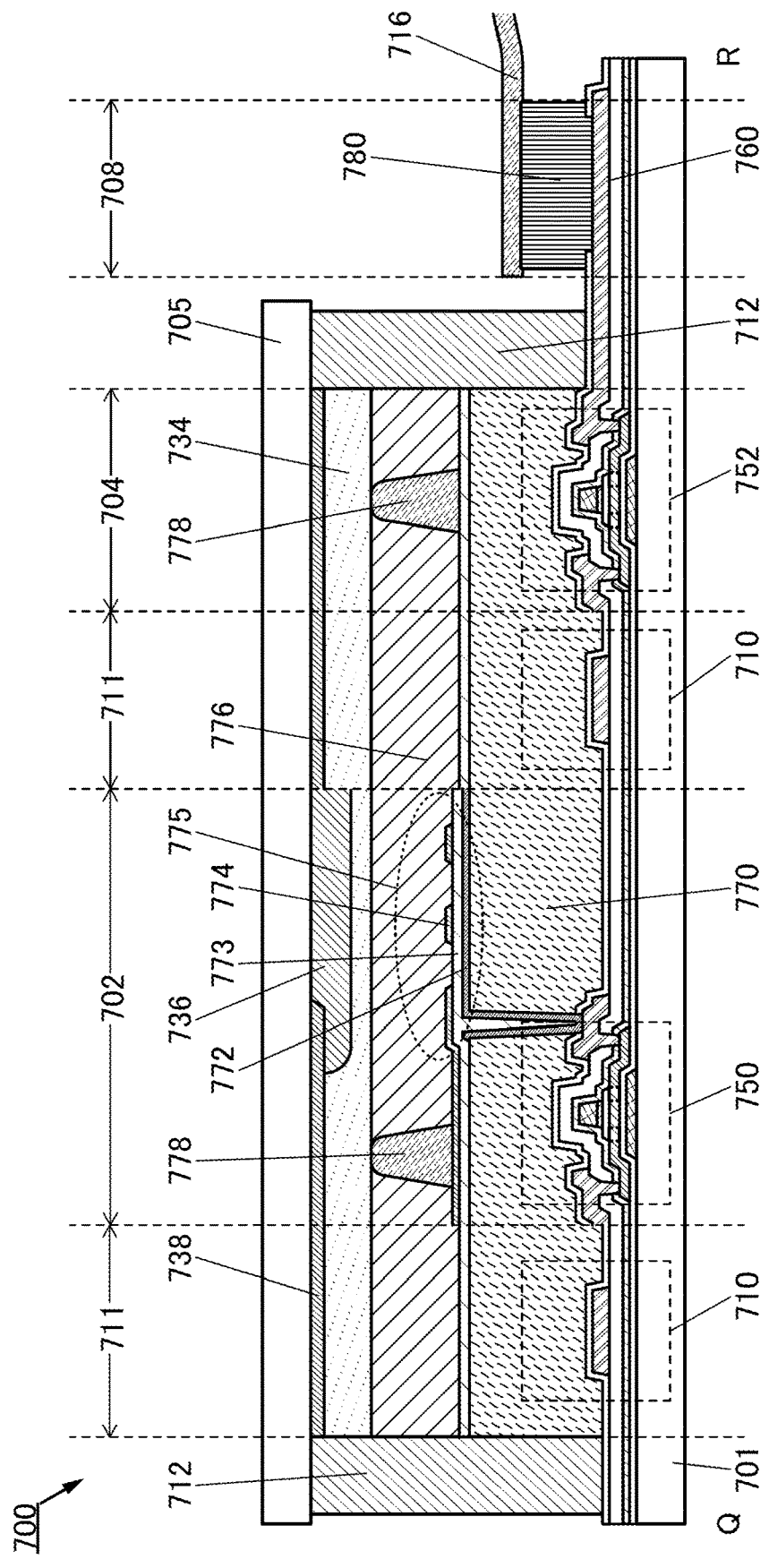
FIG. 11 A cross-sectional view of a display device.
Figure 12:
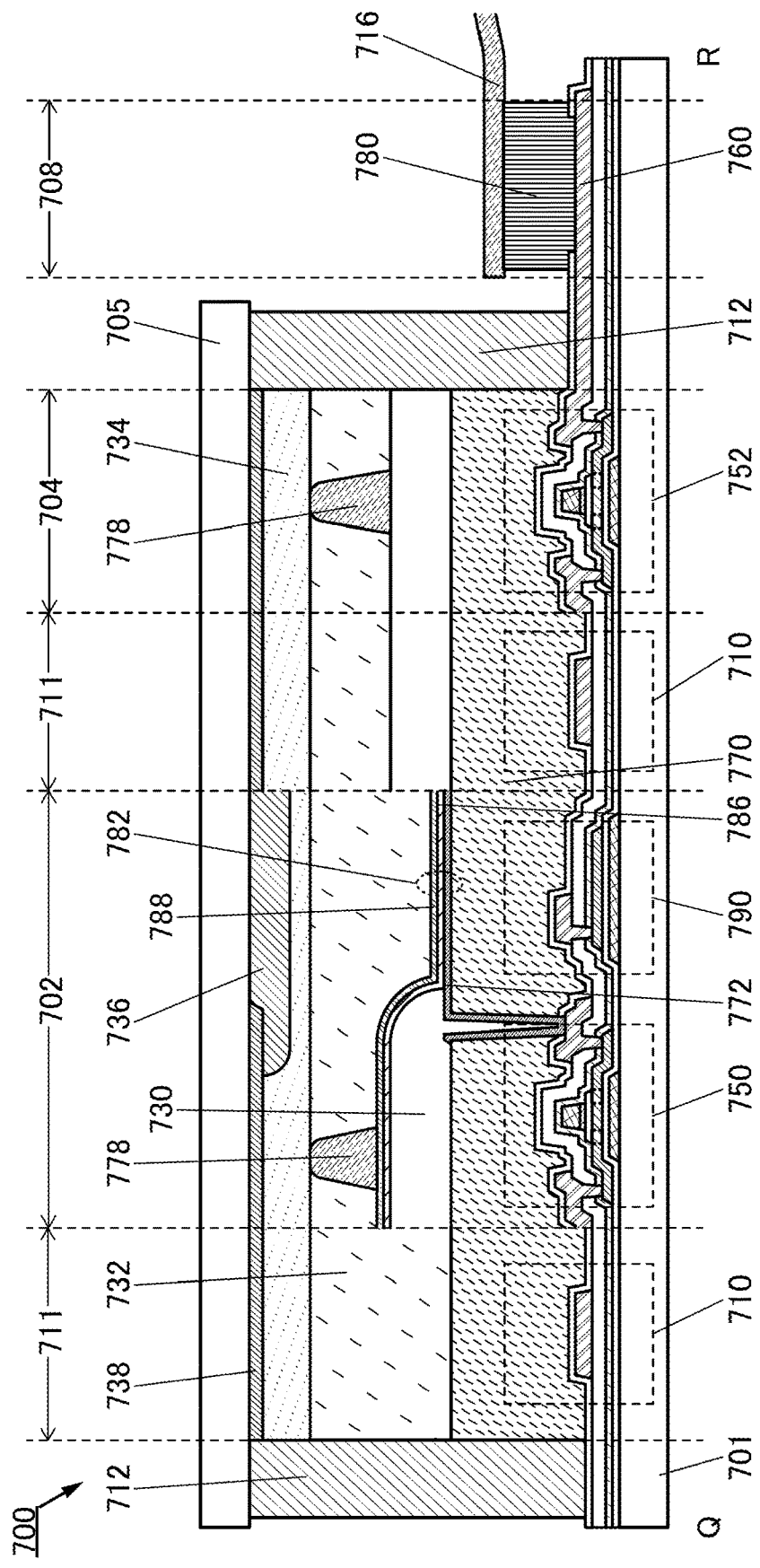
FIG. 12 A cross-sectional view of a display device.
Figure 13:
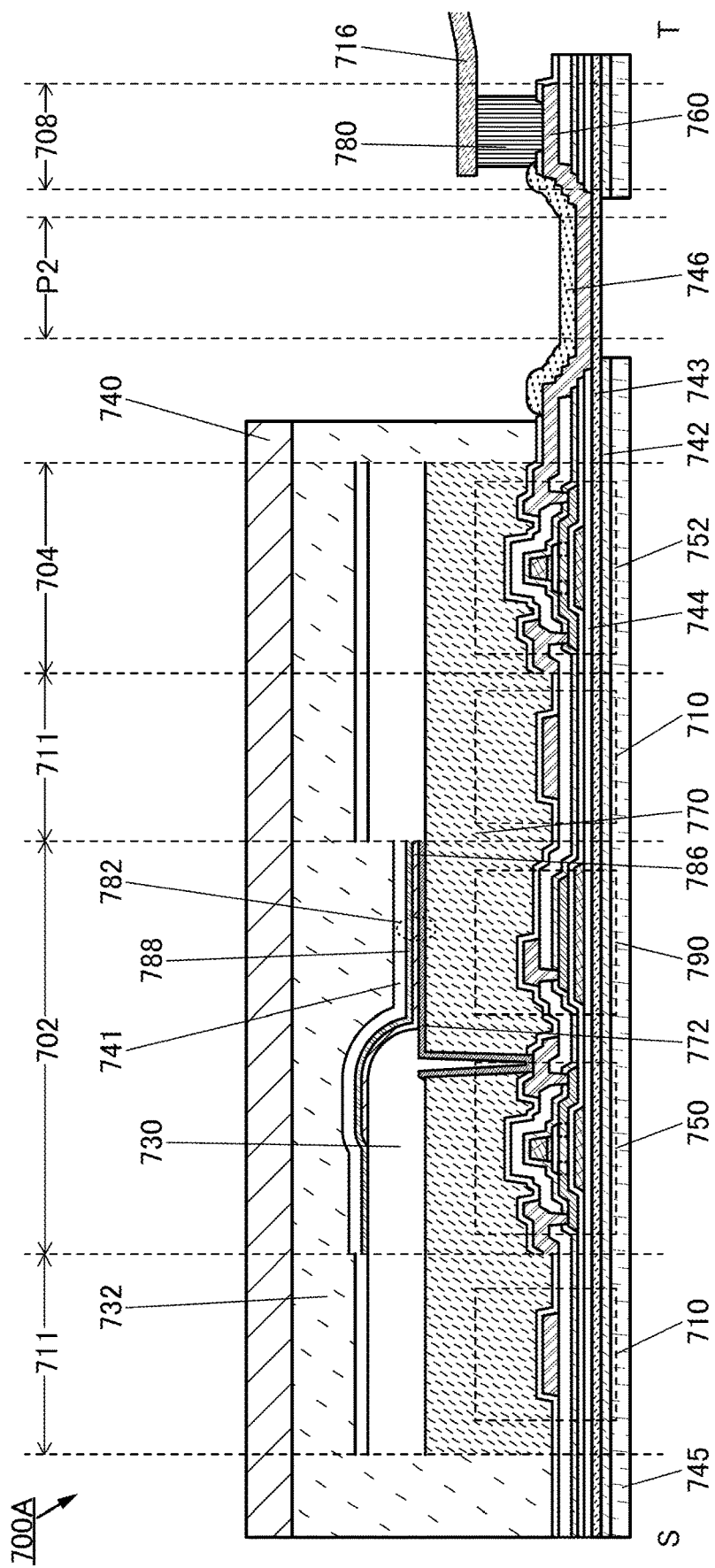
FIG. 13 A cross-sectional view of a display device.

Structures using a liquid crystal element as a display element and structures using an EL element will be described below with reference to FIG. 10 to FIG. 13. Note that FIG. 10 to FIG. 12 are cross-sectional views taken along dashed-dotted line Q-R in FIG. 9(A). FIG. 13 is a cross-sectional view taken along dashed-dotted line S-T in the display device 700A in FIG. 9(B). FIG. 10 and FIG. 11 are each a structure using a liquid crystal element as a display element, and FIG. 12 and FIG. 13 are each a structure using an EL element.

<Description of Common Portions in Display Devices>

Display devices in FIG. 10 to FIG. 13 each include a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752. FIG. 11 illustrates a case where the capacitor 790 is not provided.

As the transistor 750 and the transistor 752, any of the transistors described in Embodiment 1 can be used.

The transistor used in this embodiment includes a highly purified oxide semiconductor film in which formation of oxygen vacancies is suppressed. The transistor can have low off-state current. Accordingly, an electrical signal such as an image signal can be held for a longer period, and the interval between writes of an image signal or the like can be set longer. Thus, frequency of refresh operation can be reduced, which leads to lower power consumption.

In addition, the transistor used in this embodiment can have relatively high field-effect mobility and thus is capable of high-speed operation. For example, with such a transistor capable of high-speed operation used for a display device, a switching transistor in a pixel portion and a driver transistor used in a driver circuit portion can be formed over one substrate. That is, a structure in which a driver circuit formed using a silicon wafer or the like is not used is possible, in which case the number of components of the display device can be reduced. Moreover, the use of the transistor capable of high-speed operation also in the pixel portion can provide a high-quality image.

The capacitor 790 illustrated in FIG. 10, FIG. 12, and FIG. 13 includes a lower electrode formed by processing the same film as a first gate electrode included in the transistor 750 and an upper electrode formed by processing the same metal oxide film as the semiconductor layer. The upper electrode has reduced resistance like a source region and a drain region of the transistor 750. Part of an insulating film functioning as a first gate insulating layer of the transistor 750 is provided between the lower electrode and the upper electrode. That is, the capacitor 790 has a stacked-layer structure in which the insulating films functioning as dielectric films are positioned between a pair of electrodes. A wiring obtained by processing the same film as a source electrode and a drain electrode of the transistor is connected to the upper electrode.

A planarization insulating film 770 is provided over the transistor 750, the transistor 752, and the capacitor 790.

The transistor 750 in the pixel portion 702 and the transistor 752 in the source driver circuit portion 704 may have different structures. For example, a top-gate transistor may be used as one of the transistors 750 and 752, and a bottom-gate transistor may be used as the other. Note that the same can be said for the gate driver circuit portion 706, as the source driver circuit portion 704.

The signal line 710 is formed using the same conductive film as the source electrodes, the drain electrodes, and the like of the transistors 750 and 752. In this case, a low-resistance material such as a material containing a copper element is preferably used because signal delay or the like due to the wiring resistance can be reduced and display on a large screen is possible.

The FPC terminal portion 708 includes a wiring 760 part of which functions as a connection electrode, an anisotropic conductive film 780, and the FPC 716. The wiring 760 is electrically connected to a terminal included in the FPC 716 through the anisotropic conductive film 780. The wiring 760 is formed using the same conductive film as the source electrodes, the drain electrodes, and the like of the transistors 750 and 752.

As the first substrate 701 and the second substrate 705, a glass substrate or a flexible substrate such as a plastic substrate can be used, for example. In the case where a flexible substrate is used as the first substrate 701, an insulating layer having a barrier property against water or hydrogen is preferably provided between the first substrate 701 and the transistor 750, for example.

A light-blocking film 738, a coloring film 736, and an insulating film 734 in contact with these films are provided on the second substrate 705 side.

<Structure Example of Display Device Using Liquid Crystal Element>

The display device 700 illustrated in FIG. 10 includes a liquid crystal element 775 and a spacer 778. The liquid crystal element 775 includes a conductive layer 772, a conductive layer 774, and a liquid crystal layer 776 therebetween. The conductive layer 774 is provided on the second substrate 705 side and has a function of a common electrode. The conductive layer 772 is electrically connected to the source electrode or the drain electrode of the transistor 750. The conductive layer 772 is formed over the planarization insulating film 770 and functions as a pixel electrode.

A material that transmits visible light or a material that reflects visible light can be used for the conductive layer 772. As a light-transmitting material, for example, an oxide material including indium, zinc, tin, or the like is preferably used. As a reflective material, for example, a material including aluminum, silver, or the like is preferably used.

When a reflective material is used for the conductive layer 772, the display device 700 is a reflective liquid crystal display device. When a light-transmitting material is used for the conductive layer 772, a transmissive liquid crystal display device is obtained. For a reflective liquid crystal display device, a polarizing plate is provided on the viewer side. By contrast, for a transmissive liquid crystal display device, a pair of polarizing plates is provided so that the liquid crystal element is placed therebetween.

The display device 700 in FIG. 11 is an example of employing the liquid crystal element 775 of a horizontal electric field mode (e.g., an FFS mode). The conductive layer 774 functioning as a common electrode is provided over the conductive layer 772 with an insulating layer 773 therebetween. An electric field generated between the conductive layer 772 and the conductive layer 774 can control the alignment state in the liquid crystal layer 776.

In FIG. 11, a storage capacitor can be formed with a stacked-layer structure including the conductive layer 774, the insulating layer 773, and the conductive layer 772. Thus, another capacitor need not be provided, and thus the aperture ratio can be increased.

Although not illustrated in FIG. 10 and FIG. 11, a structure in which an alignment film in contact with the liquid crystal layer 776 is provided may be employed. Furthermore, an optical member (an optical substrate) such as a polarizing member, a retardation member, or an anti-reflection member, and a light source such as a backlight or a sidelight can be provided as appropriate.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case where a horizontal electric field mode is employed, a liquid crystal exhibiting a blue phase for which an alignment film is not used may be used.

The following can be used as a mode of the liquid crystal element: a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optically Compensated Birefringence) mode, an ECB (Electrically Controlled Birefringence) mode, a guest-host mode, or the like.

In addition, a scattering liquid crystal element employing a polymer dispersed liquid crystal, a polymer network liquid crystal, or the like can be used for the liquid crystal layer 776. At this time, monochrome image display may be performed without the coloring film 736, or color display may be performed using the coloring film 736.

As a method for driving the liquid crystal element, a time-division display method (also referred to as a field sequential driving method) in which color display is performed on the basis of a successive additive color mixing method may be employed. In that case, a structure in which the coloring film 736 is not provided may be employed. In the case where the time-division display method is employed, advantages such as the aperture ratio of each pixel or the resolution being increased can be obtained because subpixels that emit light of, for example, R (red), G (green), and B (blue), need not be provided.

<Display Device Using Light-Emitting Element>

The display device 700 illustrated in FIG. 12 includes a light-emitting element 782. The light-emitting element 782 includes the conductive layer 772, an EL layer 786, and a conductive film 788. The EL layer 786 contains an organic compound or an inorganic compound such as quantum dots.

Examples of materials that can be used for an organic compound include a fluorescent material and a phosphorescent material. Examples of materials that can be used for quantum dots include a colloidal quantum dot material, an alloyed quantum dot material, a core-shell quantum dot material, and a core quantum dot material.

In the display device 700 illustrated in FIG. 12, an insulating film 730 covering part of the conductive layer 772 is provided over the planarization insulating film 770. Here, the light-emitting element 782 is a top-emission light-emitting element, which includes the conductive film 788 with a light-transmitting property. Note that the light-emitting element 782 may have a bottom-emission structure in which light is emitted to the conductive layer 772 side, or a dual-emission structure in which light is emitted to both the conductive layer 772 side and the conductive film 788 side.

The coloring film 736 is provided to overlap with the light-emitting element 782, and the light-blocking film 738 is provided in the lead wiring portion 711, the source driver circuit portion 704, and a position overlapping with the insulating film 730. The coloring film 736 and the light-blocking film 738 are covered with the insulating film 734. A space between the light-emitting element 782 and the insulating film 734 is filled with a sealing film 732. Note that a structure in which the coloring film 736 is not provided may be employed when the EL layer 786 is formed into an island shape for each pixel or into a stripe shape for each pixel column, i.e., the EL layer 786 is formed by separate coloring.

FIG. 13 illustrates a structure of a display device suitably applicable to a flexible display. FIG. 13 is a cross-sectional view taken along the dashed-dotted line S-T in the display device 700A in FIG. 9(B).

The display device 700A in FIG. 13 has a structure in which a support substrate 745, a bonding layer 742, the resin layer 743, and an insulating layer 744 are stacked instead of the first substrate 701 in FIG. 12. The transistor 750, the capacitor 790, and the like are provided over the insulating layer 744 over the resin layer 743.

The support substrate 745 includes an organic resin, glass, or the like and is thin enough to have flexibility. The resin layer 743 is a layer containing an organic resin such as polyimide or acrylic. The insulating layer 744 includes an inorganic insulating film of silicon oxide, silicon oxynitride, silicon nitride, or the like. The resin layer 743 and the support substrate 745 are attached to each other with the bonding layer 742. The resin layer 743 is preferably thinner than the support substrate 745.

The display device 700A in FIG. 13 includes a protective layer 740 instead of the substrate 705 in FIG. 12. The protective layer 740 is attached to the sealing film 732. A glass substrate, a resin film, or the like can be used as the protective layer 740. Alternatively, as the protective layer 740, an optical member such as a polarizing plate or a scattering plate, an input device such as a touch sensor panel, or a structure in which two or more of the above are stacked may be employed.

The EL layer 786 included in the light-emitting element 782 is provided over the insulating film 730 and the conductive layer 772 in an island shape. The EL layers 786 are formed separately so that respective subpixels emit light of different colors, whereby color display can be performed without use of the coloring film 736. A protective layer 741 is provided to cover the light-emitting element 782. The protective layer 741 has a function of preventing diffusion of impurities such as water into the light-emitting element 782. The protective layer 741 is preferably formed using an inorganic insulating film. The protective layer 741 further preferably has a stacked-layer structure including one or more inorganic insulating films and one or more organic insulating films.

FIG. 13 illustrates the region P2 that can be bent. The region P2 includes a portion where the support substrate 745, the bonding layer 742, and the inorganic insulating film such as the insulating layer 744 are not provided. In the region P2, a resin layer 746 is provided to cover the wiring 760. When a structure is employed in which an inorganic insulating film is not provided if possible in the region P2 that can be bent and only a conductive layer containing a metal or an alloy and a layer containing an organic material are stacked, generation of cracks caused at bending can be prevented. When the support substrate 745 is not provided in the region P2, part of the display device 700A can be bent with an extremely small radius of curvature.

<Structure Example of Display Device Provided with Input Device>

An input device may be provided in the display device illustrated in FIG. 10 to FIG. 13. Examples of the input device include a touch sensor.

A variety of types such as a capacitive type, a resistive type, a surface acoustic wave type, an infrared type, an optical type, and a pressure-sensitive type can be used as the sensor type, for example. Alternatively, two or more of these types may be combined and used.

Examples of the touch panel structure include what is called an in-cell touch panel in which an input device is provided between a pair of substrates, what is called an on-cell touch panel in which an input device is formed over the display device, or what is called an out-cell touch panel in which an input device is attached to the display device.

At least part of the structure examples, the drawings corresponding thereto, and the like exemplified in this embodiment can be implemented in combination with the other structure examples, the other drawings, and the like as appropriate.

At least part of this embodiment can be implemented in combination with any of the other embodiments described in this specification as appropriate.

Embodiment 3

In this embodiment, a display device that includes the semiconductor device of one embodiment of the present invention will be described with reference to FIG. 14.

Figure 14A:
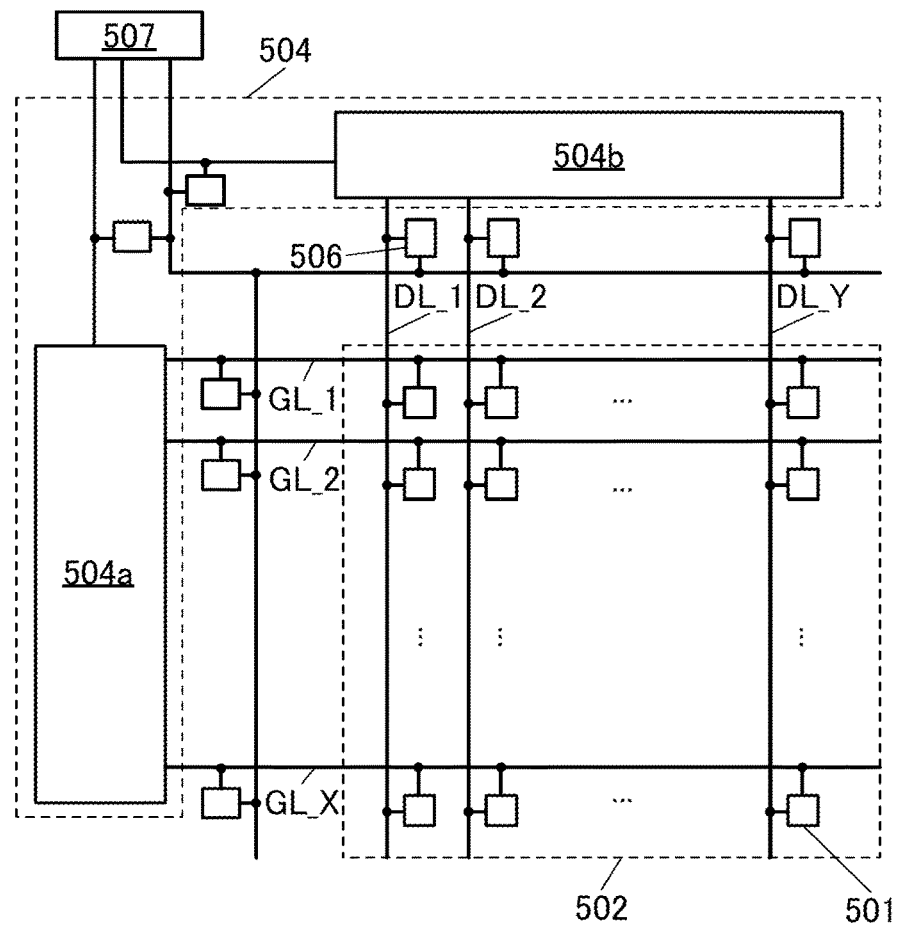
FIGS. 14A to 14C A block diagram and circuit diagrams of a display device.

A display device illustrated in FIG. 14(A) includes a pixel portion 502, a driver circuit portion 504, protection circuits 506, and a terminal portion 507. Note that a structure in which the protection circuits 506 are not provided may be employed.

The transistor of one embodiment of the present invention can be used as transistors included in the pixel portion 502 and the driver circuit portion 504. The transistor of one embodiment of the present invention may also be used in the protection circuits 506.

The pixel portion 502 includes a plurality of pixel circuits 501 that drive a plurality of display elements arranged in X rows and Y columns (X and Y each independently represent a natural number of 2 or more).

The driver circuit portion 504 includes driver circuits such as a gate driver 504a that outputs a scanning signal to scan lines GL_1 to GL_X and a source driver 504b that supplies a data signal to data lines DL_1 to DL_Y The gate driver 504a includes at least a shift register. The source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 illustrated in FIG. 14(A) is connected to a variety of wirings such as the scan lines GL that are wirings between the gate driver 504a and the pixel circuits 501 and the data lines DL that are wirings between the source driver 504b and the pixel circuits 501, for example.

The gate driver 504a and the source driver 504b may be provided over a substrate over which the pixel portion 502 is provided, or a substrate where a gate driver circuit or a source driver circuit is separately formed (e.g., a driver circuit board formed using a single crystal semiconductor film or a polycrystalline semiconductor film) may be mounted on the substrate by COG or TAB (Tape Automated Bonding).

Figure 14B:
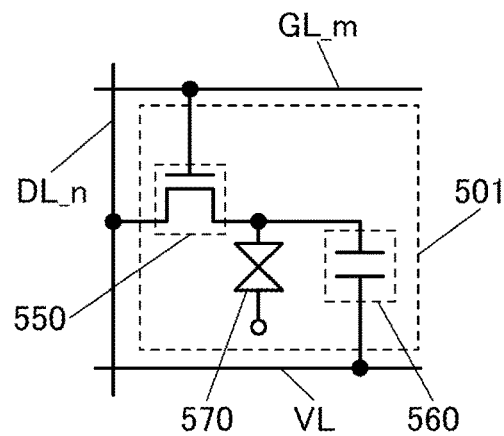
Figure 14C:
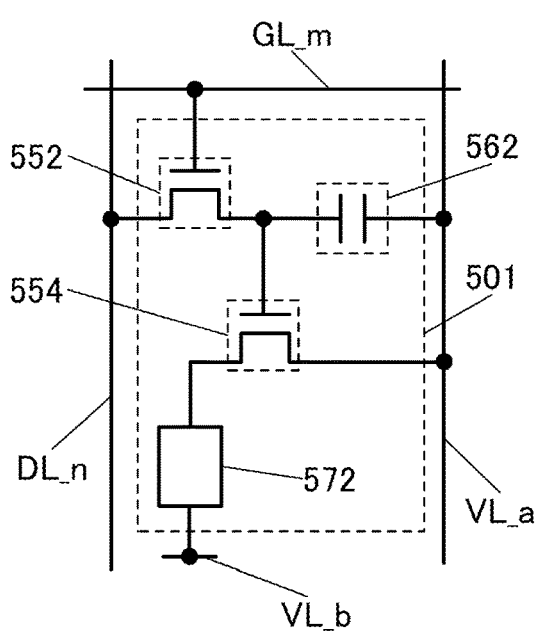

The plurality of pixel circuits 501 illustrated in FIG. 14(A) can have a configuration illustrated in FIG. 14(B) or FIG. 14(C), for example.

The pixel circuit 501 illustrated in FIG. 14(B) includes a liquid crystal element 570, a transistor 550, and a capacitor 560. The data line DL_n, the scan line GL_m, a potential supply line VL, and the like are connected to the pixel circuit 501.

The potential of one of a pair of electrodes of the liquid crystal element 570 is set appropriately in accordance with the specifications of the pixel circuit 501. The alignment state of the liquid crystal element 570 is set depending on written data. Note that a common potential may be supplied to one of the pair of electrodes of the liquid crystal element 570 included in each of the plurality of pixel circuits 501. Alternatively, a potential supplied to one of the pair of electrodes of the liquid crystal element 570 of the pixel circuit 501 may differ between rows.

The pixel circuit 501 illustrated in FIG. 14(C) includes transistors 552 and 554, a capacitor 562, and a light-emitting element 572. The data line DL_n, the scan line GL_m, a potential supply line VL_a, a power supply line VL_b, and the like are connected to the pixel circuit 501.

Note that a high power supply potential VDD is supplied to one of the potential supply line VL_a and the potential supply line VL_b, and a low power supply potential VSS is supplied to the other. Current flowing through the light-emitting element 572 is controlled in accordance with a potential applied to a gate of the transistor 554, whereby the luminance of light emitted from the light-emitting element 572 is controlled.

At least part of the structure examples, the drawings corresponding thereto, and the like exemplified in this embodiment can be implemented in combination with the other structure examples, the other drawings, and the like as appropriate.

At least part of this embodiment can be implemented in combination with any of the other embodiments described in this specification as appropriate.

Embodiment 4

A pixel circuit including a memory for correcting gray levels displayed by pixels and a display device including the pixel circuit will be described below. The transistor described in Embodiment 1 can be used as a transistor used in the pixel circuit described below.

[Circuit Configuration]

Figure 15A:
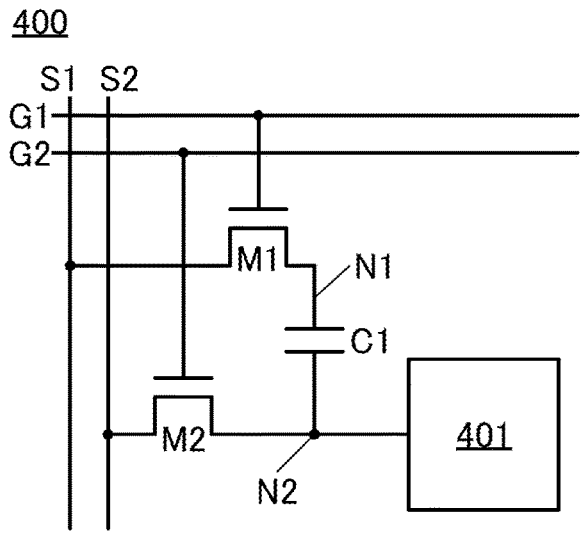
FIGS. 15A to 15D Circuit diagrams and a timing chart of display devices.

FIG. 15(A) is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other is connected to one electrode of the capacitor C1. In the transistor M2, a gate is connected to the wiring G2, one of a source and a drain is connected to the wiring S2, and the other is connected to the other electrode of the capacitor C1 and the circuit 401.

The circuit 401 is a circuit including at least one display element. Any of a variety of elements can be used as the display element, and typically, a light-emitting element such as an organic EL element or an LED element, a liquid crystal element, a MEMS (Micro Electro Mechanical Systems) element, or the like can be used.

A node connecting the transistor M1 and the capacitor C1 is denoted as a node N1, and a node connecting the transistor M2 and the circuit 401 is denoted as a node N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1, can be used as one or both of the transistor M1 and the transistor M2. Accordingly, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

Driving Method Example

Figure 15B:
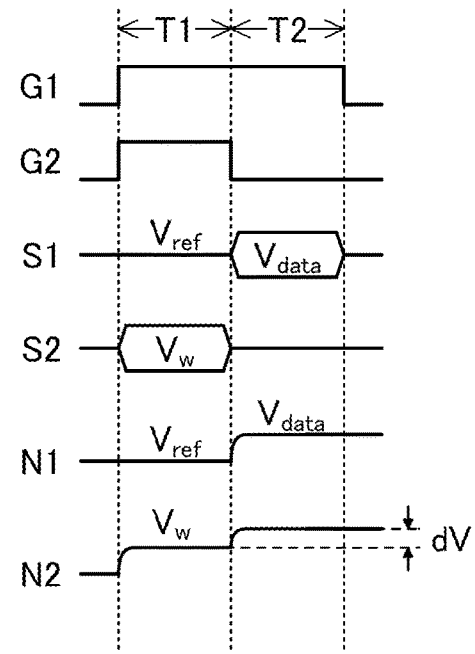

Next, an example of a method for operating the pixel circuit 400 is described with reference to FIG. 15(B). FIG. 15(B) is a timing chart of the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 15(B), one frame period is divided into a period T1 and a period T2. The period T1 is a period in which a potential is written to the node N2, and the period T2 is a period in which a potential is written to the node N1.

<Period T1>

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied to the node N2 through the transistor M2. Accordingly, a potential difference $V_w$-$V_{ref}$ is retained in the capacitor C1.

<Period T2>

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied to the node N1 through the transistor M1. At this time, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although dV is shown as a positive value in FIG. 15(B), the potential dV may be a negative value. That is, the second data potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. For example, in the case where a light-emitting element is used, high-dynamic range (HDR) display or the like can be performed. In the case where a liquid crystal element is used, overdriving or the like can be achieved.

Application Examples

<Example Using Liquid Crystal Element>

Figure 15C:
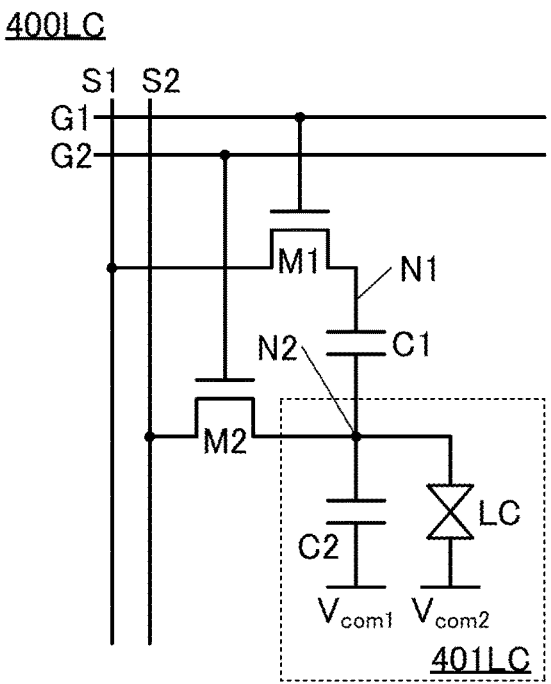

A pixel circuit 400LC illustrated in FIG. 15(C) includes a circuit 401LC. The circuit 401LC includes a liquid crystal element LC and a capacitor C2.

In the liquid crystal element LC, one electrode is connected to the node N2 and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high driving voltage can be employed, for example. Moreover, by supply of a correction signal to the wiring S1 or the wiring S2, a gray level can be corrected in accordance with the operating temperature, the deterioration state of the liquid crystal element LC, or the like.

<Example Using Light-Emitting Element>

Figure 15D:
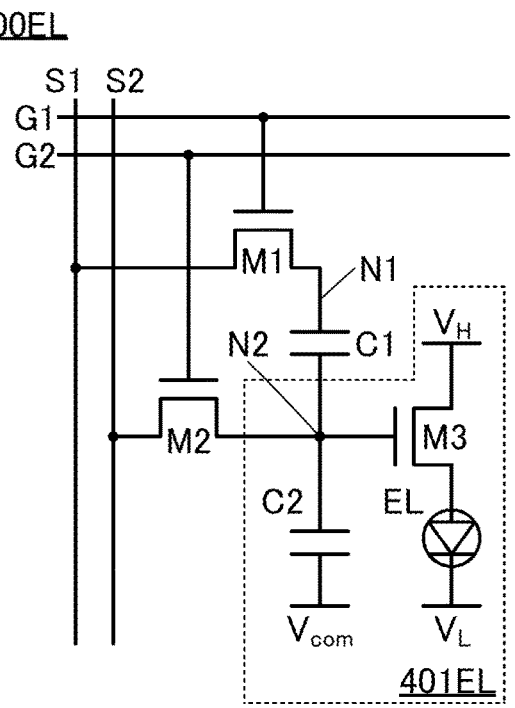

A pixel circuit 400EL illustrated in FIG. 15(D) includes a circuit 401EL. The circuit 401EL includes a light-emitting element EL, a transistor M3, and the capacitor C2.

In the transistor M3, a gate is connected to the node N2 and one electrode of the capacitor C2, one of a source and a drain is connected to a wiring supplied with a potential $V_H$, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling a current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential $V_H$ and the potential $V_L$ can be appropriately changed.

In the pixel circuit 400EL, a large amount of current can flow through the light-emitting element EL when a high potential is applied to the gate of the transistor M3, which enables HDR display, for example. Moreover, a variation in the electrical characteristics of the transistor M3 and the light-emitting element EL can be corrected by supply of a correction signal to the wiring S1 or the wiring S2.

Note that the configuration is not limited to the circuits illustrated in FIGS. 15(C) and 15(D), and a configuration to which a transistor, a capacitor, or the like is further added may be employed.

At least part of this embodiment can be implemented in combination with any of the other embodiments described in this specification as appropriate.

Embodiment 5

In this embodiment, a display module that can be fabricated using one embodiment of the present invention will be described.

Figure 16A:
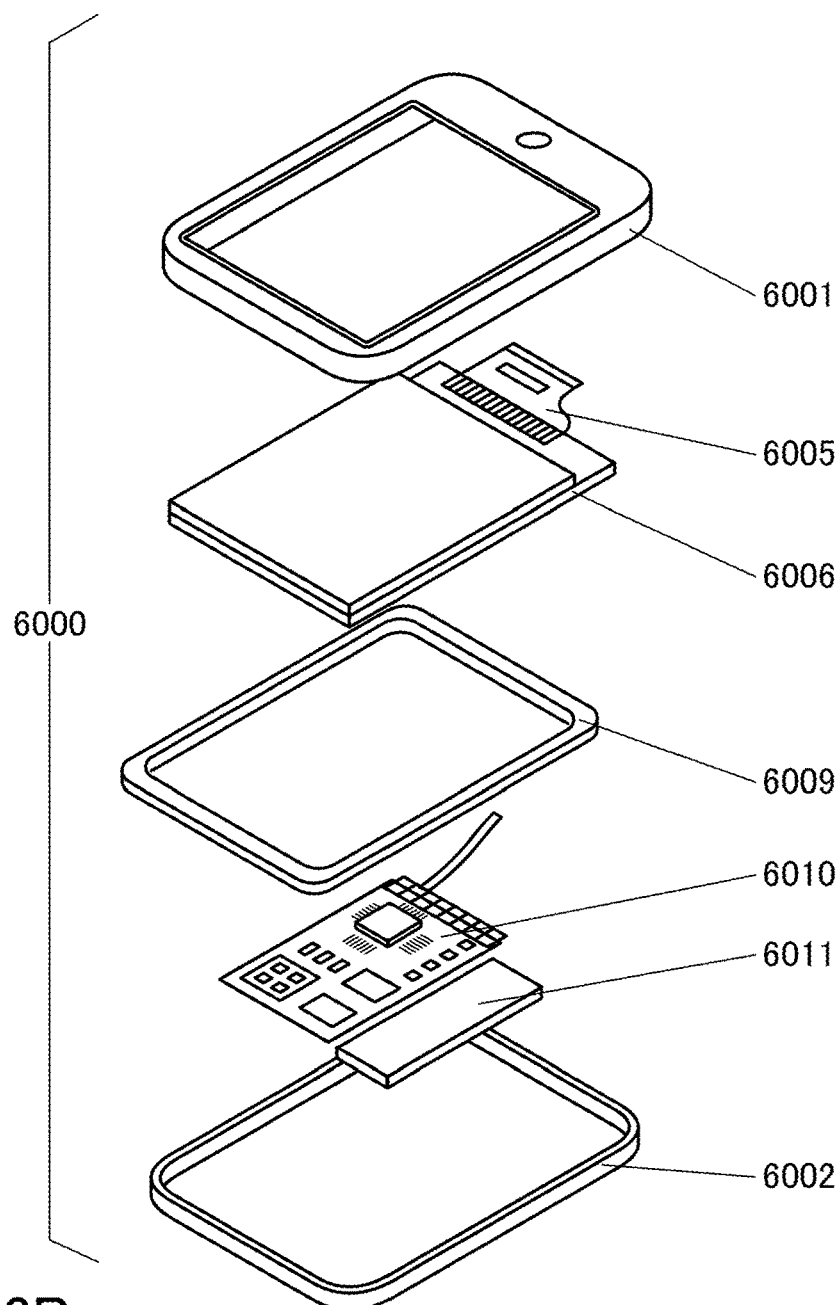
FIGS. 16A and 16B A structure example of a display module.

In a display module 6000 illustrated in FIG. 16(A), a display device 6006 to which an FPC 6005 is connected, a frame 6009, a printed circuit board 6010, and a battery 6011 are provided between an upper cover 6001 and a lower cover 6002.

A display device fabricated using one embodiment of the present invention can be used as the display device 6006, for example. With the display device 6006, a display module with extremely low power consumption can be achieved.

The shape and size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like.

Figure 16B:
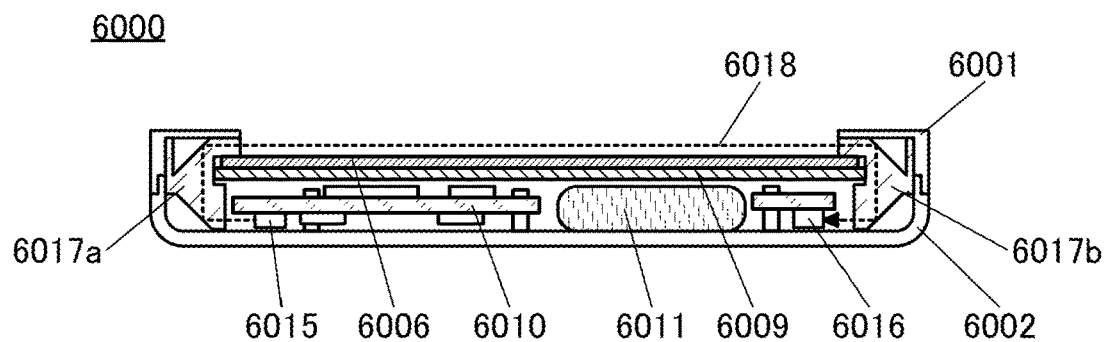

FIG. 16(B) is a schematic cross-sectional view of the display module 6000 having an optical touch sensor.

The display module 6000 includes a light-emitting portion 6015 and a light-receiving portion 6016 that are provided on the printed circuit board 6010. Furthermore, a pair of light guide portions (a light guide portion 6017a and a light guide portion 6017b) are provided in regions surrounded by the upper cover 6001 and the lower cover 6002.

The display device 6006 overlaps with the printed circuit board 6010 and the battery 6011 with the frame 6009 therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be suitably used.

With the use of the light guide portion 6017a and the light guide portion 6017b which transmit the light 6018, the light-emitting portion 6015 and the light-receiving portion 6016 can be placed under the display device 6006, and a malfunction of the touch sensor due to external light reaching the light-receiving portion 6016 can be suppressed. Particularly when a resin that absorbs visible light and transmits infrared rays is used, a malfunction of the touch sensor can be suppressed more effectively.

At least part of this embodiment can be implemented in combination with any of the other embodiments described in this specification as appropriate.

Embodiment 6

In this embodiment, examples of an electronic device for which the display device of one embodiment of the present invention can be used will be described.

Figure 17A:
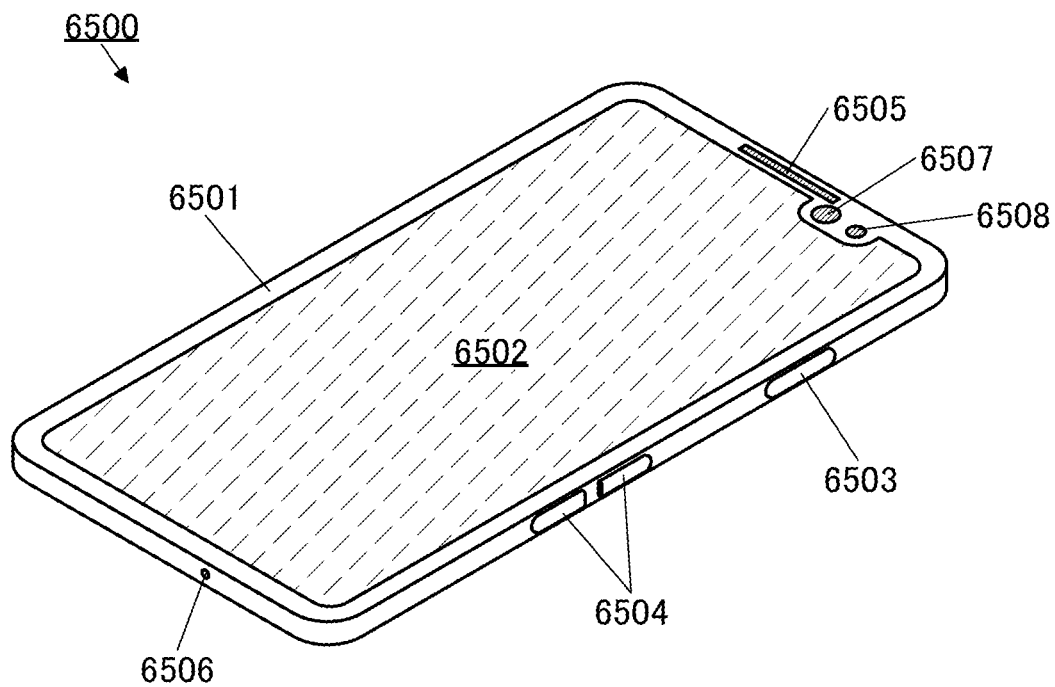
FIGS. 17A and 17B A structure example of an electronic device.

An electronic device 6500 illustrated in FIG. 17(A) is a portable information terminal that can be used as a smartphone.

The electronic device 6500 includes, in a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 17B:
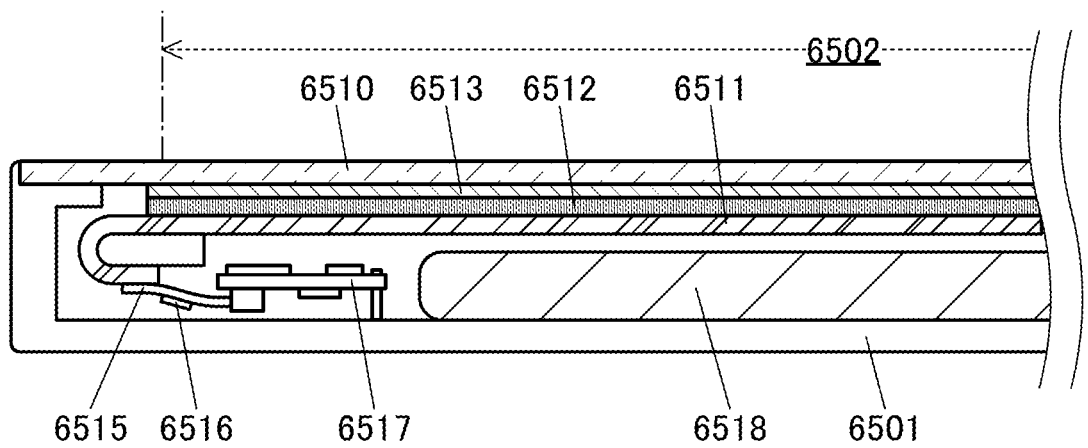

FIG. 17(B) is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with a bonding layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided for the printed circuit board 6517.

A flexible display panel of one embodiment of the present invention can be used as the display panel 6511. Thus, an extremely lightweight electronic device can be achieved. Furthermore, since the display panel 6511 is extremely thin, the battery 6518 with a high capacity can be provided without an increase in the thickness of the electronic device. Moreover, part of the display panel 6511 is bent to provide a connection portion with the FPC 6515 on the back side of the pixel portion, whereby an electronic device with a narrow bezel can be obtained.

At least part of this embodiment can be implemented in combination with any of the other embodiments described in this specification as appropriate.

Embodiment 7

In this embodiment, electronic devices each including a display device manufactured using one embodiment of the present invention will be described.

Electronic devices illustrated below each include a display device of one embodiment of the present invention in a display portion. Thus, the electronic devices achieve high resolution. In addition, the electronic devices can each achieve both high resolution and a large screen.

A display portion in an electronic device of one embodiment of the present invention can display an image with a resolution of, for example, full high definition, 4K2K, 8K4K, 16K8K, or higher.

Examples of the electronic devices include a digital camera, a digital video camera, a digital photo frame, a cellular phone, a portable game machine, a portable information terminal, and an audio reproducing device, in addition to electronic devices with comparatively large screens, such as a television device, a notebook personal computer, a monitor device, digital signage, a pachinko machine, and a game machine.

An electronic device to which one embodiment of the present invention is applied can be incorporated along a flat surface or a curved surface of an inside wall or an outside wall of a house or a building, an interior or an exterior of a car, or the like.

Figure 18A:
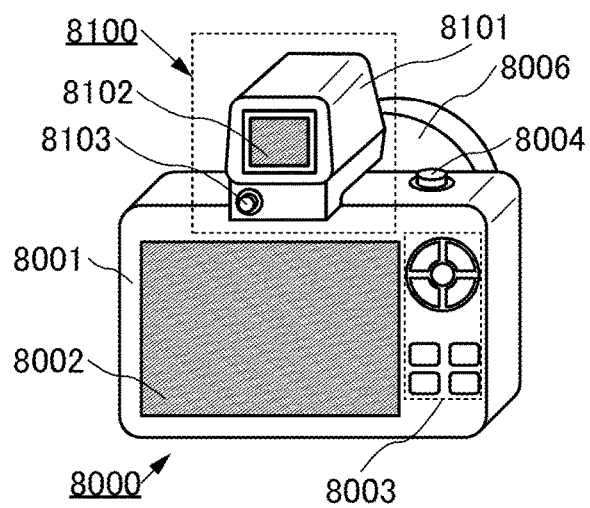
FIGS. 18A to 18E Structure examples of electronic devices.

FIG. 18(A) is a diagram illustrating appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000.

Note that the lens 8006 and the housing may be integrated with each other in the camera 8000.

The camera 8000 can take images by the press of the shutter button 8004 or touch on the display portion 8002 functioning as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with a mount engaging with a mount of the camera 8000. In the finder 8100, an image or the like received from the camera 8000 can be displayed on the display portion 8102.

The button 8103 has a function of a power button or the like.

The display device of one embodiment of the present invention can be applied to the display portion 8002 of the camera 8000 and the display portion 8102 of the finder 8100. Note that a finder may be incorporated in the camera 8000.

Figure 18B:
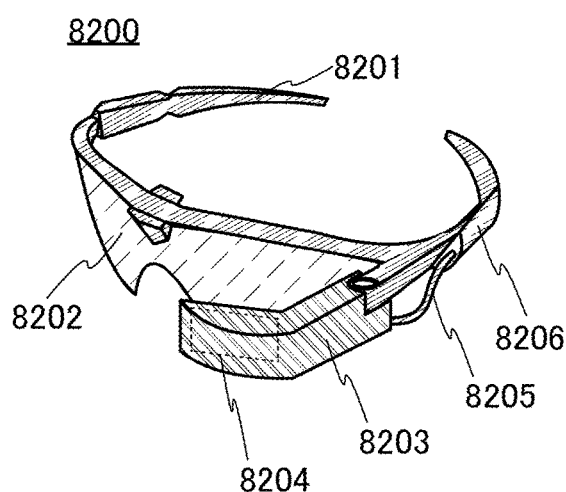

FIG. 18(B) is a diagram illustrating appearance of a head-mounted display 8200.

The head-mounted display 8200 includes a mounting portion 8201, a lens 8202, a main body 8203, a display portion 8204, a cable 8205, and the like. In addition, a battery 8206 is incorporated in the mounting portion 8201.

The cable 8205 supplies power from the battery 8206 to the main body 8203. The main body 8203 includes a wireless receiver or the like and can display received image data on the display portion 8204. In addition, the main body 8203 is provided with a camera, and data on the movement of the user's eyeball and eyelid can be used as an input means.

In addition, the mounting portion 8201 may be provided with a plurality of electrodes capable of sensing current flowing in response to the movement of the user's eyeball in a position in contact with the user to have a function of recognizing the user's sight line. Furthermore, the mounting portion 8201 may have a function of monitoring the user's pulse with the use of current flowing through the electrodes. Moreover, the mounting portion 8201 may include a variety of sensors such as a temperature sensor, a pressure sensor, and an acceleration sensor to have a function of displaying the user's biological data on the display portion 8204 or a function of changing an image displayed on the display portion 8204 in accordance with the movement of the user's head.

The display device of one embodiment of the present invention can be applied to the display portion 8204.

Figure 18C:
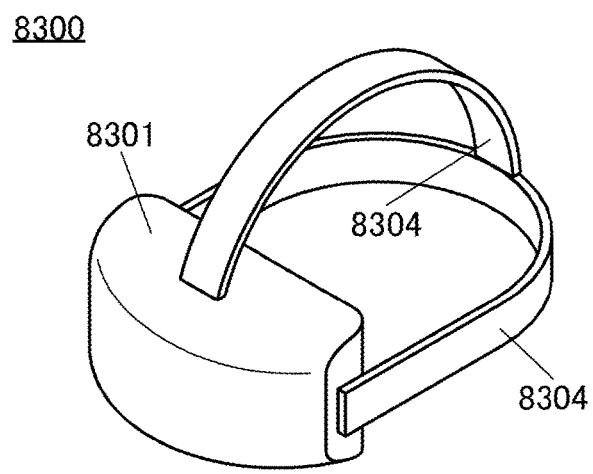
Figure 18D:
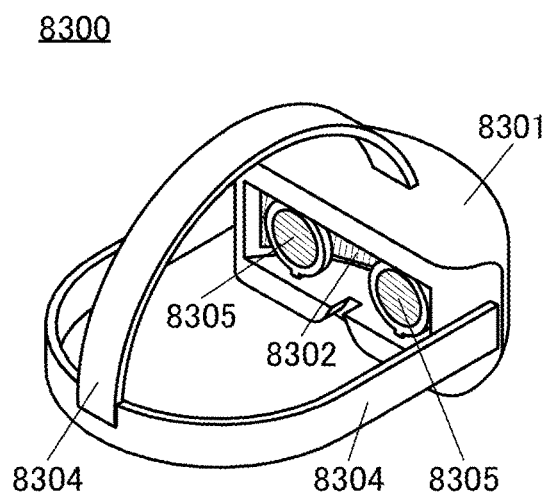
Figure 18E:
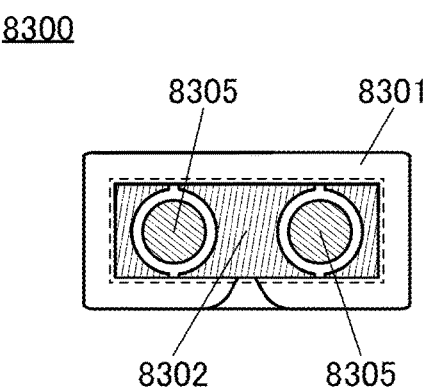

FIGS. 18(C), 18(D), and 18(E) are diagrams illustrating appearance of a head-mounted display 8300. The head-mounted display 8300 includes a housing 8301, a display portion 8302, band-shaped fixing units 8304, and a pair of lenses 8305.

A user can see display on the display portion 8302 through the lenses 8305. Note that the display portion 8302 is preferably curved and placed because the user can feel a high realistic sensation. In addition, when another image displayed in a different region of the display portion 8302 is viewed through the lenses 8305, 3D display using parallax or the like can also be performed. Note that the structure is not limited to that in which one display portion 8302 is provided, and two display portions 8302 may be provided so that one display portion is provided for one eye of the user.

Note that the display device of one embodiment of the present invention can be applied to the display portion 8302. A display device including a semiconductor device of one embodiment of the present invention has extremely high resolution; thus, even when an image is magnified using the lenses 8305 as illustrated in FIG. 18(E), the user does not perceive pixels, and a more realistic image can be displayed.

Electronic devices illustrated in FIG. 19(A) to FIG. 19(G) include a housing 9000, a display portion 9001, a speaker 9003, an operation key 9005 (including a power switch or an operation switch), a connection terminal 9006, a sensor 9007 (a sensor having a function of measuring force, displacement, a position, speed, acceleration, angular velocity, rotational frequency, distance, light, liquid, magnetism, temperature, a chemical substance, sound, time, hardness, an electric field, current, voltage, power, radiation, flow rate, humidity, a gradient, oscillation, an odor, or infrared rays), a microphone 9008, and the like.

The electronic devices illustrated in FIG. 19(A) to FIG. 19(G) have a variety of functions. For example, the electronic devices can have a function of displaying a variety of data (a still image, a moving image, a text image, and the like) on the display portion, a touch panel function, a function of displaying a calendar, date, time, and the like, a function of controlling processing with a variety of software (programs), a wireless communication function, a function of reading out and processing a program or data stored in a recording medium, and the like. Note that the functions of the electronic devices are not limited thereto, and the electronic devices can have a variety of functions. The electronic devices may include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 19(A) to FIG. 19(G) are described below.

Figure 19A:
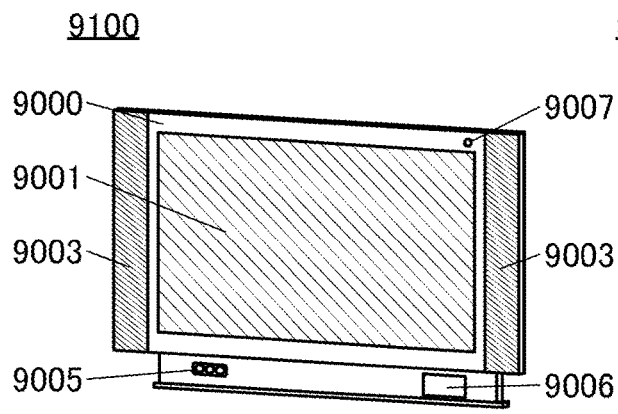
FIGS. 19A to 19G Structure examples of electronic devices.

FIG. 19(A) is a perspective view illustrating a television device 9100. The display portion 9001 having a large screen size of, for example, larger than or equal to 50 inches or larger than or equal to 100 inches can be incorporated in the television device 9100.

Figure 19D:
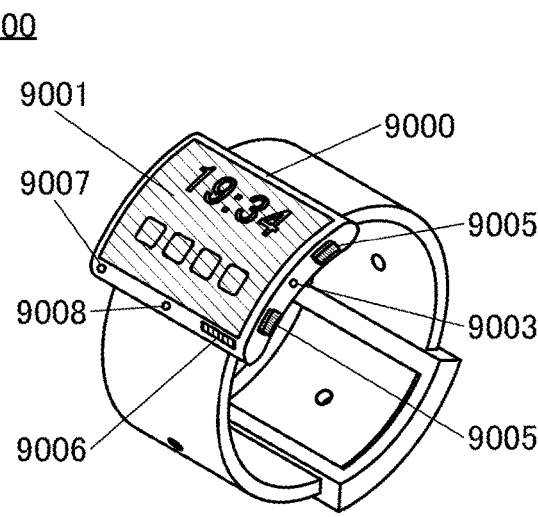
Figure 19B:
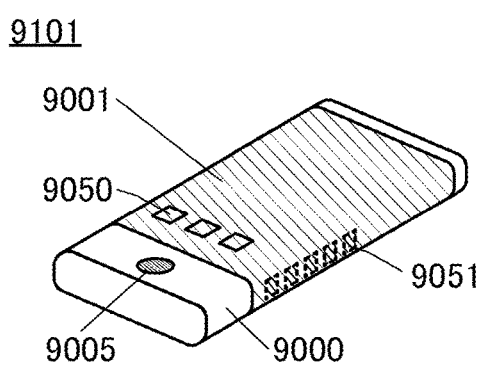

FIG. 19(B) is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. In addition, the portable information terminal 9101 can display characters and image information on its plurality of surfaces. FIG. 19(B) illustrates an example in which three icons 9050 are displayed. Furthermore, information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in a position where the information 9051 is displayed.

Figure 19E:
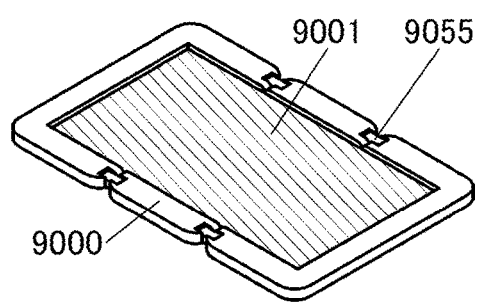
Figure 19C:
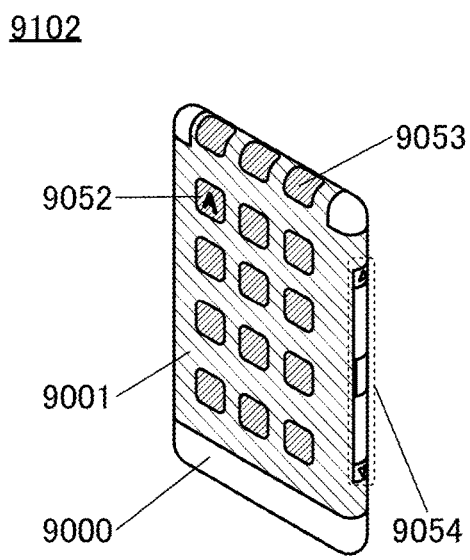

FIG. 19(C) is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, the user can also check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer a call, for example.

FIG. 19(D) is a perspective view illustrating a watch-type portable information terminal 9200. For example, the portable information terminal 9200 can be used as a smart watch. In addition, a display surface of the display portion 9001 is curved and provided, and display can be performed along the curved display surface. Furthermore, intercommunication between the portable information terminal 9200 and, for example, a headset capable of wireless communication enables hands-free calling. Moreover, with the connection terminal 9006, the portable information terminal 9200 can also perform mutual data transmission with another information terminal and charging. Note that charging operation may be performed by wireless power feeding.

Figure 19F:
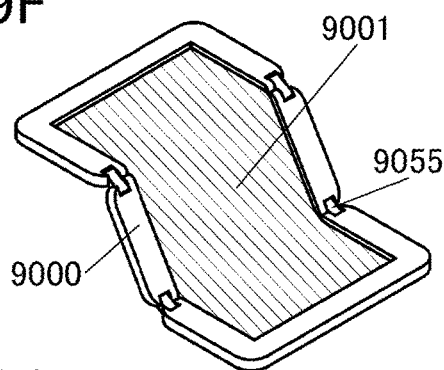
Figure 19G:
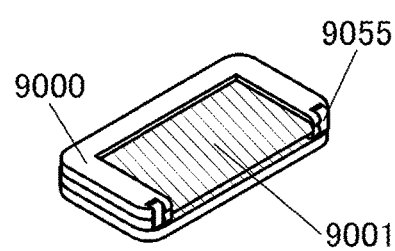

FIGS. 19(E), 19(F), and 19(G) are perspective views illustrating a foldable portable information terminal 9201. In addition, FIG. 19(E) is a perspective view of an unfolded state of the portable information terminal 9201, FIG. 19(G) is a perspective view of a folded state thereof, and FIG. 19(F) is a perspective view of a state in the middle of change from one of FIG. 19(E) and FIG. 19(G) to the other. The portable information terminal 9201 is highly portable in the folded state and is highly browsable in the unfolded state because of a seamless large display region. The display portion 9001 of the portable information terminal 9201 is supported by three housings 9000 joined with hinges 9055. For example, the display portion 9001 can be bent with a radius of curvature greater than or equal to 1 mm and less than or equal to 150 mm.

Figure 20A:
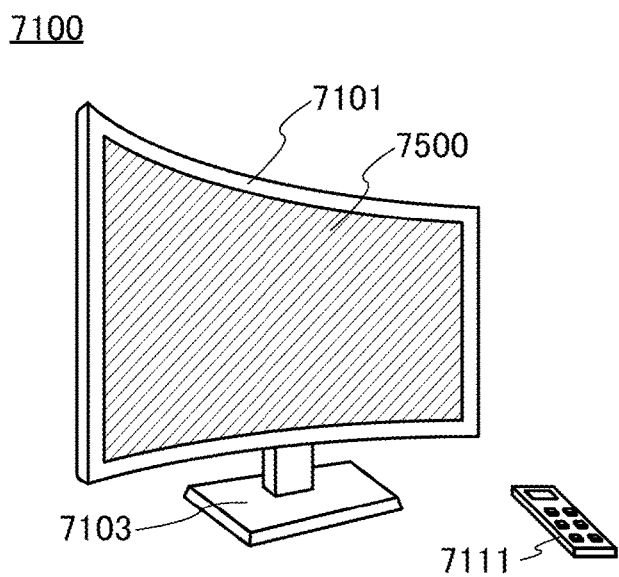
FIGS. 20A to 20D Structure examples of electronic devices.

FIG. 20(A) illustrates an example of a television device. In a television device 7100, a display portion 7500 is incorporated in a housing 7101. Here, a structure in which the housing 7101 is supported by a stand 7103 is illustrated.

Operation of the television device 7100 illustrated in FIG. 20(A) can be performed with an operation switch provided in the housing 7101 or a separate remote control 7111. Alternatively, a touch panel may be applied to the display portion 7500, and the television device 7100 may be operated by touch on the touch panel. The remote control 7111 may include a display portion in addition to operation buttons.

Note that the television device 7100 may include a television receiver and a communication device for network connection.

Figure 20B:
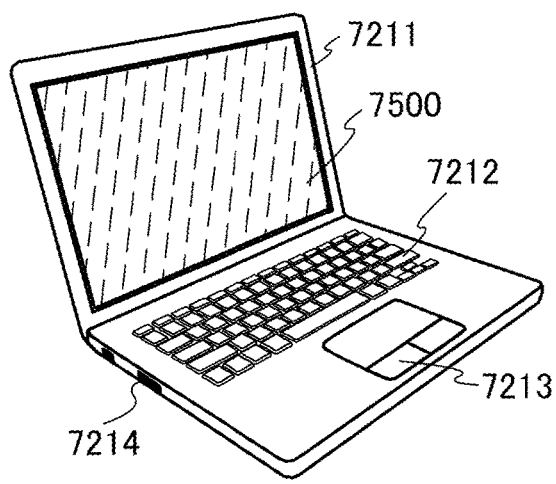

FIG. 20(B) illustrates a notebook personal computer 7200. The notebook personal computer 7200 includes a housing 7211, a keyboard 7212, a pointing device 7213, an external connection port 7214, and the like. The display portion 7500 is incorporated in the housing 7211.

Figure 20C:
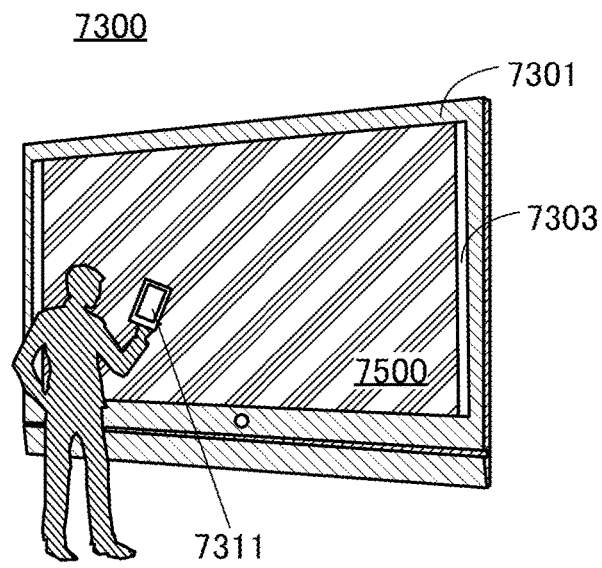
Figure 20D:
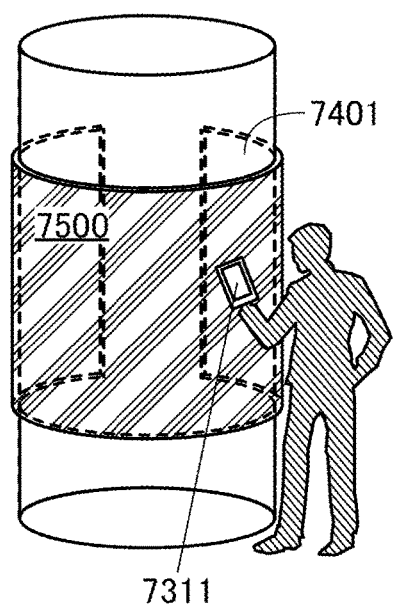

FIGS. 20(C) and 20(D) illustrate examples of digital signage.

Digital signage 7300 illustrated in FIG. 20(C) includes a housing 7301, the display portion 7500, a speaker 7303, and the like. Furthermore, the digital signage can include an LED lamp, operation keys (including a power switch or an operation switch), a connection terminal, a variety of sensors, a microphone, and the like.

In addition, FIG. 20(D) is digital signage 7400 attached to a cylindrical pillar 7401. The digital signage 7400 includes the display portion 7500 provided along a curved surface of the pillar 7401.

The larger display portion 7500 can increase the amount of information that can be provided at a time and attracts more attention, so that the effect of advertising can be increased, for example.

A touch panel is preferably applied to the display portion 7500 so that the user can operate the digital signage. Thus, the digital signage can be used not only for advertising but also for providing information that the user needs, such as route information, traffic information, and guidance information on a commercial facility.

In addition, as illustrated in FIGS. 20(C) and 20(D), it is preferable that the digital signage 7300 or the digital signage 7400 can work with an information terminal 7311 such as a user's smartphone through wireless communication. For example, information of an advertisement displayed on the display portion 7500 can be displayed on a screen of the information terminal 7311, or display on the display portion 7500 can be switched by operation of the information terminal 7311.

Furthermore, it is possible to make the digital signage 7300 or the digital signage 7400 execute a game with the use of the information terminal 7311 as an operation means (controller). Thus, an unspecified number of users can join in and enjoy the game concurrently.

The display device of one embodiment of the present invention can be applied to the display portion 7500 in FIGS. 20(A) to 20(D).

The electronic devices in this embodiment each have a structure including a display portion; however, one embodiment of the present invention can also be applied to an electronic device that does not include a display portion.

At least part of this embodiment can be implemented in combination with the other embodiments described in this specification as appropriate.

Example 1

In this example, a sample (Sample A1) in which an impurity element was added to a metal oxide film and a sample (Sample A2) in which hydrogen was supplied to a metal oxide film were fabricated and sheet resistance of the samples was measured.

[Fabrication of Sample]

<Sample A1>

Sample A1 is a sample including an island-shaped metal oxide film over a first silicon oxynitride film formed over a glass substrate, in which boron was added to the metal oxide film by an ion doping method through a second silicon oxynitride film. The second silicon oxynitride film was removed after the addition of boron, the metal oxide film was covered by a third silicon oxynitride film, an opening reaching the metal oxide film was then formed, and a terminal was provided.

An In—Ga—Zn oxide with a thickness of approximately 40 nm was used as the metal oxide film in Sample A1. The boron adding conditions were set such that the concentration became the highest in the vicinity of an interface between the metal oxide film and the second silicon oxynitride film.

<Sample A2>

Sample A2 is a sample including an island-shaped metal oxide film over a first silicon oxynitride film formed over a glass substrate, in which heat treatment was performed after a silicon nitride film containing hydrogen and a fourth silicon oxynitride film were formed in contact with the metal oxide film. After the fourth silicon oxynitride film was formed, an opening reaching the metal oxide film was formed and a terminal was provided.

The metal oxide film in Sample A2 was formed under the same conditions as those in Sample A1. The silicon nitride film was formed by a plasma CVD method using a mixed gas of an $SiH_4$ gas, an $N_2$ gas, and an $NH_3$ gas as a deposition gas. The heat treatment was performed in a nitrogen atmosphere at 350° C. for one hour.

[Sheet Resistance]

Figure 21:
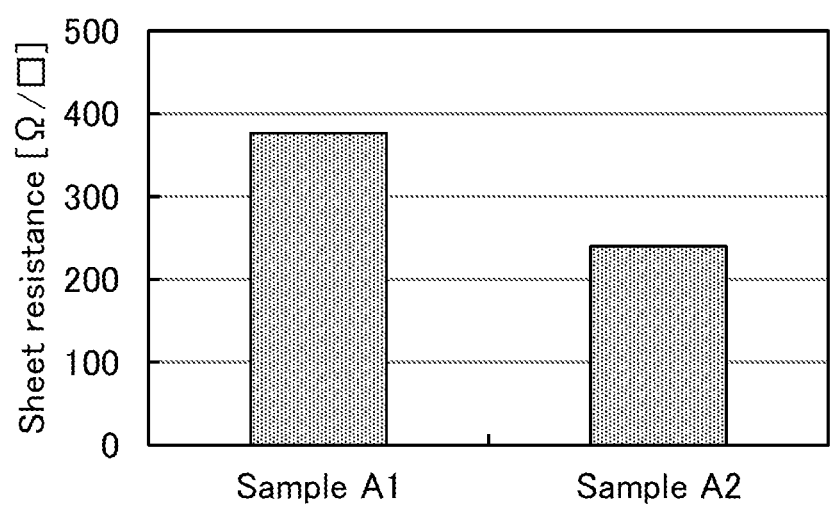
FIG. 21 Sheet resistance of metal oxide films.

FIG. 21 shows measurement results of the sheet resistance of fabricated Sample A1 and Sample A2.

The sheet resistance values of Sample A1 and Sample A2 are approximately 380 Ω/square and approximately 240 Ω/square, respectively, as shown in FIG. 21, which indicates that both of the resistances are reduced. Note that the sheet resistance value of a metal oxide film whose carrier concentration is sufficiently reduced without treatment for reducing resistance is higher than or equal to the upper detection limit of the measurement unit (e.g., higher than or equal to 5M Ω/square).

Sample A2 to which hydrogen was supplied has lower resistance than Sample A1 to which the impurity element was added. This suggests that addition of an impurity element and supply of hydrogen to a metal oxide film enable a higher carrier density and lower resistance than Sample A1 and Sample A2.

The above results indicate that, in the transistor of one embodiment of the present invention, LDD regions having relatively high resistance can be obtained when a metal oxide to which an impurity element is added is used for the second regions between which the channel formation region (first region) is sandwiched, and extremely low-resistance source and drain regions can be obtained when hydrogen is supplied to the third regions, which are outside the second regions, after the impurity element is added.

Example 2

In this example, a sample (Sample B1) in which an aluminum nitride film was formed in contact with a metal oxide film so as to reduce resistance was fabricated and sheet resistance of the sample was measured.

[Fabrication of Sample]

<Sample B1>

Sample B1 is a sample including an island-shaped metal oxide film over a first silicon oxynitride film formed over a glass substrate, in which first heat treatment was performed after an aluminum nitride film was formed in contact with the metal oxide film. Furthermore, an aluminum oxide film and a second silicon oxynitride film were formed after the first heat treatment, second heat treatment was performed, an opening reaching the metal oxide film was then formed, and a terminal was provided.

The metal oxide film in Sample B1 was formed under the same conditions as those in Sample A1, which were described in Example 1 as an example. The aluminum oxide film was formed by a reactive sputtering method using an aluminum target and using a mixed gas of an $N_2$ gas and an Ar gas as a deposition gas. The first heat treatment and the second heat treatment were each performed in a nitrogen atmosphere at 350° C. for one hour.

[Sheet Resistance]

Figure 22:
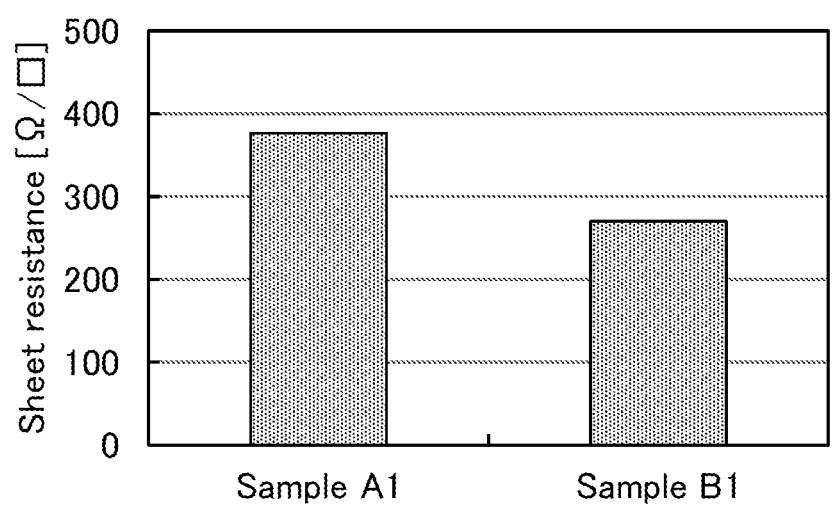
FIG. 22 Sheet resistance of metal oxide films.

FIG. 22 shows measurement results of the sheet resistance of Sample A1 described in Example 1 as an example and fabricated Sample B1.

The sheet resistance values of Sample A1 and Sample B1 are approximately 380 Ω/square and approximately 270 Ω/square, respectively, as shown in FIG. 22, which indicates that both of the resistances are reduced. Note that the sheet resistance value of a metal oxide film whose carrier concentration is sufficiently reduced without treatment for reducing resistance is higher than or equal to the upper detection limit of the measurement unit (e.g., higher than or equal to 5M Ω/square).

Sample B1 in which the aluminum nitride film was formed in contact with the metal oxide film has lower resistance than Sample A1 to which the impurity element was added. This suggests that addition of an impurity element to a metal oxide film and formation of a film which is likely to absorb oxygen, such as an aluminum nitride film, in contact with the metal oxide film enable a higher carrier density and lower resistance than Sample A1 and Sample B1.

The above results indicate that, in the transistor of one embodiment of the present invention, LDD regions having relatively high resistance can be obtained when a metal oxide to which an impurity element is added is used for the second regions between which the channel formation region (first region) is sandwiched, and extremely low-resistance source region and drain region can be obtained when a film which is likely to absorb oxygen is formed over the third regions, which are outside the second regions.

REFERENCE NUMERALS 100, 100A: transistor, 102: substrate, 103: insulating layer, 103d: region, 106: conductive layer, 108, 108a, 108b: semiconductor layer, 108L, 108N: region, 110: insulating layer, 110d: region, 110f insulating film, 112: conductive layer, 112f conductive film, 114: metal oxide layer, 114E metal oxide film, 115: resist mask, 116, 118: insulating layer, 120a, 120b: conductive layer, 140: impurity element, 141a, 141b, 142: opening

The invention claimed is:

1. A semiconductor device comprising a transistor, comprising:
    a first metal oxide layer comprising a channel formation region over a first insulating layer;
    a second insulating layer over the first metal oxide layer;
    a second metal oxide layer over the second insulating layer;
    a conductive layer overlapping with the first metal oxide layer with the second insulating layer and the second metal oxide layer therebetween; and
    a third insulating layer over the conductive layer, wherein the conductive layer serves as a gate electrode of the transistor, wherein, in a cross section in a channel length direction of the transistor, end portions of the second insulating layer are over and in contact with the first metal oxide layer, wherein in the cross section in the channel length direction of the transistor, the first metal oxide layer comprises a first region that is overlapped with the conductive layer and the second insulating layer, a second region that is overlapped with the second insulating layer and not overlapped with the conductive layer, and a third region that is overlapped with the third insulating layer and not overlapped with the second insulating layer, wherein the second region and the third region comprises a first element selected from hydrogen, boron, carbon, nitrogen, fluorine, phosphorus, sulfur, arsenic, aluminum, magnesium, and a rare gas, and wherein a concentration of the first element in the third region is higher than a concentration of the first element in the second region.

2. The semiconductor device according to claim 1, wherein each of the first metal oxide layer and the second metal oxide layer comprises indium, gallium, and zinc.

3. The semiconductor device according to claim 1, wherein in the cross section in a channel length direction of the transistor, an end portion of the conductive layer is substantially aligned with an end portion of the second metal oxide layer.

4. The semiconductor device according to claim 1, wherein the third insulating layer comprises silicon and nitrogen.

5. A semiconductor device comprising a transistor, comprising:
  a first metal oxide layer comprising a channel formation region over a first insulating layer;
  a second insulating layer over the first metal oxide layer;
  a second metal oxide layer over the second insulating layer;
  a conductive layer overlapping with the first metal oxide layer with the second insulating layer and the second metal oxide layer therebetween; and
  a third insulating layer over the conductive layer,
  wherein the conductive layer serves as a gate electrode of the transistor,
  wherein, in a cross section in a channel length direction of the transistor, end portions of the second insulating layer are over and in contact with the first metal oxide layer,
  wherein in the cross section in the channel length direction of the transistor, the first metal oxide layer comprises a first region that is overlapped with the conductive layer and the second insulating layer, a second region that is overlapped with the second insulating layer and not overlapped with the conductive layer, and a third region that is overlapped with the third insulating layer and not overlapped with the second insulating layer, and
  wherein the third region comprises a first element selected from boron, phosphorus, aluminum, and magnesium.

6. The semiconductor device according to claim 5, wherein each of the first metal oxide layer and the second metal oxide layer comprises indium, gallium, and zinc.

7. The semiconductor device according to claim 5, wherein in the cross section in a channel length direction of the transistor, an end portion of the conductive layer is substantially aligned with an end portion of the second metal oxide layer.

8. The semiconductor device according to claim 5, wherein the third insulating layer comprises silicon and nitrogen.

9. A semiconductor device comprising a transistor, comprising:
  a first conductive layer;
  a first insulating layer over the first conductive layer;
  a first metal oxide layer comprising a channel formation region over the first insulating layer;
  a second insulating layer over the first metal oxide layer;
  a second metal oxide layer over the second insulating layer;
  a second conductive layer overlapping with the first conductive layer with the first insulating layer, the first metal oxide layer, the second insulating layer, and the second metal oxide layer therebetween; and
  a third insulating layer over the second conductive layer,
  wherein the first conductive layer and the second conductive layer each serve as a gate electrode of the transistor and are electrically connected to each other,
  wherein, in a cross section in a channel length direction of the transistor, end portions of the second insulating layer are over and in contact with the first metal oxide layer,
  wherein in the cross section in the channel length direction of the transistor, the first metal oxide layer comprises a first region that is overlapped with the second conductive layer and the second insulating layer, a second region that is overlapped with the second insulating layer and not overlapped with the second conductive layer, and a third region that is overlapped with the third insulating layer and not overlapped with the second insulating layer, and
  wherein the third region comprises a first element selected from boron, phosphorus, aluminum, and magnesium.

10. The semiconductor device according to claim 9, wherein, in a top view of the transistor, the second conductive layer comprises a first portion overlapping with the first conductive layer and a second portion not overlapping with the first conductive layer.

11. The semiconductor device according to claim 9, wherein, in a top view of the transistor, an end portion of the second conductive layer in a channel width direction of the transistor extends beyond an end portion of the first conductive layer in the channel width direction of the transistor.

12. The semiconductor device according to claim 9, wherein each of the first metal oxide layer and the second metal oxide layer comprises indium, gallium, and zinc.

13. The semiconductor device according to claim 9, wherein in the cross section in a channel length direction of the transistor, an end portion of the second conductive layer is substantially aligned with an end portion of the second metal oxide layer.

14. The semiconductor device according to claim 9, wherein the third insulating layer comprises silicon and nitrogen.

* * * * *